US012707866B2

(12) United States Patent
Ohsawa et al.

(10) Patent No.: US 12,707,866 B2
(45) Date of Patent: Aug. 11, 2026

(54) DISPLAY DEVICE AND ELECTRONIC DEVICE

(71) Applicant: SEMICONDUCTOR ENERGY LABORATORY CO., LTD., Atsugi (JP)

(72) Inventors: Nobuharu Ohsawa, Zama (JP); Takumu Okuyama, Tokyo (JP); Satoshi Seo, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 421 days.

(21) Appl. No.: 18/569,497

(22) PCT Filed: Jun. 6, 2022

(86) PCT No.: PCT/IB2022/055232
§ 371 (c)(1),
(2) Date: Dec. 12, 2023

(87) PCT Pub. No.: WO2022/263968
PCT Pub. Date: Dec. 22, 2022

(65) Prior Publication Data

US 2024/0284766 A1 Aug. 22, 2024

(30) Foreign Application Priority Data

Jun. 17, 2021 (JP) ................................ 2021-100785

(51) Int. Cl.
*H10K 59/00* (2023.01)
*H10K 50/818* (2023.01)
(Continued)

(52) U.S. Cl.
CPC ......... *H10K 59/878* (2023.02); *H10K 50/818* (2023.02); *H10K 50/856* (2023.02);
(Continued)

(58) Field of Classification Search
CPC .... H10K 59/131; H10K 59/121; H10K 59/35; H10K 59/878; H10K 59/8051; H10K 59/8052; H10K 50/856
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 106571431 A 4/2017
JP 2000-036385 A 2/2000
(Continued)

OTHER PUBLICATIONS

International Search Report (Application No. PCT/IB2022/055232) dated Aug. 9, 2022.
(Continued)

*Primary Examiner* — Reema Patel
(74) *Attorney, Agent, or Firm* — Fish & Richardson P.C.

(57) ABSTRACT

A novel display device that is highly convenient, useful, or reliable is provided. The display device includes a first light-emitting device, a second light-emitting device, an insulating film, a conductive film, a first reflective film, and a second reflective film; the first light-emitting device includes a first electrode, a second electrode, and a first unit; and the first electrode is interposed between the first unit and the insulating film. The second light-emitting device includes a third electrode, a fourth electrode, and a second unit; the third electrode is interposed between the second unit and the insulating film; and a first gap is provided between the third electrode and the first electrode. The conductive film electrically connects the second electrode and the fourth electrode to each other, and the first gap is interposed between the conductive film and the insulating
(Continued)

film. The first reflective film is interposed between the first electrode and the insulating film, and there is a first distance DR between the first reflective film and the second electrode. The second reflective film is interposed between the third electrode and the insulating film, and there is a second distance DG between the second reflective film and the fourth electrode. The second distance DG is longer than the first distance DR and the difference is larger than 20 nm and smaller than 85 nm.

12 Claims, 37 Drawing Sheets

(51) Int. Cl.
*H10K 50/856* (2023.01)
*H10K 59/131* (2023.01)
*H10K 59/80* (2023.01)
*H10K 50/10* (2023.01)

(52) U.S. Cl.
CPC .......... *H10K 59/131* (2023.02); *H10K 50/10* (2023.02); *H10K 59/00* (2023.02)

(56) References Cited

U.S. PATENT DOCUMENTS

| | | | |
|---|---|---|---|
| 9,627,650 | B2 | 4/2017 | Seo et al. |
| 10,090,363 | B2 | 10/2018 | Seo et al. |
| 2002/0072139 | A1 | 6/2002 | Kashiwabara |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0118626 | A1 | 4/2016 | Seo et al. |
| 2016/0172595 | A1 | 6/2016 | Malinowski et al. |
| 2016/0315133 | A1 | 10/2016 | Sato |
| 2017/0104036 | A1 | 4/2017 | Maeda |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2020/0111846 | A1 | 4/2020 | Takahara et al. |
| 2020/0203662 | A1 | 6/2020 | Mollard et al. |
| 2022/0208872 | A1 | 6/2022 | Takahara et al. |

FOREIGN PATENT DOCUMENTS

| | | | |
|---|---|---|---|
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2014-038782 | A | 2/2014 |
| JP | 2014-120218 | A | 6/2014 |
| JP | 2014-135251 | A | 7/2014 |
| JP | 2014-232568 | A | 12/2014 |
| JP | 2015-062194 | A | 4/2015 |
| JP | 2015-115178 | A | 6/2015 |
| JP | 2016-085968 | A | 5/2016 |
| JP | 2016-197494 | A | 11/2016 |
| JP | 2017-072812 | A | 4/2017 |
| JP | 2019-071267 | A | 5/2019 |
| JP | 2019-179696 | A | 10/2019 |
| JP | 2020-160305 | A | 10/2020 |
| KR | 2017-0042469 | A | 4/2017 |
| TW | 201724495 | | 7/2017 |
| WO | WO-2018/181049 | | 10/2018 |

OTHER PUBLICATIONS

Written Opinion (Application No. PCT/IB2022/055232) dated Aug. 9, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.

FIG. 20A
Intermediate state
New crystalline phase
| Amorphous | Crystalline | Crystal |
| --- | --- | --- |
| ･completely amorphous | ･CAAC<br>･nc<br>･CAC<br><br>excluding single crystal and poly crystal | ･single crystal<br>･poly crystal |
FIG. 20B
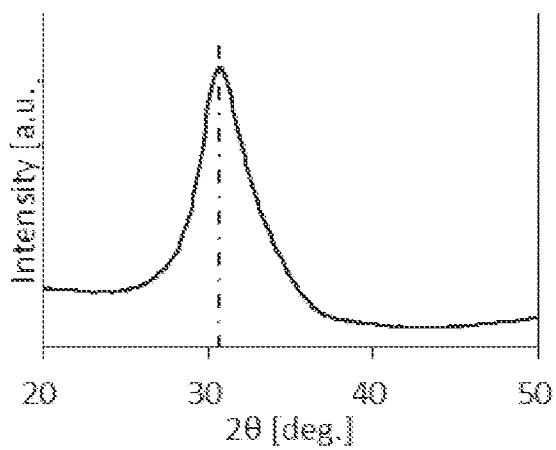
FIG. 20C
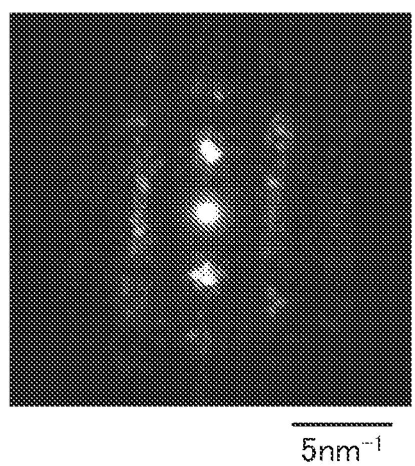

DISPLAY DEVICE AND ELECTRONIC DEVICE

CROSS REFERENCE TO RELATED APPLICATIONS

This application is a U.S. National Phase Application under 35 U.S.C. § 371 of International Application PCT/IB2022/055232, filed on Jun. 6, 2022, which is incorporated by reference and claims the benefit of a foreign priority application filed in Japan on Jun. 17, 2021, as Application No. 2021-100785.

TECHNICAL FIELD

One embodiment of the present invention relates to a display device, an electronic device, or a semiconductor device.

Note that one embodiment of the present invention is not limited to the above technical field. The technical field of one embodiment of the invention disclosed in this specification relates to an object, a method, or a manufacturing method. Alternatively, one embodiment of the present invention relates to a process, a machine, manufacture, or a composition of matter. Thus, more specifically, examples of the technical field of one embodiment of the present invention disclosed in this specification include a semiconductor device, a display device, a light-emitting apparatus, a power storage device, a memory device, a driving method thereof, and a manufacturing method thereof.

BACKGROUND ART

Light-emitting devices (organic EL devices) including organic compounds and utilizing electroluminescence (EL) have been put to more practical use. In the basic structure of such light-emitting devices, an organic compound layer containing a light-emitting material (an EL layer) is interposed between a pair of electrodes. Carriers (holes and electrons) are injected by application of a voltage to the element, and light emission can be obtained from the light-emitting material by using the recombination energy of the carriers.

Such light-emitting devices are of self-light-emitting type and thus have advantages over liquid crystal, such as high visibility and no need for backlight when used in pixels of a display, and are suitable as flat panel display elements. Displays including such light-emitting devices are also highly advantageous in that they can be thin and lightweight. Another feature is an extremely fast response speed.

Since light-emitting layers of such light-emitting devices can be successively formed two-dimensionally, planar light emission can be obtained. This feature is difficult to realize with point light sources typified by incandescent lamps and LEDs or linear light sources typified by fluorescent lamps; thus, the light-emitting devices also have great potential as planar light sources, which can be applied to lighting and the like.

Displays or lighting devices including light-emitting devices are suitable for a variety of electronic devices as described above, and research and development of light-emitting devices has progressed for more favorable characteristics.

Known is a structure of a light-emitting apparatus that emits light of a plurality of colors in which the light-emitting apparatus includes a first light-emitting element and a second light-emitting element; the first light-emitting element includes a first lower electrode, a first light-emitting layer over the first lower electrode, a second light-emitting layer over the first light-emitting layer, and an upper electrode over the second light-emitting layer; the second light-emitting element includes a second lower electrode, the first light-emitting layer over the second lower electrode, the second light-emitting layer over the first light-emitting layer, and the upper electrode over the second light-emitting layer; an emission spectrum peak of the first light-emitting layer is positioned on a longer wavelength side than that of the second light-emitting layer; and a distance between the first lower electrode and the first light-emitting layer is shorter than a distance between the second lower electrode and the first light-emitting layer (Patent Document 1).

Organic EL devices are sometimes used in display portions of display devices and HMDs for AR or VR. Non-Patent Document 1 discloses a method employing standard UV photolithography for manufacturing an organic optoelectronic device, which is one of organic EL devices.

REFERENCES

Patent Document

[Patent Document 1]
Japanese Published Patent Application No. 2016-85968

Non-Patent Document

[Non-Patent Document 1] B. Lamprecht et al., "Organic optoelectronic device fabrication using standard UV photolithography" phys. stat. sol. (RRL) 2, No. 1, pp. 16-18 (2008)

SUMMARY OF THE INVENTION

Problems to be Solved by the Invention

An object of one embodiment of the present invention is to provide a novel display device that is highly convenient, useful, or reliable. Another object is to provide a novel electronic device that is highly convenient, useful, or reliable. Another object is to provide a novel display device, a novel electronic device, or a novel semiconductor device.

Note that the description of these objects does not preclude the existence of other objects. Note that one embodiment of the present invention does not have to achieve all the objects. Other objects will be apparent from the description of the specification, the drawings, the claims, and the like, and other objects can be derived from the description of the specification, the drawings, the claims, and the like.

Means for Solving the Problems (1) One embodiment of the present invention is a display device including a first light-emitting device, a second light-emitting device, an insulating film, a conductive film, a first reflective film, and a second reflective film.

The first light-emitting device includes a first electrode, a second electrode, and a first unit. The first unit is interposed between the first electrode and the second electrode, and the first electrode is interposed between the first unit and the insulating film.

The second light-emitting device includes a third electrode, a fourth electrode, and a second unit. The second unit is interposed between the third electrode and the fourth electrode, and the third electrode is interposed between the second unit and the insulating film. A first gap is provided between the third electrode and the first electrode.

The conductive film electrically connects the second electrode and the fourth electrode to each other, and the first gap is interposed between the conductive film and the insulating film.

The first reflective film is interposed between the first electrode and the insulating film, and there is a first distance DR between the first reflective film and the second electrode.

The second reflective film is interposed between the third electrode and the insulating film, and there is a second distance DG between the second reflective film and the fourth electrode.

The second distance DG has a relation with the first distance DR satisfying Formula (1) to Formula (3) below.

[Formulae 1]

$$DR > DG \tag{1}$$

$$DR - DG > 20\text{ nm} \tag{2}$$

$$DR - DG < 85\text{ nm} \tag{3}$$

(2) One embodiment of the present invention is the display device in which the above second unit has a function of emitting first light and an emission spectrum of the first light has a maximum peak in a range greater than or equal to 480 nm and less than or equal to 600 nm.

Thus, a step generated between the first light-emitting device and the second light-emitting device can be reduced. A step generated in the conductive film can be reduced. Furthermore, a phenomenon in which a cut or a split is generated along the step in the conductive film can be inhibited. Green light can be used for display. As a result, a novel display device that is highly convenient, useful, or reliable can be provided.

(3) One embodiment of the present invention is the above display device including a filler.

The filler is interposed between the first electrode and the third electrode, and the filler is interposed between the insulating film and the conductive film. Furthermore, the filler is interposed between the first unit and the second unit.

Thus, the second light-emitting device can be separated from the first light-emitting device. A gap formed between the first light-emitting device and the second light-emitting device can be filled using the filler. A step due to the gap formed between the first light-emitting device and the second light-emitting device can be reduced. The step generated in the conductive film can be reduced. Furthermore, a phenomenon in which a cut or a split is generated along the step in the conductive film can be inhibited. As a result, a novel display device that is highly convenient, useful, or reliable can be provided.

(4) One embodiment of the present invention is the above display device including a third light-emitting device and a third reflective film.

The third light-emitting device includes a fifth electrode, a sixth electrode, and a third unit. The third unit is interposed between the fifth electrode and the sixth electrode, and the fifth electrode is interposed between the third unit and the insulating film. A second gap is provided between the fifth electrode and the third electrode.

The conductive film electrically connects the fourth electrode and the sixth electrode to each other, and the second gap is interposed between the conductive film and the insulating film.

The third reflective film is interposed between the fifth electrode and the insulating film, and there is a third distance DB between the third reflective film and the sixth electrode.

The third distance DB has a relation with the first distance DR and the second distance DG satisfying Formula (1) to Formula (3) below.

[Formulae 2]

$$DB > DR > DG \tag{1}$$

$$DB - DR < 60\text{ nm} \tag{2}$$

$$DR - DG < 35\text{ nm} \tag{3}$$

(5) One embodiment of the present invention is the above display device in which the third distance DB is shorter than or equal to 200 nm.

Thus, the step generated between the first light-emitting device and the second light-emitting device can be reduced. A step generated between the second light-emitting device and the third light-emitting device can be reduced. A step generated between the first light-emitting device and the third light-emitting device can be reduced. The step generated in the conductive film can be reduced. Furthermore, a phenomenon in which a cut or a split is generated along the step in the conductive film can be inhibited. As a result, a novel optical functional device that is highly convenient, useful, or reliable can be provided.

(6) One embodiment of the present invention is the above display device including a third light-emitting device and a third reflective film.

The third light-emitting device includes a fifth electrode, a sixth electrode, and a third unit. The third unit is interposed between the fifth electrode and the sixth electrode, and the fifth electrode is interposed between the third unit and the insulating film. A second gap is provided between the fifth electrode and the third electrode.

The conductive film electrically connects the fourth electrode and the sixth electrode to each other, and the second gap is interposed between the conductive film and the insulating film.

The third reflective film is interposed between the fifth electrode and the insulating film, and there is a third distance DB between the third reflective film and the sixth electrode.

The third distance DB has a relation with the first distance DR and the second distance DG satisfying Formula (1) to Formula (3) below.

[Formulae 3]

$$DR > DG > DB \tag{1}$$

$$DR - DG < 35\text{ nm} \tag{2}$$

$$DG - DB < 35\text{ nm} \tag{3}$$

(7) One embodiment of the present invention is the above display device in which the first distance DR is shorter than or equal to 150 nm.

Thus, the step generated between the first light-emitting device and the second light-emitting device can be reduced.

The step generated between the second light-emitting device and the third light-emitting device can be reduced. The step generated between the first light-emitting device and the third light-emitting device can be reduced. The step generated in the conductive film can be reduced. Furthermore, a phenomenon in which a cut or a split is generated along the step in the conductive film can be inhibited. As a result, a novel optical functional device that is highly convenient, useful, or reliable can be provided.

(8) One embodiment of the present invention is the above display device in which the first unit has a function of emitting second light; the second light has a wavelength greater than or equal to 600 nm and less than or equal to 740 nm; the third unit has a function of emitting third light; and the third light has a wavelength greater than or equal to 400 nm and less than or equal to 480 nm.

Thus, the step generated between the first light-emitting device and the third light-emitting device can be reduced. The step generated in the conductive film can be reduced. Furthermore, a phenomenon in which a cut or a split is generated along the step in the conductive film can be inhibited. Red light can be used for display. Blue light can be used for display. As a result, a novel display device that is highly convenient, useful, or reliable can be provided.

(9) One embodiment of the present invention is the above display device in which the first light-emitting device includes a first layer and the second light-emitting device includes a second layer.

The first layer is interposed between the first unit and the first electrode, and the first layer contains a substance having an electron-accepting property and a material having a hole-transport property. Furthermore, the first layer has an electrical resistivity higher than or equal to $1\times10^2$ [Ω·cm] and lower than or equal to $1\times10^8$ [Ω·cm].

The second layer is interposed between the second unit and the third electrode, and a third gap is provided between the second layer and the first layer. Furthermore, the second layer contains the substance having an electron-accepting property and the material having a hole-transport property.

Accordingly, current flowing between the first layer and the second layer can be reduced. Furthermore, a crosstalk phenomenon between the first light-emitting device and the second light-emitting device can be inhibited. As a result, a novel display device that is highly convenient, useful, or reliable can be provided.

(10) One embodiment of the present invention is the above display device including a display region, a first functional layer, and a second functional layer.

The display region includes a pixel set, and the pixel set includes a first pixel and a second pixel.

The first pixel includes the first light-emitting device and a first pixel circuit, and the first light-emitting device is electrically connected to the first pixel circuit. Furthermore, the first pixel circuit is supplied with a first image signal.

The second pixel includes the second light-emitting device and a second pixel circuit, and the second light-emitting device is electrically connected to the second pixel circuit. Furthermore, the second pixel circuit is supplied with a second image signal.

The first functional layer includes the first pixel circuit and the second pixel circuit. The first functional layer is interposed between the first light-emitting device and the second functional layer, and the first functional layer is interposed between the second light-emitting device and the second functional layer.

The second functional layer includes a driver circuit, and the driver circuit generates the first image signal and the second image signal.

Thus, the driver circuit can be positioned so as to overlap with the first pixel circuit and the second pixel circuit. An outer area can be smaller than a region displaying image information. Furthermore, a distance between the first pixel circuit and the driver circuit can be shortened. In addition, an image signal can be transmitted without delay. As a result, a novel display device that is highly convenient, useful, or reliable can be provided.

(11) One embodiment of the present invention is an electronic device including an arithmetic portion and the above display device. The arithmetic portion generates image information, and the display device displays the image information.

(12) One embodiment of the present invention is an electronic device including an arithmetic portion and the above display device. The second functional layer includes the arithmetic portion, the arithmetic portion generates image information, and the display device displays the image information.

Effect of the Invention

According to one embodiment of the present invention, a novel display device that is highly convenient, useful, or reliable can be provided. Alternatively, a novel electronic device that is highly convenient, useful, or reliable can be provided. Alternatively, a novel display device, a novel electronic device, or a novel semiconductor device can be provided.

Note that the description of these effects does not preclude the existence of other effects. Note that one embodiment of the present invention does not need to have all of these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIG. 20A to FIG. 20C are diagrams showing a metal oxide according to an embodiment.

MODE FOR CARRYING OUT THE INVENTION

Figure 1:
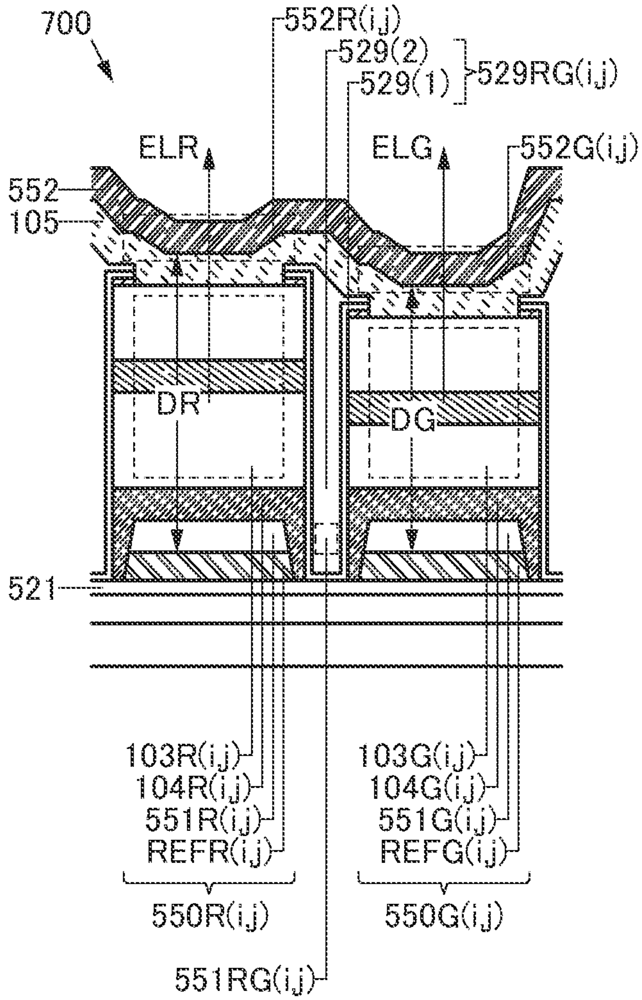
FIG. 1 is a diagram illustrating a structure of a display device according to an embodiment.

A display device of one embodiment of the present invention includes a first light-emitting device, a second light-emitting device, an insulating film, a conductive film, a first reflective film, and a second reflective film. The first light-emitting device includes a first electrode, a second electrode, and a first unit; the first unit is interposed between the second electrode and the first electrode; and the first electrode is interposed between the first unit and the insulating film. The second light-emitting device includes a third electrode, a fourth electrode, and a second unit; the second unit is interposed between the fourth electrode and the third electrode; the third electrode is interposed between the second unit and the insulating film; and a first gap is provided between the third electrode and the first electrode. The conductive film electrically connects the second electrode and the fourth electrode to each other, and the first gap is interposed between the conductive film and the insulating film. The first reflective film is interposed between the first electrode and the insulating film, and there is a first distance DR between the first reflective film and the second electrode. The second reflective film is interposed between the third electrode and the insulating film, and there is a second distance DG between the second reflective film and the fourth electrode. The second distance DG is longer than the first distance DR and the difference is larger than 20 nm and smaller than 85 nm.

Thus, a step generated between the first light-emitting device and the second light-emitting device can be reduced. A step generated in the conductive film can be reduced. A step generated in the conductive film can be reduced. Furthermore, a phenomenon in which a cut or a split is generated along the step in the conductive film can be inhibited. As a result, a novel display device that is highly convenient, useful, or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a structure of a display device 700 of one embodiment of the present invention will be described with reference to FIG. 1 to FIG. 3.

FIG. 1 is a cross-sectional view illustrating the structure of the display device of one embodiment of the present invention.

Figure 2:
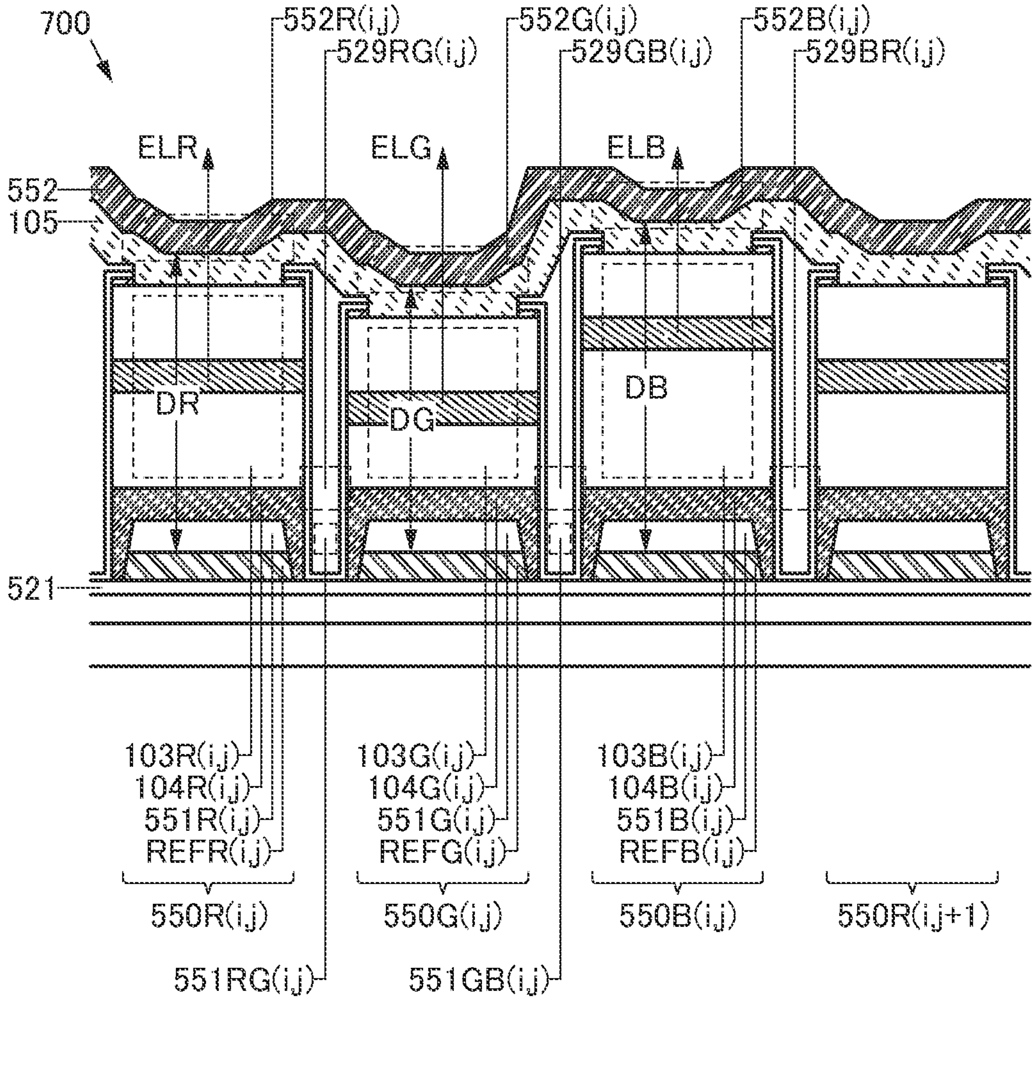
FIG. 2 is a diagram illustrating a structure of a display device according to an embodiment.

FIG. 2 is a cross-sectional view illustrating the structure of the display device of one embodiment of the present invention.

Figure 3:
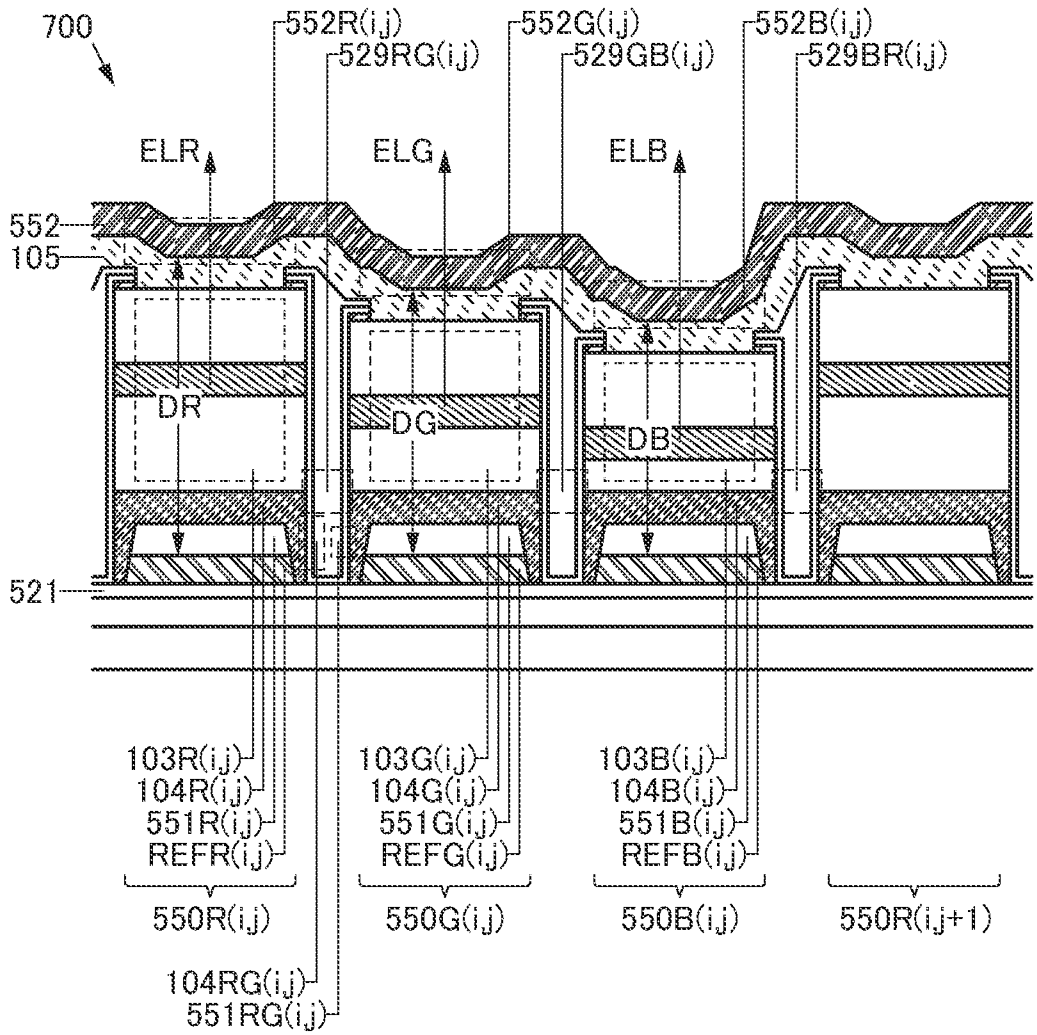
FIG. 3 is a diagram illustrating a structure of a display device according to an embodiment.

FIG. 3 is a cross-sectional view illustrating the structure of the display device of one embodiment of the present invention.

Structure Example 1 of Display Device

The display device 700 described in this embodiment includes a light-emitting device 550R(i,j), a light-emitting device 550G(i,j), an insulating film 521, a conductive film 552, a reflective film REFR(i,j), and a reflective film REFG (i,j) (see FIG. 1).

Structure Example 1 of Light-Emitting Device 550R(i,j)

The light-emitting device 550R(i,j) includes an electrode 551R(i,j), an electrode 552R(i,j), and a unit 103R(i,j).

The unit 103R(i,j) is interposed between the electrode 552R(i,j) and the electrode 551R(i,j), and the electrode 551R(i,j) is interposed between the unit 103R(i,j) and the insulating film 521.

Structure Example 1 of Light-Emitting Device 550G(i,j)

The light-emitting device 550G(i,j) includes an electrode 551G(i,j), an electrode 552G(i,j), and a unit 103G(i,j).

The unit 103G(i,j) is interposed between the electrode 552G(i,j) and the electrode 551G(i,j), and the electrode 551G(i,j) is interposed between the unit 103G(i,j) and the insulating film 521.

<<Structure Example of Electrode 551G(i,j)>>

A gap 551RG(i,j) is provided between the electrode 551G(i,j) and the electrode 551R(i,j).

Structure Example 1 of Conductive Film 552

The conductive film 552 electrically connects the electrode 552R(i,j) and the electrode 552G(i,j) to each other. Note that one conductive film can be used for the conductive film 552, the electrode 552R(i,j), and the electrode 552G(i, j). In that case, a region of the one conductive film that overlaps with the electrode 551R(i,j) can be used for the electrode 552R(i,j), a region of the one conductive film that overlaps with the electrode 551G(i,j) can be used for the electrode 552G(i,j), and a gap between the electrode 552R (i,j) and the electrode 552G(i,j) of the one conductive film can be used for the conductive film 552.

The gap 551RG(i,j) is interposed between the conductive film 552 and the insulating film 521.

Structure Example of Reflective Film REFR(i,j)

The reflective film REFR(i,j) is interposed between the electrode 551R(i,j) and the insulating film 521. There is a distance DR between the reflective film REFR(i,j) and the electrode 552R(i,j).

Structure Example of Reflective Film REFG(i,j)

The reflective film REFG(i,j) is interposed between the electrode 551G(i,j) and the insulating film 521. There is a distance DG between the reflective film REFG(i,j) and the electrode 552G(i,j).

The distance DG has a relation with the distance DR satisfying all of Formula (1) to Formula (3) below. In other words, the distance DR is longer than the distance DG and the difference is larger than 20 nm and smaller than 85 nm. Further preferably, the distance DR is longer than the distance DG and the difference is larger than 20 nm and smaller than 40 nm.

[Formulae 4]

$$DR > DG \tag{1}$$

$$DR - DG > 20\,\text{nm} \tag{2}$$

$$DR - DG < 85\,\text{nm} \tag{3}$$

<<Structure Example of Unit 103G(i,j)>>

The unit 103G(i,j) has a function of emitting light ELG. The emission spectrum of the light ELG has a maximum peak in a range of 480 nm to 600 nm inclusive.

Thus, a step generated between the light-emitting device 550R(i,j) and the light-emitting device 550G(i,j) can be reduced. A step generated in the conductive film 552 can be reduced. Furthermore, a phenomenon in which a cut or a split is generated along the step in the conductive film 552 can be inhibited. Green light can be used for display. As a result, a novel display device that is highly convenient, useful, or reliable can be provided.

Structure Example 2 of Display Device

The display device 700 described in this embodiment includes a filler 529RG(i,j) (see FIG. 1).

Structure Example 1 of Filler 529RG(i,j)

The filler 529RG(i,j) is interposed between the electrode 551R(i,j) and the electrode 551G(i,j). In other words, the filler 529RG is located in the gap 551RG, for example, filling the gap 551RG.

The filler 529RG(i,j) is interposed between the insulating film 521 and the conductive film 552. For example, the filler 529RG fills a gap between the insulating film 521 and the conductive film 552.

The filler 529RG(i,j) is interposed between the unit 103R (i,j) and the unit 103G(i,j). For example, the filler 529RG fills a gap between the unit 103R and the unit 103G.

Thus, the light-emitting device 550G(i,j) can be separated from the light-emitting device 550R(i,j). A gap formed between the light-emitting device 550R(i,j) and the light-emitting device 550G(i,j) can be filled using the filler 529RG(i,j). A step due to the gap formed between the light-emitting device 550R(i,j) and the light-emitting device 550G(i,j) can be reduced. The step generated in the conductive film 552 can be reduced. Furthermore, a phenomenon in which a cut or a split is generated along the step in the conductive film 552 can be inhibited. As a result, a novel display device that is highly convenient, useful, or reliable can be provided.

Structure Example 2 of Filler 529RG(i,j)

For example, an insulating inorganic material, an insulating organic material, or an insulating composite material containing an inorganic material and an organic material can be used for the filler 529RG(i,j).

Specifically, an inorganic oxide film, an inorganic nitride film, an inorganic oxynitride film, or the like, or a stacked-layer material in which a plurality of films selected from these films are stacked can be used for the filler 529RG(i,j).

For example, a film including a silicon oxide film, a silicon nitride film, a silicon oxynitride film, an aluminum oxide film, or the like, or a film including a stacked-layer material in which a plurality of films selected from these films are stacked can be used for the filler 529RG(i,j). Note that the silicon nitride film is a dense film and has an excellent function of inhibiting diffusion of impurities.

For example, the filler 529RG(i,j), polyester, polyolefin, polyamide, polyimide, polycarbonate, polysiloxane, an acrylic resin, or the like, or a stacked-layer material, a composite material, or the like of a plurality of resins selected from these resins can be used.

Structure Example 3 of Filler 529RG(i,j)

The filler 529RG(i,j), for example, includes a filler 529(1) and a filler 529(2).

For example, an insulating inorganic material can be used for the filler 529(1). Specifically, aluminum oxide or the like can be used for the filler 529(1). For example, a dense film that is formed by a chemical vapor deposition method, an atomic layer deposition (ALD) method, or the like can be used for the filler 529(1).

For example, an insulating organic material can be used for the filler 529(2). Specifically, polyimide or an acrylic resin can be used for the filler 529(2). For example, the filler 529(2) can be formed using a photosensitive material.

Structure Example 3 of Display Device

The display device 700 described in this embodiment includes a light-emitting device 550B(i,j) and a reflective film REFB(i,j) (see FIG. 2). The display device 700 includes a filler 529GB(i,j) and a filler 529BR(i,j). Note that the light-emitting device 550B(i,j) is adjacent to a light-emitting device 550R(i,j+1).

Structure Example 1 of Light-Emitting Device 550B(i,j)

The light-emitting device 550B(i,j) includes an electrode 551B(i,j), an electrode 552B(i,j), and a unit 103B(i,j).

The unit 103B(i,j) is interposed between the electrode 552B(i,j) and the electrode 551B(i,j), and the electrode 551B(i,j) is interposed between the unit 103B(i,j) and the insulating film 521.

<<Structure Example of Electrode 551B(i,j)>>

A gap 551GB(i,j) is provided between the electrode 551B(i,j) and the electrode 551G(i,j).

Structure Example 2 of Conductive Film 552

The conductive film 552 electrically connects the electrode 552G(i,j) and the electrode 552B(i,j) to each other.

The gap 551GB(i,j) is interposed between the conductive film 552 and the insulating film 521.

Structure Example 1 of Reflective Film REFB(i,j)

The reflective film REFB(i,j) is interposed between the electrode 551B(i,j) and the insulating film 521. There is a distance DB between the reflective film REFB(i,j) and the electrode 552B(i,j).

The distance DB has a relation with the distance DR and the distance DG satisfying all of Formula (1) to Formula (3) below. In other words, the distance DB is longer than the distance DR, the distance DR is longer than the distance DG, a difference between the distance DB and the distance DR is smaller than 60 nm, and a difference between the distance DR and the distance DG is smaller than 35 nm.

[Formulae 5]

$$DB > DR > DG \tag{1}$$

$$DB - DR < 60\text{ nm} \tag{2}$$

$$DR - DG < 35\text{ nm} \tag{3}$$

Structure Example 2 of Reflective Film REFB(i,j)

The distance DB is shorter than or equal to 200 nm.

Thus, the step generated between the light-emitting device 550R(i,j) and the light-emitting device 550G(i,j) can be reduced. A step generated between the light-emitting device 550G(i,j) and the light-emitting device 550B(i,j) can be reduced. A step generated between the light-emitting device 550R(i,j) and the light-emitting device 550B(i,j) can be reduced. In addition, the step generated in the conductive film 552 can be reduced. Furthermore, a phenomenon in which a cut or a split is generated along the step in the conductive film 552 can be inhibited. As a result, a novel optical functional device that is highly convenient, useful, or reliable can be provided.

Structure Example 4 of Display Device

The display device 700 described in this embodiment includes the light-emitting device 550B(i,j) and the reflective film REFB(i,j) (see FIG. 3).

Structure Example 3 of Reflective Film REFB(i,j)

The reflective film REFB(i,j) is interposed between the electrode 551B(i,j) and the insulating film 521. There is the distance DB between the reflective film REFB(i,j) and the electrode 552B(i,j).

The distance DB has a relation with the distance DR and the distance DG satisfying all of Formula (1) to Formula (3) below. In other words, the distance DR is longer than the distance DG, the distance DG is longer than the distance DB, a difference between the distance DR and the distance DG is smaller than 35 nm, and a difference between the distance DG and the distance DB is smaller than 35 nm.

[Formulae 6]

$$DR > DG > DB \tag{1}$$

$$DR - DG < 35\text{ nm} \tag{2}$$

$$DG - DB < 35\text{ nm} \tag{3}$$

Structure Example 4 of Reflective Film REFR(i,j)

The distance DR is shorter than or equal to 150 nm.

Thus, the step generated between the light-emitting device 550R(i,j) and the light-emitting device 550G(i,j) can be reduced. The step generated between the light-emitting device 550G(i,j) and the light-emitting device 550B(i,j) can be reduced. The step generated between the light-emitting device 550R(i,j) and the light-emitting device 550B(i,j) can be reduced. In addition, the step generated in the conductive film 552 can be reduced. Furthermore, a phenomenon in which a cut or a split is generated along the step in the conductive film 552 can be inhibited. As a result, a novel optical functional device that is highly convenient, useful, or reliable can be provided.

<<Structure Example of Unit 103R(i,j)>>

The unit 103R(i,j) has a function of emitting light ELR and the light ELR has a wavelength greater than or equal to 600 nm and less than or equal to 740 nm (see FIG. 3).

For example, the structure described in Embodiment 2 can be used for the unit 103R(i,j).

<<Structure Example of Unit 103B(i,j)>>

The unit 103B(i,j) has a function of emitting light ELB and the light ELB has a wavelength greater than or equal to 400 nm and less than or equal to 480 nm (see FIG. 3).

For example, the structure described in Embodiment 2 can be used for the unit 103B(i,j).

Thus, the step generated between the light-emitting device 550R(i,j) and the light-emitting device 550B(i,j) can be reduced. The step generated in the conductive film 552 can be reduced. Furthermore, a phenomenon in which a cut or a split is generated along the step in the conductive film 552 can be inhibited. Red light can be used for display. Blue light can be used for display. As a result, a novel display device that is highly convenient, useful, or reliable can be provided.

Structure Example 2 of Light-Emitting Device 550R(i,j)

The light-emitting device 550R(i,j) includes a layer 104R(i,j), and the layer 104R(i,j) is interposed between the unit 103R(i,j) and the electrode 551R(i,j).

<<Structure Example of Layer 104R(i,j)>>

The layer 104R(i,j) contains a substance AM having an electron-accepting property and a material HTM having a hole-transport property. The layer 104R(i,j) has an electrical resistivity higher than or equal to $1\times10^{2}$ [Ω·cm] and lower than or equal to $1\times10^{8}$ [Ω·cm].

For example, the structure of a layer 104 described in Embodiment 3 can be used for the layer 104R(i,j).

Structure Example 2 of Light-Emitting Device 550G(i,j)

The light-emitting device 550G(i,j) includes a layer 104G(i,j), and the layer 104G(i,j) is interposed between the unit 103G(i,j) and the electrode 551G(i,j). A gap 104RG(i,j) is provided between the layer 104G(i,j) and the layer 104R(i,j). Note that the gap 104RG(i,j) can be formed by an etching method, for example.

Specifically, in Step 1, a film that is to be the layer 104R(i,j) over the electrode 551R(i,j), a stacked film that is to be the unit 103R(i,j), and a first sacrificial layer protecting the unit 103R(i,j) are formed in this order. In Step 2, the first sacrificial layer, the unit 103R(i,j), and the layer 104R(i,j) are formed into a predetermined shape by a photolithography method and an etching method. Note that in the case where an unnecessary portion of the stacked film that is to be the unit 103R(i,j) is removed by an etching method, a smaller thickness of the stacked film is less likely to generate a residue, leading to easy processing.

Next, in Step 3, the first sacrificial layer protecting the unit 103R(i,j), a film that is to be the layer 104G(i,j) over the electrode 551G(i,j), a stacked film that is to be the unit 103G(i,j), and a second sacrificial layer protecting the unit 103G(i,j) are formed in this order. In the fourth step, the second sacrificial layer, the unit 103G(i,j), and the layer 104G(i,j) are formed into a predetermined shape by a photolithography method and an etching method. Note that in the case where an unnecessary portion of the stacked film that is to be the unit 103G(i,j) is removed by an etching method, a smaller thickness of the stacked film is less likely to generate a residue, leading to easy processing.

In Step 4, the gap 104RG(i,j) can be formed.

<<Structure Example of Layer 104G(i,j)>>

The layer 104G(i,j) contains the substance AM having an electron-accepting property and the material HTM having a hole-transport property.

For example, the structure of the layer 104 described in Embodiment 3 can be used for the layer 104G(i,j).

Thus, current flowing between the layer 104R(i,j) and the layer 104G(i,j) can be reduced. Furthermore, a crosstalk phenomenon between the light-emitting device 550R(i,j) and the light-emitting device 550G(i,j) can be inhibited. As a result, a novel display device that is highly convenient, useful, or reliable can be provided.

Note that in this specification and the like, a device fabricated using a metal mask or an FMM (fine metal mask) may be referred to as a device having an MM (metal mask) structure. In this specification and the like, a device fabricated without using a metal mask or an FMM may be referred to as a device having an MML (metal maskless) structure. A display device having an MML structure is fabricated without using a metal mask and thus has higher flexibility in designing the pixel arrangement, the pixel shape, and the like than a display device having an FMM structure or an MM structure.

Note that in the method of fabricating a display device having an MML structure, an island-shaped EL layer is formed not by patterning with the use of a metal mask but by processing an EL layer formed over an entire surface. Accordingly, a high-resolution display device or a display device with a high aperture ratio, which has been difficult to be formed so far, can be obtained. Moreover, EL layers of different colors can be formed separately, which enables the display device to perform extremely clear display with high contrast and high display quality. In addition, a sacrificial layer provided over an EL layer can reduce damage to the EL layer in the fabrication process of the display device, increasing the reliability of the light-emitting device.

The display device of one embodiment of the present invention can have a structure not provided with an insulator that covers the end portion of the pixel electrode. In other words, a structure not provided with an insulator between the pixel electrode and the EL layer is employed. With such a structure, light emission can be efficiently extracted from the EL layer, leading to extremely low viewing angle dependence. For example, in the display device of one embodiment of the present invention, the viewing angle (the maximum angle with a certain contrast ratio maintained when a screen is seen from an oblique direction) can be greater than or equal to 1000 and less than 180°, preferably greater than or equal to 1500 and less than or equal to 170°. Note that the viewing angle refers to that in both the vertical direction and the horizontal direction. The display device of one embodiment of the present invention can have improved viewing angle dependence and high image visibility.

In the case where a display device is a device having a fine metal mask (FMM) structure, the pixel arrangement structure or the like is limited in some cases. Here, the FMM structure will be described below.

In order to fabricate the FMM structure, a metal mask provided with an opening portion (also referred to as an FMM) is set to be opposed to a substrate so that an EL material is deposited to a desired region at the time of EL evaporation. Then, the EL material is deposited to the desired region by EL evaporation through the FMM. When the size of the substrate at the time of EL evaporation is larger, the size of the FMM is increased and accordingly the weight thereof is also increased. Heat or the like is applied to the FMM at the time of EL evaporation and may change the shape of the FMM. There is a method in which EL evaporation is performed while a certain level of tension is applied to the FMM, for example; thus, the weight and strength of the FMM are important parameters.

Thus, in the case where the pixel arrangement structure of a device with an FMM structure is designed, the above parameters and the like need to be taken into consideration, which imposes certain restrictions. By contrast, the display device of one embodiment of the present invention is fabricated using an MML structure and thus offers an excellent effect such as higher flexibility in the pixel arrangement structure or the like than the FMM structure. This structure is highly compatible with a flexible device or the like, for example; thus, one or both of a pixel and a driver circuit can have a variety of circuit arrangements.

Note that the display device of one embodiment of the present invention has a structure including the OS transistor and the light-emitting device having an MML (metal maskless) structure. With this structure, leakage current that might flow through the transistor and leakage current that might flow between adjacent light-emitting elements (also referred to as lateral leakage current, side leakage current, or the like) can become extremely low. With this structure, a viewer can notice any one or more of the image crispness, the image sharpness, a high chroma, and a high contrast ratio in an image displayed on the display device. With the structure where the leakage current that might flow through the transistor and the lateral leakage current between light-emitting elements are extremely low, display with little leakage of light at the time of black display (i.e., with few phenomena in which the black image looks whitish) (such display is also referred to as deep black display) can be achieved.

Note that this embodiment can be combined with any of the other embodiments described in this specification as appropriate.

Embodiment 2

In this embodiment, a structure of a light-emitting device that can be used in a display device of one embodiment of the present invention will be described with reference to FIG. 4.

Figure 4A:
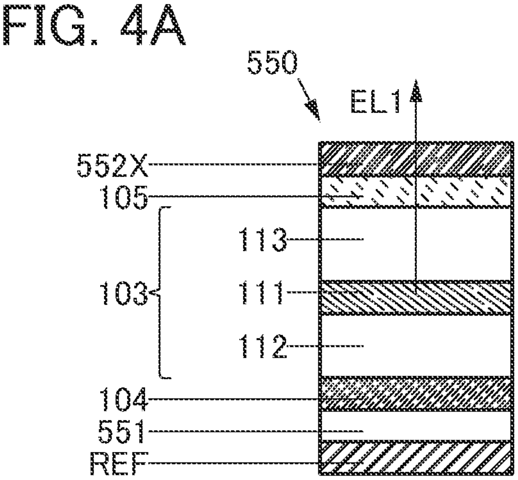
FIG. 4A and FIG. 4B are diagrams illustrating a structure of a light-emitting device according to an embodiment.
Figure 4B:
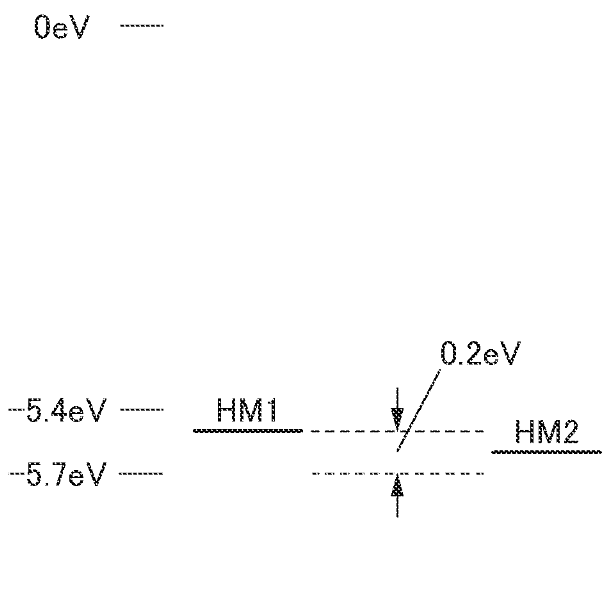

FIG. 4A is a cross-sectional view illustrating a structure of a light-emitting device 550 of one embodiment of the present invention, and FIG. 4B is a diagram illustrating energy levels of materials used for the light-emitting device 550 of one embodiment of the present invention.

The structure of the light-emitting device 550 described in this embodiment can be applied to the light-emitting device 550R(i,j), the light-emitting device 550G(i,j), or the light-emitting device 550B(i,j). Specifically, the reference numeral "550" used in the description of the light-emitting device 550 can be used for the description of the light-emitting device 550R(i,j), the light-emitting device 550G(i,j), and the light-emitting device 550B(i,j) by replacing "550" with "550R(i,j)", "550G(i,j)", and "550B(i,j)", respectively. Similarly, the reference numerals for components of the light-emitting device 550 can be replaced as appropriate.

For example, the reference numeral "103" used in the description of the unit 103 can be used for the description of the unit 103R(i,j), the unit 103G(i,j), and the unit 103B(i,j) by replacing "103" with "103R(i,j)", "103G(i,j)", and "103B(i,j)", respectively.

<<Structure Example of Light-Emitting Device 550>>

The light-emitting device 550 described in this embodiment includes an electrode 551, an electrode 552X, and the unit 103. The electrode 552X includes a region overlapping with the electrode 551, and the unit 103 includes a region interposed between the electrode 551 and the electrode 552X.

Structure Example of Unit 103

The unit 103 has a single-layer structure or a stacked-layer structure. For example, the unit 103 includes a layer 111, a layer 112, and a layer 113 (see FIG. 4A). The unit 103 has a function of emitting light EL1.

The layer 111 includes a region interposed between the layer 112 and the layer 113, the layer 112 includes a region interposed between the electrode 551 and the layer 111, and the layer 113 includes a region interposed between the electrode 552X and the layer 111.

For example, a layer selected from functional layers such as a light-emitting layer, a hole-transport layer, an electron-transport layer, and a carrier-blocking layer can be used in the unit 103. Moreover, a layer selected from functional layers such as a hole-injection layer, an electron-injection layer, an exciton-blocking layer, and a charge-generation layer can be used in the unit 103.

<<Structure Example of Layer 112>>

For example, a material having a hole-transport property can be used for the layer 112. The layer 112 can be referred to as a hole-transport layer. A material having a wider band gap than the light-emitting material contained in the layer 111 is preferably used for the layer 112. In that case, energy transfer from excitons generated in the layer 111 to the layer 112 can be inhibited.

[Material Having Hole-Transport Property]

A material having a hole mobility higher than or equal to $1\times10^{-6}$ $cm^2/Vs$ can be suitably used as the material having a hole-transport property.

As the hole-transport material, an amine compound or an organic compound having a π-electron rich heteroaromatic ring skeleton can be used, for example. Specifically, a compound having an aromatic amine skeleton, a compound having a carbazole skeleton, a compound having a thiophene skeleton, a compound having a furan skeleton, or the like can be used. The compound having an aromatic amine skeleton and the compound having a carbazole skeleton are particularly preferable because these compounds are highly reliable and have high hole-transport properties to contribute to a reduction in driving voltage.

As the compound having an aromatic amine skeleton, for example, 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9- phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl) triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), or the like can be used.

As the compound having a carbazole skeleton, for example, 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), or the like can be used.

As the compound having a thiophene skeleton, for example, 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), or the like can be used.

As the compound having a furan skeleton, for example, 4,4',4"-(benzene-1,3,5-triyl)tri(dibenzofuran) (abbreviation: DBF3P-II), 4-{3-[3-(9-phenyl-9H-fluoren-9-yl)phenyl]phenyl}dibenzofuran (abbreviation: mmDBFFLBi-II), or the like can be used.

<<Structure Example of Layer 113>>

A material having an electron-transport property, a material having an anthracene skeleton, or a mixed material can be used for the layer 113, for example. The layer 113 can be referred to as an electron-transport layer. A material having a wider band gap than the light-emitting material contained in the layer 111 is preferably used for the layer 113. In that case, energy transfer from excitons generated in the layer 111 to the layer 113 can be inhibited.

[Material Having Electron-Transport Property]

For example, a metal complex or an organic compound having a π-electron deficient heteroaromatic ring skeleton can be used as the material having an electron-transport property.

A material having an electron mobility higher than or equal to $1\times10^{-7}$ $cm^2/Vs$ and lower than or equal to $5\times10^{-5}$ $cm^2/Vs$ in a condition where the square root of the electric field strength [V/cm] is 600 can be favorably used as the material having an electron-transport property. Thus, the electron-transport property in the electron-transport layer can be inhibited. Alternatively, the amount of electrons injected into the light-emitting layer can be controlled. Alternatively, the light-emitting layer can be prevented from having excess electrons.

As a metal complex, bis(10-hydroxybenzo[h]quinolinato) beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis [2-(2-benzoxazolyl)phenolato]zinc(II) (abbreviation: ZnPBO), bis[2-(2-benzothiazolyl)phenolato]zinc(II) (abbreviation: ZnBTZ), or the like can be used, for example.

As an organic compound having a π-electron deficient heteroaromatic ring skeleton, a heterocyclic compound having a polyazole skeleton, a heterocyclic compound having a diazine skeleton, a heterocyclic compound having a pyridine skeleton, a heterocyclic compound having a triazine skeleton, or the like can be used, for example. In particular, the heterocyclic compound having a diazine skeleton or the heterocyclic compound having a pyridine skeleton has favorable reliability and thus are preferable. In addition, the heterocyclic compound having a diazine (pyrimidine or pyrazine) skeleton has a high electron-transport property to contribute to a reduction in driving voltage.

As a heterocyclic compound having a polyazole skeleton, 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or the like can be used, for example.

As a heterocyclic compound having a diazine skeleton, 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,8-bis[3-(dibenzothiophen-4-yl)phenyl]benzo[h]quinazoline (abbreviation: 4,8mDBtP2Bqn), or the like can be used, for example.

As a heterocyclic compound having a pyridine skeleton, 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), or the like can be used, for example.

As a heterocyclic compound having a triazine skeleton, 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), or the like can be used, for example.

[Material Having Anthracene Skeleton]

An organic compound having an anthracene skeleton can be used for the layer 113. In particular, an organic compound having both an anthracene skeleton and a heterocyclic skeleton can be suitably used.

For example, an organic compound having both an anthracene skeleton and a nitrogen-containing five-membered ring skeleton can be used. Alternatively, an organic compound having both an anthracene skeleton and a nitrogen-containing five-membered ring skeleton where two heteroatoms are included in a ring can be used. Specifically, a pyrazole ring, an imidazole ring, an oxazole ring, a thiazole ring, or the like can be favorably used as the heterocyclic skeleton.

For example, an organic compound having both an anthracene skeleton and a nitrogen-containing six-membered ring skeleton can be used. Alternatively, an organic compound having both an anthracene skeleton and a nitrogen-containing six-membered ring skeleton where two heteroatoms are included in a ring can be used. Specifically, a pyrazine ring, a pyrimidine ring, a pyridazine ring, or the like can be favorably used as the heterocyclic skeleton.

Structure Example of Mixed Material

A material in which a plurality of kinds of substances are mixed can be used for the layer 113. Specifically, a mixed material that contains a substance having an electron-transport property and any of an alkali metal, an alkali metal compound, and an alkali metal complex can be used for the layer 113. Note that it is further preferable that the HOMO level of the material having an electron-transport property be −6.0 eV or higher.

For example, a composite material of a substance having an electron-accepting property and a material having a hole-transport property can be used for the layer 104. Specifically, a composite material of a substance having an electron-accepting property and a substance having a relatively deep HOMO level HMT, which is greater than or equal to −5.7 eV and lower than or equal to −5.4 eV, can be used for the layer 104 (see FIG. 4B). The mixed material can be suitably used for the layer 113 in combination with a structure using such a composite material for the layer 104. As a result, the reliability of the light-emitting device can be increased.

Furthermore, a structure using a material having a hole-transport property for the layer 112 can be suitably combined with the structure using the mixed material for the layer 113 and the composite material for the layer 104. For example, a substance having a HOMO level HM2, which is within the range of −0.2 eV to 0 eV from the relatively deep HOMO level HM1, can be used for the layer 112 (see FIG. 4B). As a result, the reliability of the light-emitting device can be increased. Note that in this specification and the like, the structure of the above-described light-emitting device is referred to as a Recombination-Site Tailoring Injection structure (ReSTI structure) in some cases.

The concentration of the alkali metal, the alkali metal compound, or the alkali metal complex preferably differs in the thickness direction of the layer 113 (including the case where the concentration is 0).

For example, a metal complex having an 8-hydroxyquinolinato structure can be used. A methyl-substituted product of the metal complex having an 8-hydroxyquinolinato structure (e.g., a 2-methyl-substituted product or a 5-methyl-substituted product) or the like can also be used.

As the metal complex having an 8-hydroxyquinolinato structure, 8-hydroxyquinolinato-lithium (abbreviation: Liq), 8-hydroxyquinolinato-sodium (abbreviation: Naq), or the like can be used. In particular, a complex of a monovalent metal ion, especially a complex of lithium is preferable, and Liq is further preferable.

Structure Example 1 of Layer 111

A light-emitting material or a light-emitting material and a host material can be used for the layer 111, for example. The layer 111 can be referred to as alight-emitting layer. The layer 111 is preferably provided in a region where holes and electrons are recombined. In that case, energy generated by recombination of carriers can be efficiently converted into light and emitted.

Furthermore, the layer 111 is preferably provided apart from a metal used for the electrode or the like. In that case, a quenching phenomenon caused by the metal used for the electrode or the like can be inhibited.

It is preferable that a distance from an electrode or the like having reflectivity to the layer 111 be adjusted and the layer 111 be placed in an appropriate position in accordance with an emission wavelength. Thus, the amplitude can be increased by utilizing an interference phenomenon between light reflected by the electrode or the like and light emitted from the layer 111. Light of a predetermined wavelength can be intensified and the spectrum of the light can be narrowed. In addition, bright light emission colors with high intensity can be obtained. In other words, the layer 111 is placed in an appropriate position, for example, between electrodes and the like, and thus a microcavity structure (microcavity) can be formed.

For example, a fluorescent substance, a phosphorescent substance, or a substance exhibiting thermally activated delayed fluorescence (TADF) (also referred to as a TADF material) can be used as the light-emitting material. Thus, energy generated by recombination of carriers can be released as the light EL1 from the light-emitting material (see FIG. 4A).

[Fluorescent Substance]

A fluorescent substance can be used for the layer 111. For example, any of the following fluorescent substances can be used for the layer 111. Note that without being limited to the following ones, any of a variety of known fluorescent substances can be used for the layer 111.

Specifically, it is possible to use, for example, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N,N'-(pyrene-1,6-diyl)bis[(6,N-diphenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b; 6,7-b']bisbenzofuran (abbreviation: 3,10PCA2Nbf(IV)-02), or 3,10-bis[N-(dibenzofuran-3-yl)-N-phenylamino]naphtho[2,3-b; 6,7-b']bisbenzofuran (abbreviation: 3,10FrA2Nbf(IV)-02).

Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, or high reliability.

In addition, it is possible to use, for example, N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracene-2-amine (abbreviation: 2YGABPhA), N,N,9-triphenylanthracene-9-amine (abbreviation:

DPhAPhA), coumarin 545T, N,N'-diphenylquinacridone (abbreviation: DPQd), rubrene, or 5,12-bis(1,1'-biphenyl-4-yl)-6,11-diphenyltetracene (abbreviation: BPT).

Furthermore, it is possible to use, for example, 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), or 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM).

[Phosphorescent Substance]

A phosphorescent substance can be used for the layer 111. For example, any of the following phosphorescent substances can be used for the layer 111. Note that without being limited to the following ones, any of a variety of known phosphorescent substances can be used for the layer 111.

For the layer 111, it is possible to use, for example, an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, or a platinum complex.

[Phosphorescent Substance (Blue)]

As an organometallic iridium complex having a 4H-triazole skeleton or the like, tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), or the like can be used.

As an organometallic iridium complex having a 1H-triazole skeleton or the like, tris[3-methyl-1-(2-methylphenyl)-5-phenyl-1H-1,2,4-triazolato]iridium(III) (abbreviation: [Ir(Mptz1-mp)$_3$]), tris(1-methyl-5-phenyl-3-propyl-1H-1,2,4-triazolato)iridium(III) (abbreviation: [Ir(Prptz1-Me)$_3$]), or the like can be used.

As an organometallic iridium complex having an imidazole skeleton or the like, fac-tris[1-(2,6-diisopropylphenyl)-2-phenyl-1H-imidazole]iridium(III) (abbreviation: [Ir(iPrpmi)$_3$]), tris[3-(2,6-dimethylphenyl)-7-methylimidazo[1,2-f]phenanthridinato]iridium(III) (abbreviation: [Ir(dmpimpt-Me)$_3$]), or the like can be used.

As an organometallic iridium complex having a phenylpyridine derivative with an electron-withdrawing group as a ligand, or the like, bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: [Ir($CF_3$ppy)$_2$(pic)]), bis[2-(4',6'-difluorophenyl)pyridinato-N,$C^{2'}$]iridium(III) acetylacetonate (abbreviation: FIracac), or the like can be used.

Note that these are compounds exhibiting blue phosphorescence and are compounds having an emission wavelength peak at 440 nm to 520 nm.

[Phosphorescent Substance (Green)]

As an organometallic iridium complex having a pyrimidine skeleton or the like, it is possible to use, for example, tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), or (acetylacetonato)bis(4,6-diphenylpyrimidinato)iridium(III) (abbreviation: [Ir(dppm)$_2$(acac)]).

As an organometallic iridium complex having a pyrazine skeleton or the like, (acetylacetonato)bis(3,5-dimethyl-2-phenylpyrazinato)iridium(III) (abbreviation: [Ir(mppr-Me)$_2$(acac)]), (acetylacetonato)bis(5-isopropyl-3-methyl-2-phenylpyrazinato)iridium(III) (abbreviation: [Ir(mppr-iPr)$_2$(acac)]), or the like can be used.

As an organometallic iridium complex having a pyridine skeleton or the like, it is possible to use, for example, tris(2-phenylpyridinato-N,$C^{2'}$)iridium(III) (abbreviation: [Ir(ppy)$_3$]), bis(2-phenylpyridinato-N,$C^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,$C^{2'}$)iridium(III) (abbreviation: [Ir(pq)$_3$]), bis(2-phenylquinolinato-N,$C^{2'}$)iridium(III) acetylacetonate (abbreviation: [Ir(pq)$_2$(acac)]), [2-d3-methyl-(2-pyridinyl-κN)benzofuro[2,3-b]pyridine-κC]bis[2-(5-d3-methyl-2-pyridinyl-κN2)phenyl-κ]iridium(III) (abbreviation: [Ir(5mppy-d3)$_2$(mbfpypy-d3)]), or [2-d3-methyl-(2-pyridinyl-κN)benzofuro[2,3-b]pyridine-κC]bis[2-(2-pyridinyl-κN)phenyl-κC]iridium(III) (abbreviation: [Ir(ppy)$_2$(mbfpypy-d3)]).

An example of a rare earth metal complex is tris(acetylacetonato) (monophenanthroline)terbium(III) (abbreviation: [Tb(acac)$_3$(Phen)]).

Note that these are compounds mainly exhibiting green phosphorescence and have an emission wavelength peak at 500 nm to 600 nm. An organometallic iridium complex having a pyrimidine skeleton excels particularly in reliability or emission efficiency.

[Phosphorescent Substance (Red)]

As an organometallic iridium complex having a pyrimidine skeleton or the like, (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), bis[4,6-di(naphthalen-1-yl)pyrimidinato] (dipivaloylmethanato)iridium(III) (abbreviation: [Ir(d1npm)$_2$(dpm)]), or the like can be used.

As an organometallic iridium complex having a pyrazine skeleton or the like, (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), (acetylacetonato)bis

[2,3-bis(4-fluorophenyl)quinoxalinato]iridium(III) (abbreviation: $[Ir(Fdpq)_2(acac)]$), or the like can be used.

As an organometallic iridium complex having a pyridine skeleton or the like, tris(1-phenylisoquinolinato-N,$C^{2'}$) iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), or the like can be used.

As a rare earth metal complex or the like, tris(1,3-diphenyl-1,3-propanedionato)(monophenanthroline)europium(III) (abbreviation: $[Eu(DBM)_3(Phen)]$), tris[1-(2-thenoyl)-3,3,3-trifluoroacetonato] (monophenanthroline) europium(III) (abbreviation: $[Eu(TTA)_3(Phen)]$), or the like can be used.

As a platinum complex or the like, 2,3,7,8,12,13,17,18-octaethyl-21H,23H-porphyrin platinum(II) (abbreviation: PtOEP) or the like can be used.

Note that these are compounds exhibiting red phosphorescence and have an emission peak at 600 nm to 700 nm. Furthermore, from the organometallic iridium complex having a pyrazine skeleton, red light emission with chromaticity favorably used for display devices can be obtained.

[Substance Exhibiting Thermally Activated Delayed Fluorescence (TADF)]

A TADF material can be used for the layer 111. For example, any of the TADF materials given below can be used as the light-emitting material. Note that without being limited thereto, any of a variety of known TADF materials can be used as the light-emitting material.

In the TADF material, the difference between the S1 level and the T1 level is small, and reverse intersystem crossing (upconversion) from the triplet excited state into the singlet excited state can be achieved by a little thermal energy. Thus, the singlet excited state can be efficiently generated from the triplet excited state. In addition, the triplet excitation energy can be converted into light.

An exciplex whose excited state is formed of two kinds of substances has an extremely small difference between the S1 level and the T1 level and functions as a TADF material capable of converting triplet excitation energy into singlet excitation energy.

A phosphorescence spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between S1 and T1 of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

Examples of the TADF material include a fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can be also used for the TADF material.

Specifically, any of the following materials whose structural formulae are shown below can be used: a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), an octaethylporphyrin-platinum chloride complex ($PtCl_2OEP$), and the like.

[Chemical Formulae 1]

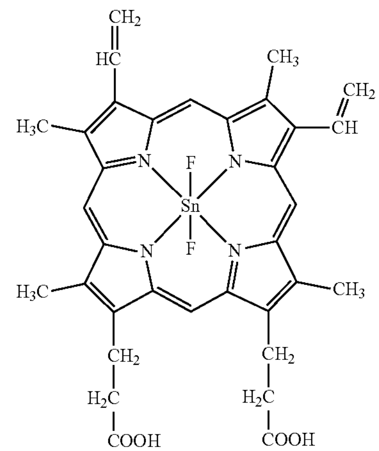

$SnF_2$(Proto IX)

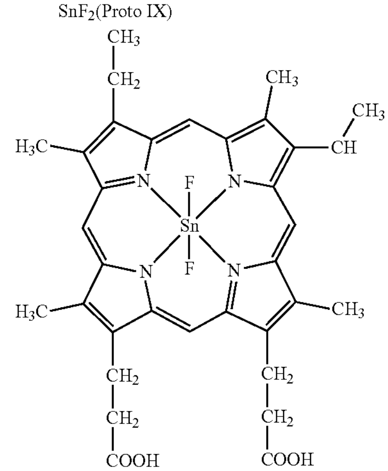

$SnF_2$(Meso IX)

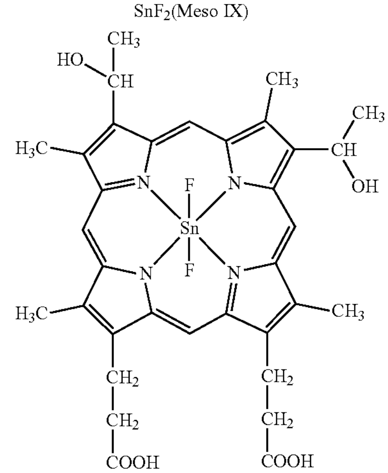

$SnF_2$(Hemato IX)

-continued

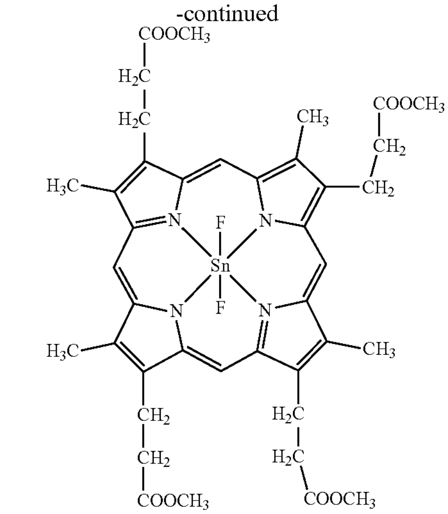

$SnF_2$(Copro III-4Me)

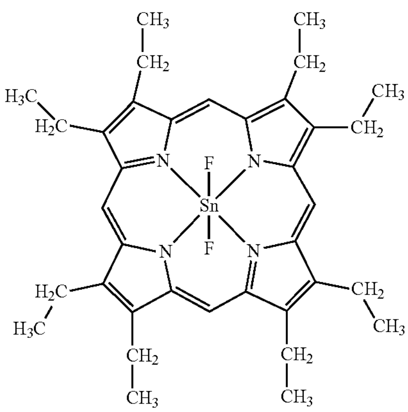

$SnF_2$(OEP)

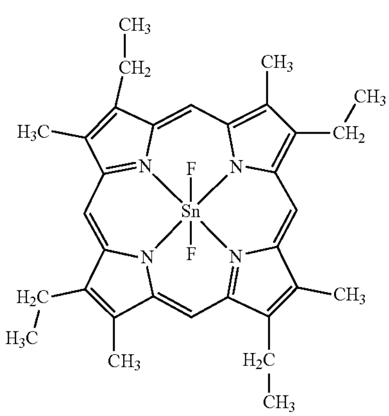

$SnF_2$(Etio I)

-continued

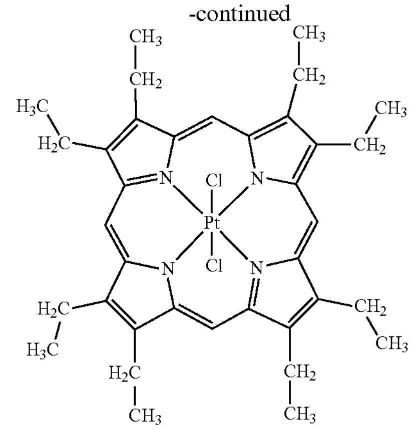

$PtCl_2OEP$

Furthermore, a heterocyclic compound including one or both of a π-electron rich heteroaromatic ring and a π-electron deficient heteroaromatic ring can be used, for example, for the TADF material.

Specifically, any of the following materials whose structural formulae are shown below can be used: 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H, 10'H-spiro[acridin-9,9'-anthracen]-10'-one (abbreviation: ACRSA), and the like.

Chemical Formulae 2]

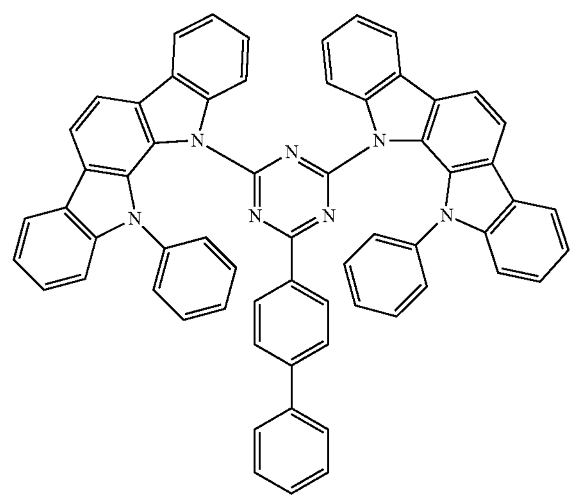

PIC-TRZ

-continued

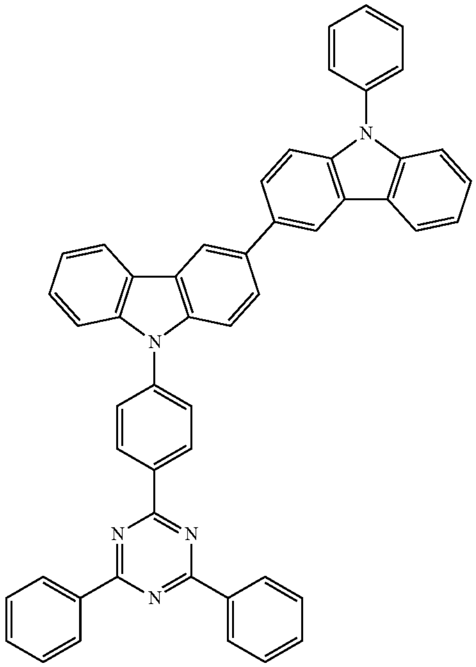

PCCzPTzn

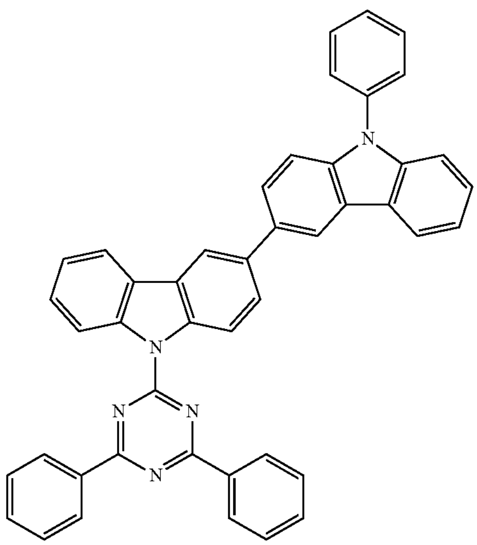

PCCzTzn

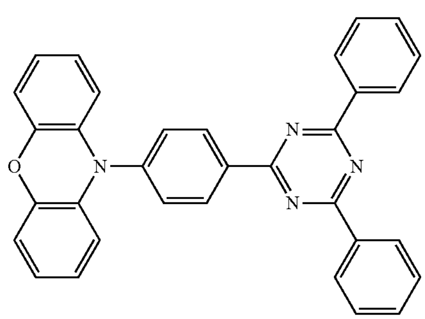

PXZ-TRZ

-continued

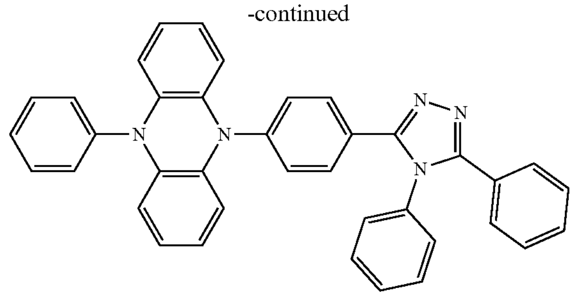

PPZ-3TPT

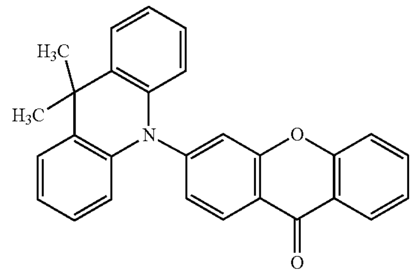

ACRXTN

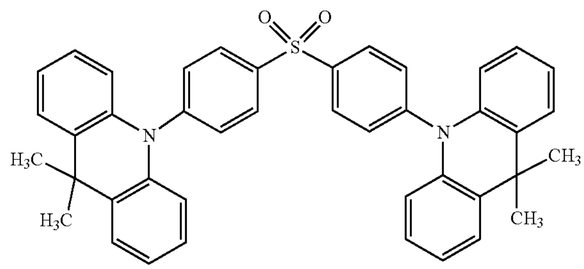

DMAC-DPS

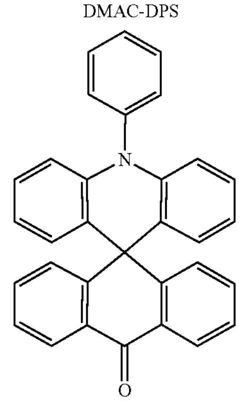

ACRSA

Such a heterocyclic compound is preferable because of having excellent electron-transport property and hole-transport property owing to a π-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferable because of their high stability and reliability. In particular, a benzofuropyrimidine skeleton, a benzothienopyrimidine skeleton, a benzofuropyrazine skeleton, and a benzothienopyrazine skeleton, which have high electron-withdrawing properties and favorable reliability, are preferable.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferable because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a nitrile group or a cyano group such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

Structure Example 2 of Layer 111

A material having a carrier-transport property can be used as the host material. For example, a material having a hole-transport property, a material having an electron-transport property, a substance exhibiting thermally activated delayed fluorescence TADF, a material having an anthracene skeleton, or a mixed material can be used as the host material. A material having a wider band gap than the light-emitting material contained in the layer 111 is preferably used as the host material. In that case, energy transfer from excitons generated in the layer 111 to the host material can be inhibited.

[Material Having Hole-Transport Property]

A material having a hole mobility higher than or equal to $1\times10^{-6}$ $cm^2/Vs$ can be suitably used as the material having a hole-transport property.

For example, a material having a hole-transport property that can be used for the layer 112 can be used for the layer 111. Specifically, a material having a hole-transport property that can be used for the hole-transport layer can be used for the layer 111.

[Material Having Electron-Transport Property]

For example, a material having an electron-transport property that can be used for the layer 113 can be used for the layer 111. Specifically, a material having an electron-transport property that can be used for the electron-transport layer can be used for the layer 111.

[Material Having Anthracene Skeleton]

An organic compound having an anthracene skeleton can be used as the host material. In particular, when a fluorescent substance is used as the light-emitting substance, an organic compound having an anthracene skeleton is preferably used. In that case, alight-emitting device with high emission efficiency and high durability can be obtained.

As the organic compound having an anthracene skeleton, an organic compound having a diphenylanthracene skeleton, in particular, a 9,10-diphenylanthracene skeleton is chemically stable and thus is preferable. The host material preferably has a carbazole skeleton, in which case the hole-injection and hole-transport properties are improved. In particular, the host material preferably has a dibenzocarbazole skeleton, in which case the HOMO level thereof is shallower than that of carbazole by approximately 0.1 eV, so that holes enter the host material easily, the hole-transport property is improved, and the heat resistance is increased. Note that in terms of the hole-injection and hole-transport properties, a benzofluorene skeleton or a dibenzofluorene skeleton may be used instead of a carbazole skeleton.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferable as the host material.

For example, it is possible to use 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9-(1-naphthyl)-10-[4-(2-naphthyl)phenyl]anthracene (abbreviation: αN-PNPAnth), 9-phenyl-3-[4-(10-phenyl-9-anthryl)phenyl]-9H-carbazole (abbreviation: PCzPA), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 3-[4-(1-naphthyl)-phenyl]-9-phenyl-9H-carbazole (abbreviation: PCPN).

In particular, CzPA, cgDBCzPA, 2mBnfPPA, and PCzPA have excellent characteristics.

[Substance Exhibiting Thermally Activated Delayed Fluorescence (TADF)]

A TADF material can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than that of the fluorescent substance in order that high emission efficiency can be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protecting group around a luminophore (a skeleton which causes light emission) of the fluorescent substance. As the protecting group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protecting groups. The substituents having no π bond are poor in carrier-transport performance, whereby the TADF material and the luminophore of the fluorescent substance can be made away from each other with little influence on carrier transport or carrier recombination.

Here, the luminophore refers to an atomic group (skeleton) that causes light emission in a fluorescent substance. The luminophore is preferably a skeleton having a π bond, further preferably includes an aromatic ring, still further preferably includes a condensed aromatic ring or a condensed heteroaromatic ring.

Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferable because of its high fluorescence quantum yield.

For example, the TADF material that can be used as the light-emitting material can be used as the host material.

Structure Example 1 of Mixed Material

A material in which a plurality of kinds of substances are mixed can be used as the host material. For example, a material that contains an electron-transport material and a hole-transport material can be used as the mixed material. The weight ratio between the hole-transport material and the electron-transport material contained in the mixed material may be (the hole-transport material/the electron-transport material)=(1/19) or more and (19/1) or less. Accordingly, the carrier-transport property of the layer 111 can be easily adjusted. In addition, a recombination region can be controlled easily.

Structure Example 2 of Mixed Material

A material mixed with a phosphorescent substance can be used as the host material. When a fluorescent substance is used as the light-emitting substance, a phosphorescent substance can be used as an energy donor for supplying excitation energy to the fluorescent substance.

Structure Example 3 of Mixed Material

A mixed material containing a material to form an exciplex can be used as the host material. For example, a material forming an exciplex whose emission spectrum overlaps with the wavelength of the absorption band on the lowest energy side of the light-emitting substance can be used as the host material. This enables smooth energy transfer and improves emission efficiency. Alternatively, the driving voltage can be reduced. With such a structure, light emission can be efficiently obtained by ExTET (Exciplex-Triplet Energy Transfer), which is energy transfer from the exciplex to the light-emitting substance (phosphorescent material).

A phosphorescent substance can be used as at least one of the materials forming an exciplex. Accordingly, reverse intersystem crossing can be used. Alternatively, triplet excitation energy can be efficiently converted into singlet excitation energy.

A combination of materials forming an exciplex is preferably such that the HOMO level of a material having a hole-transport property is higher than or equal to the HOMO level of a material having an electron-transport property. Alternatively, the LUMO level of the material having a hole-transport property is preferably higher than or equal to the LUMO level of the material having an electron-transport property. In that case, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of a mixed film in which the material having a hole-transport property and the material having an electron-transport property are mixed is shifted to a longer wavelength than the emission spectrum of each of the materials (or has another peak on the longer wavelength side) observed in comparison of the emission spectrum of the material having a hole-transport property, the emission spectrum of the material having an electron-transport property, and the emission spectrum of the mixed film of these materials, for example. Alternatively, the formation of an exciplex can be confirmed by a difference in transient response, such as Furthermore, a phenomenon in which the transient photoluminescence (PL) lifetime of the mixed film has longer lifetime components or has a larger proportion of delayed components than that of each of the materials, observed in comparison of transient PL of the material having a hole-transport property, the transient PL of the material having an electron-transport property, and the transient PL of the mixed film of these materials. The transient PL can be rephrased as transient electroluminescence (EL). That is, the formation of an exciplex can also be confirmed by a difference in transient response observed in comparison of the transient EL of the material having a hole-transport property, the transient EL of the material having an electron-transport property, and the transient EL of the mixed film of these materials.

Note that this embodiment can be combined with any of the other embodiments described in this specification as appropriate.

Embodiment 3

In this embodiment, a structure of a light-emitting device that can be used in a display device of one embodiment of the present invention will be described with reference to FIG. 4.

The structure of the light-emitting device 550 described in this embodiment can be applied to the light-emitting device 550R(i,j), the light-emitting device 550G(i,j), or the light-emitting device 550B(i,j). Specifically, the reference numeral "550" used in the description of the light-emitting device 550 can be used for the description of the light-emitting device 550R(i,j), the light-emitting device 550G(i, j), and the light-emitting device 550B(i,j) by replacing "550" with "550R(i,j)", "550G(i,j)", and "550B(i,j)", respectively. Similarly, the reference numerals for components of the light-emitting device 550 can be replaced as appropriate.

For example, the reference numeral "551" used in the description of the electrode 551 can be used for the description of the electrode 551R(i,j), the electrode 551G(i,j), and the electrode 551B(i,j) by replacing "551" with "551R(i,j)", "551G(i,j)", and "551B(i,j)", respectively.

Furthermore, the reference numeral "104" used in the description of the layer 104 can be used for the description of the layer 104R(i,j), the layer 104G(i,j), and a layer 104B(i,j) by replacing "104" with "104R(i,j)", "104G(i,j)", and "104B(i,j)", respectively.

Structure Example of Light-Emitting Device 550

The light-emitting device 550 described in this embodiment includes the electrode 551, the electrode 552X, the unit 103, and the layer 104. The electrode 552X includes a region overlapping with the electrode 551, and the unit 103 includes a region interposed between the electrode 551 and the electrode 552X. The layer 104 includes a region interposed between the electrode 551 and the unit 103. For example, the structure described in Embodiment 2 can be used for the unit 103.

Structure Example of Electrode 551

For example, a conductive material can be used for the electrode 551. Specifically, a single layer or a stacked layer of a metal, an alloy, or a film containing a conductive compound can be used for the electrode 551.

For example, a film that efficiently reflects light can be used for the electrode 551. Specifically, an alloy containing silver, copper, and the like, an alloy containing silver, palladium, and the like, or a metal film of aluminum or the like can be used for the electrode 551.

Alternatively, for example, a metal film that transmits part of light and reflects the other part of the light can be used as the electrode 551. Thus, a microcavity structure (microcavity) can be provided in the light-emitting device 550. Light of a predetermined wavelength can be extracted more efficiently than other light. Light with a narrow half width of a spectrum can be extracted. Light of a bright color can be extracted.

A film having a property of transmitting visible light can be used for the electrode 551, for example. Specifically, a single layer or a stacked layer of a metal film, an alloy film, a conductive oxide film, or the like that is thin enough to transmit light can be used for the electrode 551.

In particular, a material having a work function higher than or equal to 4.0 eV can be suitably used for the electrode 551.

For example, a conductive oxide containing indium can be used. Specifically, indium oxide, indium oxide-tin oxide (abbreviation: ITO), indium oxide-tin oxide containing silicon or silicon oxide (abbreviation: ITSO), indium oxide-zinc oxide, indium oxide containing tungsten oxide and zinc oxide (abbreviation: IWZO), or the like can be used.

Furthermore, for example, a conductive oxide containing zinc can be used. Specifically, zinc oxide, zinc oxide to which gallium is added, zinc oxide to which aluminum is added, or the like can be used.

Furthermore, for example, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. Alternatively, graphene can be used.

<<Structure Example of Layer 104>>

For example, a material having a hole-injection property can be used for the layer 104. The layer 104 can be referred to as a hole-injection layer.

Specifically, a substance having an electron-accepting property can be used for the layer 104. A composite material containing a plurality of kinds of substances can be used for the layer 104. This can facilitate injection of holes from the electrode 551, for example. Alternatively, the driving voltage of the light-emitting device can be lowered.

[Substance Having Electron-Accepting Property]

An organic compound and an inorganic compound can be used as the substance having an electron-accepting property. The substance having an electron-accepting property can extract electrons from an adjacent hole-transport layer or an adjacent material having a hole-transport property by the application of an electric field.

For example, a compound having an electron-withdrawing group (a halogen group or a cyano group) can be used as the substance having an electron-accepting property. Note that an organic compound having an electron-accepting property is easily deposited by evaporation and its film can be easily formed. As a result, the productivity of the light-emitting device can be increased.

Specifically, it is possible to use, for example, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylen-1,3,4,5,6,8,9,10-octafluoro-7H-pyren-2-ylidene)malononitrile.

A compound in which electron-withdrawing groups are bonded to a condensed aromatic ring having a plurality of heteroatoms, such as HAT-CN, is particularly preferable because it is thermally stable.

Alternatively, a [3]radialene derivative having an electron-withdrawing group (in particular, a cyano group or a halogen group such as a fluoro group) is preferable because it has a very high electron-accepting property.

Specifically, it is possible to use, for example, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], or α,α',α"-1,2,3-cyclopropanetriylidenetris[2,3,4,5,6-pentafluorobenzeneacetonitrile].

As the substance having an electron-accepting property, molybdenum oxide, vanadium oxide, ruthenium oxide, tungsten oxide, manganese oxide, or the like can be used.

Alternatively, it is possible to use phthalocyanine (abbreviation: $H_2$Pc), a phthalocyanine-based complex compound such as and copper phthalocyanine (CuPc), and compounds having an aromatic amine skeleton such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD).

Furthermore, it is possible to use, for example, a high molecular compound such as poly(3,4-ethylenedioxythiophene)/poly(styrenesulfonic acid) (PEDOT/PSS).

Structure Example 1 of Composite Material

For example, a composite material containing a substance having an electron-accepting property and a material having a hole-transport property can be used for the layer 104. Thus, not only a material having a high work function, but also a material having a low work function can be used for the electrode 551. Alternatively, a material used for the electrode 551 can be selected from a wide range of materials regardless of its work function.

As the material having a hole-transport property in the composite material, for example, a compound having an aromatic amine skeleton, a carbazole derivative, an aromatic hydrocarbon, an aromatic hydrocarbon having a vinyl group, a high molecular compound (such as an oligomer, a dendrimer, or a polymer), or the like can be used. A material having a hole mobility of $1\times10^{-6}$ $cm^2/Vs$ or higher can be suitably used as the material having a hole-transport property in the composite material.

A substance having a relatively deep HOMO level can be suitably used as the material having a hole-transport property in the composite material. Specifically, the HOMO level is preferably higher than or equal to −5.7 eV and lower than or equal to −5.4 eV, in which case hole injection to the unit 103 can be facilitated. In that case, hole injection to the unit 103 can be facilitated. Alternatively, hole injection to the layer 112 can be facilitated. Alternatively, the reliability of the light-emitting device can be increased.

As the compound having an aromatic amine skeleton, for example, N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), or the like can be used.

As the carbazole derivative, for example, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, or the like can be used.

As the aromatic hydrocarbon, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, or the like can be used.

As the aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), or the like can be used.

As the high molecular compound, for example, poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), poly[N,N'-bis(4-butylphenyl)-N,N'-bis(phenyl)benzidine] (abbreviation: Poly-TPD), or the like can be used.

As another example, a substance having any of a carbazole skeleton, a dibenzofuran skeleton, a dibenzothiophene skeleton, and an anthracene skeleton can be favorably used as the material having a hole-transport property in the composite material. Moreover, as the material having a hole-transport property in the composite material, it is possible to use a substance including any of an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With the use of a substance including an N,N-bis(4-biphenyl)amino group, the reliability of the light-emitting device can be increased.

As these materials, for example, N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6; 1'-binaphthyl-2-yl)triphenylamine (abbreviation: BBAαNPNB), 4,4'-diphenyl-4"-(7; 1'-binaphthyl-2-yl)triphenylamine (abbreviation: BBAαNβNB-03), 4,4'-diphenyl-4"-(7-phenyl)naphthyl-2-yl)triphenylamine (abbreviation: BBAPβNB-03), 4,4'-diphenyl-4"-(6; 2'-binaphthyl-2-yl)triphenylamine (abbreviation: BBA(βN2)B), 4,4'-diphenyl-4"-(7; 2'-binaphthyl-2-yl)triphenylamine (abbreviation: BBA(βN2)B-03), 4,4'-diphenyl-4"-(4; 2'-binaphthyl-1-yl)triphenylamine (abbreviation: BBAβNαNB), 4,4'-diphenyl-4"-(5; 2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-diphenyl-4'-(2-naphthyl)-4"-{9-(4-biphenylyl)carbazole)}triphenylamine (abbreviation: YGTBiβNB), N-[4-(9-phenyl-9Hcarbazol-3-yl)phenyl]-N-[4-(1-naphthyl)phenyl]-9,9'-spirobi[9H-fluoren]-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, N,N-bis(9,9-dimethyl-9H-fluoren-2-yl)-9,9'-spirobi-9H-fluoren-1-amine, or the like can be used.

Structure Example 2 of Composite Material

For example, a composite material containing a substance having an electron-accepting property, a material having a hole-transport property, and a fluoride of an alkali metal or a fluoride of an alkaline earth metal can be used as the material having a hole-injection property. In particular, a composite material in which the proportion of fluorine atoms is higher than or equal to 20% can be suitably used. Thus, the refractive index of the layer 104 can be reduced. Alternatively, a layer with a low refractive index can be formed inside the light-emitting device. Alternatively, the external quantum efficiency of the light-emitting device can be improved.

Note that this embodiment can be combined with any of the other embodiments described in this specification as appropriate.

Embodiment 4

In this embodiment, a structure of a light-emitting device that can be used in a display device of one embodiment of the present invention will be described with reference to FIG. 4.

The structure of the light-emitting device 550 described in this embodiment can be applied to the light-emitting device 550R(i,j), the light-emitting device 550G(i,j), or the light-emitting device 550B(i,j). Specifically, the reference numeral "550" used in the description of the light-emitting device 550 can be used for the description of the light-emitting device 550R(i,j), the light-emitting device 550G(i,j), and the light-emitting device 550B(i,j) by replacing "550" with "550R(i,j)", "550G(i,j)", and "550B(i,j)", respectively. Similarly, the reference numerals for components of the light-emitting device 550 can be replaced as appropriate.

For example, the reference numeral "552X" used in the description of the electrode 552X can be used for the description of the electrode 552R(i,j), the electrode 552G(i,j), and the electrode 552B(i,j) by replacing "552X" with "552R(i,j)", "552G(i,j)", and "552B(i,j)", respectively.

Structure Example of Light-Emitting Device 550

The light-emitting device 550 described in this embodiment includes the electrode 551, the electrode 552X, the unit 103, and a layer 105. The electrode 552X includes a region overlapping with the electrode 551, and the unit 103 includes a region interposed between the electrode 551 and the electrode 552X. The layer 105 includes a region interposed between the unit 103 and the electrode 552X. For example, the structure described in Embodiment 2 can be used for the unit 103.

Structure Example of Electrode 552X

A conductive material can be used for the electrode 552X, for example. Specifically, a single layer or a stacked layer of a metal, an alloy, or a material containing a conductive compound can be used for the electrode 552X.

For example, the material that can be used for the electrode 551 described in Embodiment 3 can be used for the electrode 552X. In particular, a material having a lower work function than the electrode 551 can be favorably used for the electrode 552X. Specifically, a material having a work function lower than or equal to 3.8 eV is preferable.

For example, an element belonging to Group 1 of the periodic table, an element belonging to Group 2 of the periodic table, a rare earth metal, or an alloy containing any of these elements can be used for the electrode 552X.

Specifically, lithium (Li), cesium (Cs), or the like; magnesium (Mg), calcium (Ca), strontium (Sr), or the like; europium (Eu), ytterbium (Yb), or the like; or an alloy containing any of these (MgAg or AlLi) can be used for the electrode 552X.

<<Structure Example of Layer 105>>

A material having an electron-injection property can be used for the layer 105, for example. The layer 105 can be referred to as an electron-injection layer.

Specifically, a substance having a donor property can be used for the layer 105. Alternatively, a material in which a substance having a donor property and a material having an electron-transport property are combined can be used for the layer 105. Alternatively, electride can be used for the layer 105. This can facilitate injection of electrons from the electrode 552X, for example. Alternatively, besides a material having a low work function, a material having a high work function can also be used for the electrode 552X. Alternatively, a material used for the electrode 552X can be selected from a wide range of materials regardless of its work function. Specifically, Al, Ag, ITO, indium oxide-tin oxide containing silicon or silicon oxide, or the like can be used for the electrode 552X. Alternatively, the driving voltage of the light-emitting device can be lowered.

[Substance Having Donor Property]

For example, an alkali metal, an alkaline earth metal, a rare earth metal, or a compound thereof (an oxide, a halide, a carbonate, or the like) can be used as the substance having a donor property. Alternatively, an organic compound such as tetrathianaphthacene (abbreviation: TTN), nickelocene, or decamethylnickelocene can be used as the substance having a donor property.

As an alkali metal compound (including an oxide, a halide, and a carbonate), lithium oxide, lithium fluoride (LiF), cesium fluoride (CsF), lithium carbonate, cesium carbonate, 8-hydroxyquinolinato-lithium (abbreviation: Liq), or the like can be used.

As an alkaline earth metal compound (including an oxide, a halide, and a carbonate), calcium fluoride ($CaF_2$) or the like can be used.

Structure Example 1 of Composite Material

A material in which a plurality of kinds of substances are combined can be used as the material having an electron-injection property. For example, a substance having a donor property and a material having an electron-transport property can be used for the composite material.

[Material Having Electron-Transport Property]

A metal complex or an organic compound having a π-electron deficient heteroaromatic ring skeleton can be used as the material having an electron-transport property. For example, a material having an electron-transport property usable for the unit 103 can be used for the composite material.

Structure Example 2 of Composite Material

A material including a fluoride of an alkali metal in a microcrystalline state and a material having an electron-transport property can be used for the composite material. Alternatively, a material including a fluoride of an alkaline earth metal in a microcrystalline state and a material having an electron-transport property can be used for the composite material. In particular, a composite material containing a fluoride of an alkali metal or a fluoride of an alkaline earth metal at higher than or equal to 50 wt % can be suitably used. Alternatively, a composite material including an organic compound having a bipyridine skeleton can be suitably used. In that case, the refractive index of the layer 105 can be reduced. Alternatively, the external quantum efficiency of the light-emitting device can be improved.

Structure Example 3 of Composite Material

For example, a composite material containing a first organic compound having an unshared electron pair and a first metal can be used for the layer 105. The sum of the number of electrons of the first organic compound and the number of electrons of the first metal is preferably an odd number. The molar ratio of the first metal to 1 mol of the first organic compound is preferably greater than or equal to 0.1 and less than or equal to 10, further preferably greater than or equal to 0.2 and less than or equal to 2, still further preferably greater than or equal to 0.2 and less than or equal to 0.8.

Accordingly, the first organic compound having an unshared electron pair interacts with the first metal and thus can form a singly occupied molecular orbital (SOMO). Furthermore, in the case where electrons are injected from the electrode 552X into the layer 105, a barrier therebetween can be lowered. The first metal has a low reactivity with water or oxygen; thus, the moisture resistance of the light-emitting device can be improved.

For the layer 105, a composite material that allows the spin density measured by an electron spin resonance method (ESR) to be preferably higher than or equal to $1\times10^{16}$ spins/cm$^3$, further preferably higher than or equal to $5\times10^{16}$ spins/cm$^3$, still further preferably higher than or equal to $1\times10^{17}$ spins/cm$^3$ can be used.

[Organic Compound Having Unshared Electron Pair]

For example, a material having an electron-transport property can be used for the organic compound having an unshared electron pair. For example, a compound having an electron deficient heteroaromatic ring can be used. Specifically, a compound having at least one of a pyridine ring, a diazine ring (a pyrimidine ring, a pyrazine ring, and a pyridazine ring), and a triazine ring can be used. Accordingly, the driving voltage of the light-emitting device can be reduced.

Note that the lowest unoccupied molecular orbital (LUMO) level of the organic compound having an unshared electron pair is preferably greater than or equal to −3.6 eV and less than or equal to −2.3 eV. In general, the HOMO level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

Alternatively, for example, copper phthalocyanine can be used for the organic compound having an unshared electron pair. The number of electrons of the copper phthalocyanine is an odd number.

[First Metal]

For example, when the number of electrons of the first organic compound having an unshared electron pair is an even number, a composite material of a metal that belongs to an odd-numbered group in the periodic table and the first organic compound can be used for the layer 105.

For example, manganese (Mn), which is a metal belonging to Group 7, cobalt (Co), which is a metal belonging to Group 9, copper (Cu), silver (Ag), and gold (Au), which are metals belonging to Group 11, aluminum (Al) and indium (In), which are metals belonging to Group 13 are odd-numbered groups in the periodic table. Note that elements belonging to Group 11 have a lower melting point than elements belonging to Group 7 or Group 9 and thus are suitable for vacuum evaporation. In particular, Ag is preferable because of its low melting point.

The use of Ag for the electrode 552X and the layer 105 can increase the adhesion between the layer 105 and the electrode 552X.

When the number of electrons of the first organic compound having an unshared electron pair is an odd number, a composite material of the first metal that belongs to an even-numbered group in the periodic table and the first organic compound can be used for the layer 105. For example, iron (Fe), which is a metal belonging to Group 8, is an element belonging to an even-numbered group in the periodic table.

[Electride]

For example, a substance obtained by adding electrons at high concentration to an oxide where calcium and aluminum are mixed, or the like can be used as the material having an electron-injection property.

Note that this embodiment can be combined with any of the other embodiments described in this specification as appropriate.

Embodiment 5

In this embodiment, a structure of a display device of one embodiment of the present invention will be described with reference to FIG. 5.

Figure 5A:
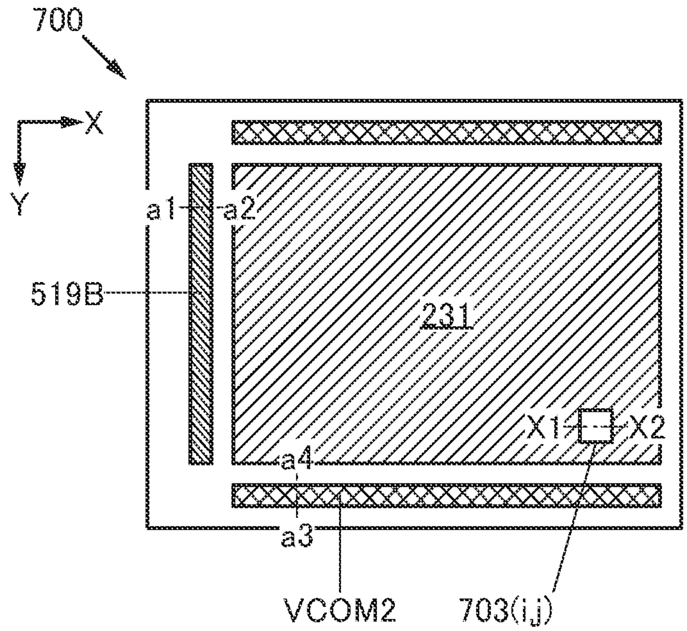
FIG. 5A and FIG. 5B are diagrams illustrating a structure of a display device according to an embodiment.
Figure 5B:
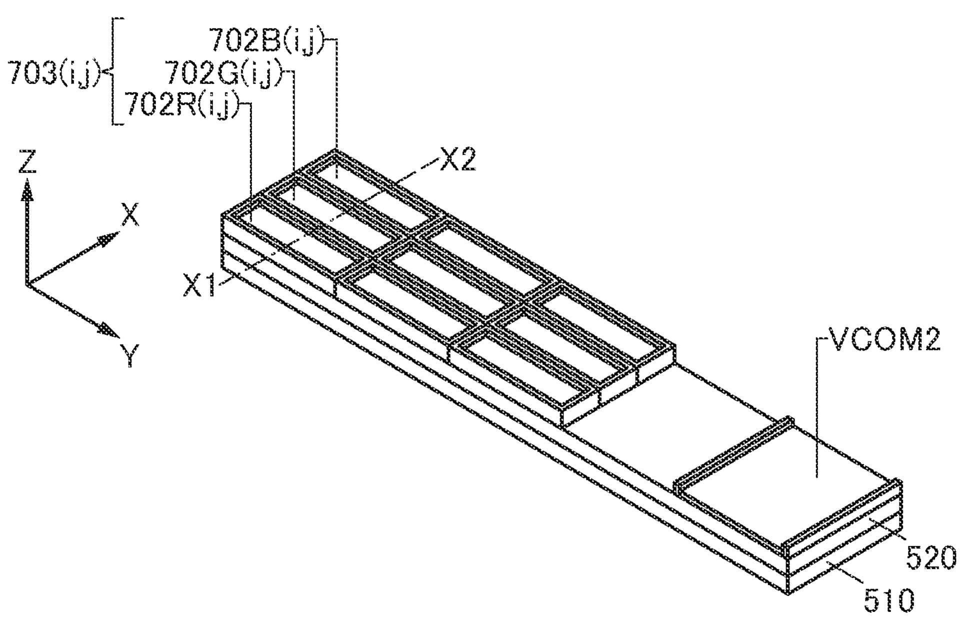

FIG. 5A is a top view illustrating the structure of the display device of one embodiment of the present invention, and FIG. 5B is a perspective view illustrating part of FIG. 5A.

Structure Example 5 of Display Device

Figure 6A:
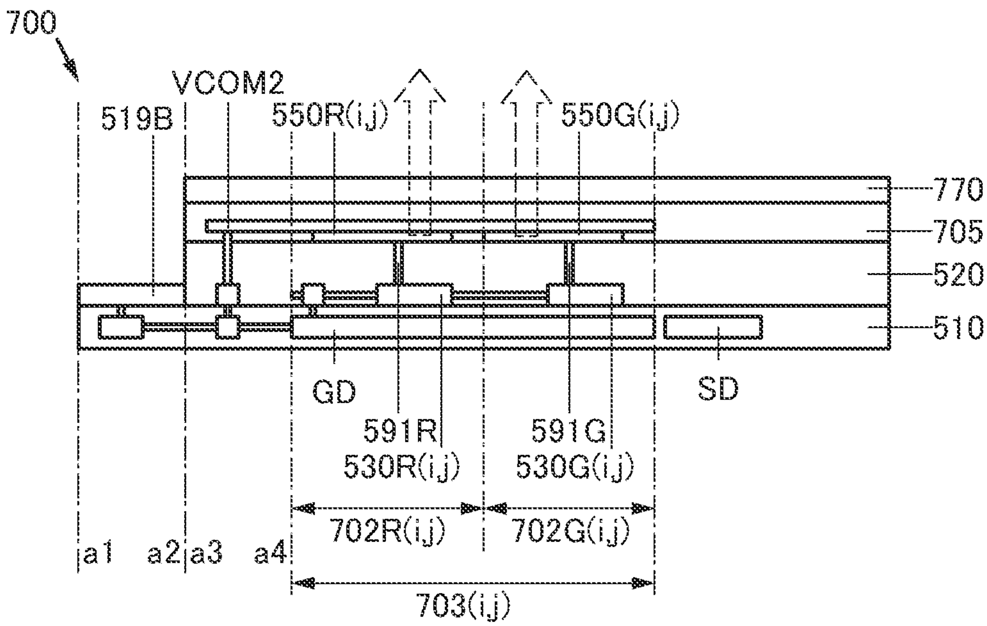
FIG. 6A and FIG. 6B are cross-sectional views illustrating a structure of a display device according to an embodiment.

The display device 700 described in this embodiment includes a region 231, a functional layer 520, and a functional layer 510 (see FIG. 5A, FIG. 5B, and FIG. 6A).

Structure Example of Region 231

The region 231 includes a pixel set 703(*i,j*) (see FIG. 5A). The region 231 has a function of displaying image information.

For example, the region 231 includes 500 or more pixel sets per inch. Furthermore, the region 231 includes 1000 or more groups of pixel sets per inch, preferably 5000 or more groups of pixel sets per inch, further preferably 10000 or more groups of pixel sets per inch. Thus, this can reduce a screen-door effect in the case where the display panel is used for a goggle-type display device, for example.

The region 231 includes a plurality of pixels. For example, the region 231 includes 7600 or more pixels in the row direction and 4300 or more pixels in the column direction. Specifically, 7680 pixels are provided in the row direction and 4320 pixels are provided in the column direction. Thus, a high-resolution image can be displayed.

<<Structure Example of Pixel Set 703(*i,j*)>>

The pixel set 703(*i,j*) includes a pixel 702R(i,j) and a pixel 702G(i,j) (see FIG. 5B). Furthermore, the pixel set 703(*i,j*) includes a pixel 702B(i,j).

For example, a plurality of pixels capable of displaying colors with different hues can be used. Note that the plurality of pixels can be referred to as subpixels. A set of subpixels can be referred to as a pixel.

This enables additive mixture or subtractive mixture of colors displayed by the plurality of pixels. It is possible to display a color of a hue that an individual pixel cannot display.

Specifically, the pixel 702B(i,j) displaying blue, the pixel 702G(i,j) displaying green, and the pixel 702R(i,j) displaying red can be used in the pixel 703(*i,j*). The pixel 702B(i,j), the pixel 702G(i,j), and the pixel 702R(i,j) can each be referred to as a subpixel.

A pixel displaying white or the like can be used in addition to the above set in the pixel 703(*i,j*), for example. A pixel displaying cyan, a pixel displaying magenta, and a pixel displaying yellow can be used in the pixel 703(*i,j*).

A pixel emitting infrared rays can be used in addition to the above set in the pixel 703(*i,j*), for example. Specifically, a pixel that emits light including light with a wavelength greater than or equal to 650 nm and less than or equal to 1000 nm can be used in the pixel 703(*i,j*).

<<Structure Example of Pixel 702R(i,j)>>

The pixel 702R(i,j) includes the light-emitting device 550R(i,j) and a pixel circuit 530R(i,j) (see FIG. 6A). The light-emitting device 550R(i,j) is electrically connected to the pixel circuit 530R(i,j). For example, the light-emitting device 550R(i,j) is electrically connected to the pixel circuit 530R(i,j) through an opening portion 591R.

Note that the pixel circuit 530R(i,j) is supplied with a first image signal.

<<Structure Example of Pixel 702G(i,j)>>

The pixel 702G(i,j) includes the light-emitting device 550G(i,j) and a pixel circuit 530G(i,j). The light-emitting device 550G(i,j) is electrically connected to the pixel circuit 530G(i,j). For example, the light-emitting device 550G(i,j) is electrically connected to the pixel circuit 530G(i,j) through an opening portion 591G.

Furthermore, the pixel circuit 530G(i,j) is supplied with a second image signal.

Structure Example of Functional Layer 520

The functional layer 520 includes the pixel circuit 530G(i,j) and the pixel circuit 530R(i,j).

The functional layer 520 is interposed between the light-emitting device 550R(i,j) and the functional layer 510. Furthermore, the functional layer 520 is interposed between the light-emitting device 550G(i,j) and the functional layer 510.

Structure Example of Functional Layer 510

The functional layer 510 includes a driver circuit SD. Furthermore, the functional layer 510 includes a driver circuit GD. For example, a single crystal silicon substrate can be used for the functional layer 510.

<<Structure Example of Driver Circuit SD>>

The driver circuit SD generates the first image signal and the second image signal.

Thus, the driver circuit SD can be positioned so as to overlap with the functional layer 520 that includes the pixel circuit 530R(i,j) and the pixel circuit 530G(i,j). An outer area can be smaller than the region 231 displaying image information. Furthermore, a distance between the pixel circuit 530R(i,j) and the driver circuit SD can be shortened. In addition, the first image signal can be transmitted without delay. As a result, a novel display device that is highly convenient, useful, or reliable can be provided.

The driver circuit SD has a function of supplying an image signal and a control signal, and the control signal includes a first level and a second level. For example, the driver circuit SD is electrically connected to a conductive film S1*g*(*j*) to supply the image signal, and is electrically connected to a conductive film S2*g*(*j*) to supply the control signal (see FIG. 7).

<<Structure Example of Driver Circuit GD>>

The driver circuit GD has a function of supplying a first selection signal and a second selection signal. For example, the driver circuit GD is electrically connected to a conductive film G1(*i*) to supply the first selection signal, and is electrically connected to a conductive film G2(*i*) to supply the second selection signal.

Structure Example 1 of Pixel Circuit 530G(i,j)

The pixel circuit 530G(i,j) is supplied with the first selection signal, and the pixel circuit 530G(i,j) obtains an image signal on the basis of the first selection signal. For example, the first selection signal can be supplied using the conductive film G1(*i*) (see FIG. 7). The image signal can be supplied using the conductive film S1*g*(*j*). Note that the operation of supplying the first selection signal and making the pixel circuit 530G(i,j) obtain the image signal can be referred to as "writing".

Structure Example 2 of Pixel Circuit 530G(i,j)

Figure 7:
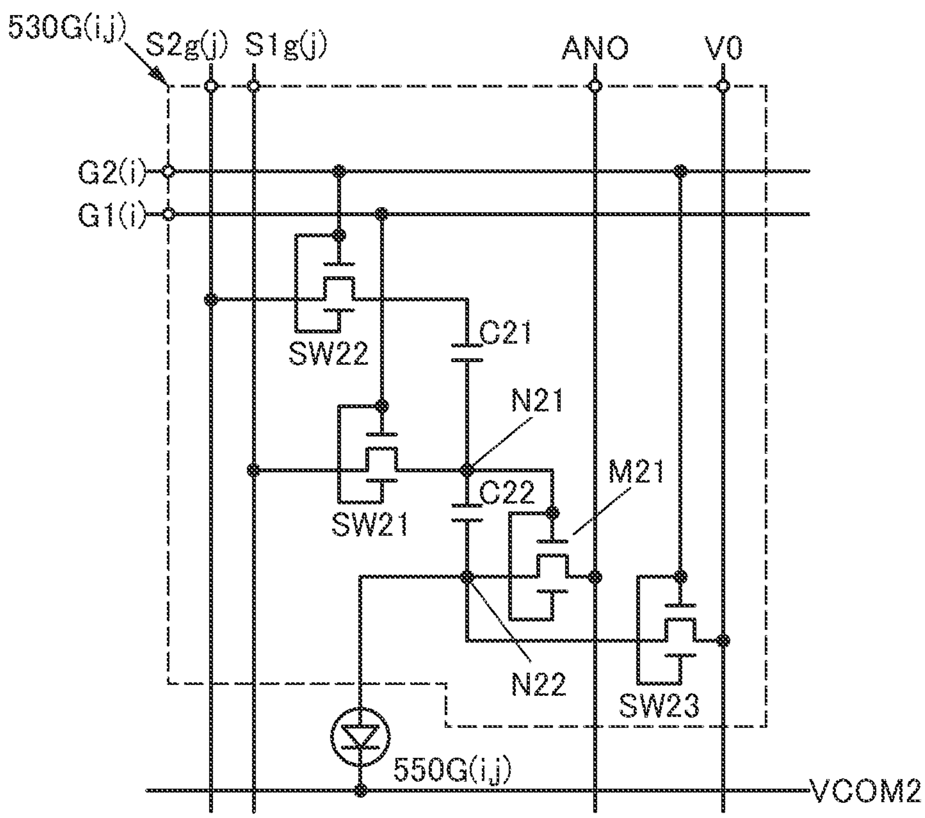
FIG. 7 is a circuit diagram illustrating a pixel of a display device according to an embodiment.

The pixel circuit 530G(i,j) includes a switch SW21, a switch SW22, a transistor M21, a capacitor C21, and a node N21 (see FIG. 7). In addition, the pixel circuit 530G(i,j) includes a node N22, a capacitor C22, and a switch SW23.

The transistor M21 includes a gate electrode electrically connected to the node N21, a first electrode electrically connected to the light-emitting device 550G(i,j), and a second electrode electrically connected to the conductive film ANO.

The switch SW21 includes a first terminal electrically connected to the node N21, a second terminal electrically connected to the conductive film S1*g*(*j*), and a gate electrode having a function of controlling the conduction state or the non-conduction state on the basis of the potential of the conductive film G1(*i*).

The switch SW22 includes a first terminal electrically connected to the conductive film S2*g*(*j*) and a gate electrode having a function of controlling the conduction state or the non-conduction state on the basis of the potential of the conductive film G2(*i*).

The capacitor C21 includes a conductive film electrically connected to the node N21 and a conductive film electrically connected to a second electrode of the switch SW22.

Thus, the image signal can be stored in the node N21. The potential of the node N21 can be changed using the switch SW22. Alternatively, the intensity of light emitted from the light-emitting device 550G(i,j) can be controlled with the potential of the node N21.

<<Structure Example of Transistor M21>>

A bottom-gate transistor, a top-gate transistor, or the like can be used in the functional layer 520. Specifically, a transistor can be used as a switch.

Figure 6B:
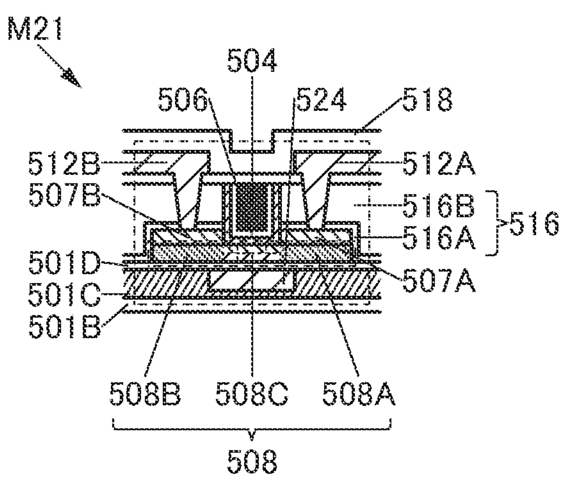

The transistor includes a semiconductor film 508, a conductive film 504, a conductive film 507A, and a conductive film 507B (see FIG. 6B). The transistor is formed over an insulating film 501C, for example.

The semiconductor film 508 includes a region 508A electrically connected to the conductive film 507A and a region 508B electrically connected to the conductive film 507B. The semiconductor film 508 includes a region 508C between the region 508A and the region 508B.

The conductive film 504 includes a region overlapping with the region 508C, and the conductive film 504 has a function of a gate electrode.

An insulating film 506 includes a region interposed between the semiconductor film 508 and the conductive film 504. The insulating film 506 has a function ofa gate insulating film.

The conductive film 507A has one of a function of a source electrode and a function of a drain electrode, and the conductive film 507B has the other of the function of the source electrode and the function of the drain electrode. The conductive film 507A is electrically connected to a conductive film 512A, and the conductive film 507B is electrically connected to a conductive film 512B.

A conductive film 524 can be used for the transistor. The conductive film 524 includes a region where the semiconductor film 508 is interposed between the conductive film 524 and the conductive film 504. The conductive film 524 has a function of a second gate electrode. An insulating film 501D is interposed between the semiconductor film 508 and the conductive film 524, and has a function of a second gate insulating film. Note that an insulating film 518 covers the transistor, and the insulating film 501C is interposed between an insulating film 501B and the insulating film 501D. An insulating film 516 includes an insulating film 516A and an insulating film 516B.

Note that the semiconductor film used in the transistor of the driver circuit can be formed in the step of forming the semiconductor film used in the transistor of the pixel circuit. A semiconductor film having the same composition as the semiconductor film used in the transistor of the pixel circuit can be used in the driver circuit, for example.

Structure Example 1 of Semiconductor Film 508

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a functional panel having less display unevenness than a functional panel using polysilicon for the semiconductor film 508, for example, can be provided. The size of the functional panel can be easily increased.

[Polysilicon]

For example, polysilicon can be used for the semiconductor film 508. Specifically, low temperature polysilicon (LTPS) can be used for the semiconductor film 508. In this case, the field-effect mobility of the transistor can be higher than that of a transistor using hydrogenated amorphous silicon for the semiconductor film 508, for example. The driving capability can be higher than that of a transistor using hydrogenated amorphous silicon for the semiconductor film 508, for example. The aperture ratio of the pixel can be higher than that in the case of using a transistor that uses hydrogenated amorphous silicon for the semiconductor film 508, for example.

The reliability of the transistor can be higher than that of a transistor using hydrogenated amorphous silicon for the semiconductor film 508, for example.

The temperature required for fabrication of the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over the same substrate where the pixel circuit is formed. The number of components included in an electronic device can be reduced.

[Single Crystal Silicon]

For example, single crystal silicon can be used for the semiconductor film 508. In this case, a functional panel with higher resolution than a functional panel using hydrogenated amorphous silicon for the semiconductor film 508, for example, can be provided. A functional panel having less display unevenness than a functional panel using polysilicon for the semiconductor film 508, for example, can be provided. Smart glasses or ahead-mounted display can be provided, for example.

Structure Example 2 of Semiconductor Film 508

For example, a metal oxide can be used for the semiconductor film 508. In this case, for example, the pixel circuit can hold an image signal for a longer time than a pixel circuit utilizing a transistor using silicon for a semiconductor film. Specifically, a selection signal can be supplied at a frequency lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

A transistor using an oxide semiconductor can be used, for example. Specifically, an oxide semiconductor containing indium, an oxide semiconductor containing indium, gallium, and zinc, or an oxide semiconductor containing indium, zinc, and tin can be used for the semiconductor film.

A transistor having a lower leakage current in an off state than a transistor using silicon for a semiconductor film can be used, for example. Specifically, a transistor using an oxide semiconductor for a semiconductor film can be used as a switch or the like. In that case, a potential of a floating node can be held for a longer time than in a circuit in which a transistor using silicon is used as a switch.

A transistor using a metal oxide in a semiconductor film (also referred to as an OS transistor) has much higher field-effect mobility than a transistor using amorphous silicon. In addition, the OS transistor has an extremely low leakage current between a source and a drain in an off state (hereinafter, also referred to as off-state current), and charge accumulated in a capacitor that is connected in series to the transistor can be retained for a long period. Furthermore, power consumption of the display device can be reduced with the use of an OS transistor.

The off-state current value per micrometer of channel width of an OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than the off-state current of a Si transistor by approximately ten orders of magnitude.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher withstand voltage between the source and the drain than a Si transistor, a high voltage can be applied between the source and the drain of the OS transistor. Accordingly, when an OS transistor is used as the driving transistor included in the pixel circuit, the amount of current flowing through the light-emitting device can be increased, so that the emission luminance of the light-emitting device can be increased.

When transistors operate in a saturation region, a change in source-drain current relative to a change in gate-source voltage can be smaller in an OS transistor than in a Si transistor. Accordingly, when an OS transistor is used as the driving transistor included in the pixel circuit, the amount of current flowing between the source and the drain can be set minutely by a change in gate-source voltage; hence, the amount of current flowing through the light-emitting device can be controlled. Accordingly, the number of gray levels in the pixel circuit can be increased.

Regarding saturation characteristics of current flowing when the transistor operates in a saturation region, the OS transistor can make current (saturation current) flow more stably than the Si transistor even in the case where the source-drain voltage gradually increases. Thus, by using an OS transistor as the driving transistor, stable current can be fed through a light-emitting device that contains an EL material even in the case where the current-voltage characteristics of the light-emitting device vary, for example. In other words, when the OS transistor operates in the saturation region, the source-drain current hardly changes with an increase in the source-drain voltage; hence, the emission luminance of the light-emitting device can be stable.

As described above, with use of an OS transistor as a driving transistor included in the pixel circuit, it is possible to achieve "inhibition of black floating", "increase in emission luminance", "increase in gray level", "inhibition of variation in light-emitting devices", and the like.

Structure Example 3 of Semiconductor Film 508

For example, a compound semiconductor can be used for the semiconductor of the transistor. Specifically, a semiconductor containing gallium arsenide can be used.

For example, an organic semiconductor can be used for the semiconductor of the transistor. Specifically, an organic semiconductor containing any of polyacenes or graphene can be used for the semiconductor film.

Structure Example 3 of Pixel Circuit 530G(i,j)

For example, when both an LTPS transistor and an OS transistor are used, the display device can have low power consumption and high drive capability. Note that a structure in which the LTPS transistor and the OS transistor are combined is referred to as LTPO in some cases. As a favorable example, it is preferable to use an OS transistor as a transistor or the like functioning as a switch for controlling electrical continuity between wirings and an LTPS transistor as a transistor or the like for controlling current.

For example, one of the transistors included in the pixel circuit functions as a transistor for controlling current flowing through the light-emitting device and can be referred to as a driving transistor. One of a source and a drain of the driving transistor is electrically connected to the pixel electrode of the light-emitting device. The LTPS transistor is preferably used as the driving transistor. Thus, current flowing through the light-emitting device in the pixel circuit can be increased.

Meanwhile, another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). The OS transistor is preferably used as the selection transistor. Thus, the gray level of the pixel can be maintained even when the frame frequency is extremely reduced (e.g., 1 fps or lower), whereby power consumption can be reduced by stopping the driver in displaying a still image.

Structure Example 4 of Pixel Circuit 530G(i,j)

The structures of the transistors used in the display panel may be selected as appropriate depending on the size of the screen of the display panel. For example, in the case where single crystal Si transistors are used as transistors in the display panel, the single crystal Si transistors can be used for a screen having a diagonal size greater than or equal to 0.1 inches and less than or equal to 3 inches. In addition, in the case where LTPS transistors are used as transistors in the display panel, the LTPS transistors can be used for a screen having a diagonal size greater than or equal to 0.1 inches and less than or equal to 30 inches, preferably greater than or equal to 1 inch and less than or equal to 30 inches. In addition, in the case where LTPO transistors are used as transistors in the display panel, the LTPO transistors can be used for a screen having a diagonal size greater than or equal to 0.1 inches and less than or equal to 50 inches, preferably greater than or equal to 1 inch and less than or equal to 50 inches. In addition, in the case where OS transistors are used as transistors in the display panel, the OS transistors can be used for a screen having a diagonal size greater than or equal to 0.1 inches and less than or equal to 200 inches, preferably greater than or equal to 50 inches and less than or equal to 100 inches.

With single crystal Si transistors, a size increase is extremely difficult because of the size of a single crystal Si substrate. Furthermore, since a laser crystallization apparatus is used in the manufacturing process, LTPS transistors are unlikely to respond to a size increase (typically to a screen diagonal size greater than 30 inches). By contrast, since the manufacturing process does not necessarily require a laser crystallization apparatus or the like or can be performed at a relatively low process temperature (typically, lower than or equal to 450° C.), OS transistors are applicable to a display panel with a relatively large area (typically, a diagonal size greater than or equal to 50 inches and less than or equal to 100 inches). In addition, LTPO is applicable to a display panel with a size midway between the case of using LTPS transistors and the case of using OS transistors (typically, a diagonal size greater than or equal to 1 inch and less than or equal to 50 inches).

<<Structure Example of Light-Emitting Device 550G(i,j)>>

The light-emitting device 550G(i,j) is electrically connected to the pixel circuit 530G(i,j) (see FIG. 7). Note that the light-emitting device 550G(i,j) has a function of operating on the basis of the potential of the node N21.

The light-emitting device 550G(i,j) includes the electrode 551G(i,j) and the electrode 552G(i,j). Note that the electrode 551G(i,j) is electrically connected to the pixel circuit 530G (i,j), and the electrode 552G(i,j) is electrically connected to a conductive film VCOM2.

For example, an organic electroluminescence element, an inorganic electroluminescence element, a light-emitting diode, a QDLED (Quantum Dot LED), or the like can be used as the light-emitting device 550G(i,j).

Structure Example 6 of Display Device

The display device 700 includes a terminal 519B and the conductive film VCOM2 (see FIG. 5A).

The terminal 519B is electrically connected to the functional layer 510. The display device can receive and transmit a signal with the outside of the display device through the terminal 519B.

Furthermore, the display device 700 includes an insulating film 705 and a base 770 (see FIG. 6A).

The insulating film 705 is interposed between the functional layer 520 and the base 770, and the insulating film 705 has a function of bonding the functional layer 520 and the base 770 together.

Note that the light-emitting device 550R(i,j) and the light-emitting device 550G(i,j) are interposed between the base 770 and the functional layer 520. The display device displays information through the base 770 (see FIG. 6A). In other words, the light-emitting device 550G(i,j) emits light toward the direction in which the functional layer 520 is not placed. The light-emitting device 550G(i,j) can be referred to as a top-emission light-emitting device.

Note that this embodiment can be combined with any of the other embodiments described in this specification as appropriate.

Embodiment 6

In this embodiment, a display device and a display system of one embodiment of the present invention will be described with reference to FIG. 8 to FIG. 13.

Figure 8:
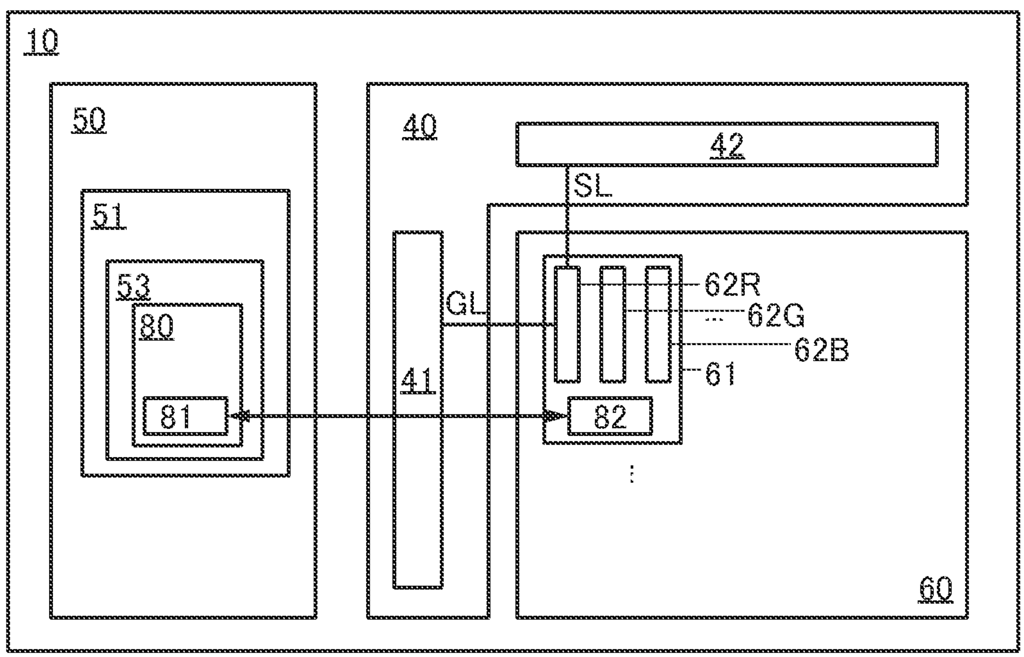
FIG. 8 is a diagram illustrating a structure of a display device according to an embodiment.

FIG. 8 is a block diagram illustrating a structure of a display device of one embodiment of the present invention.

Figure 9:
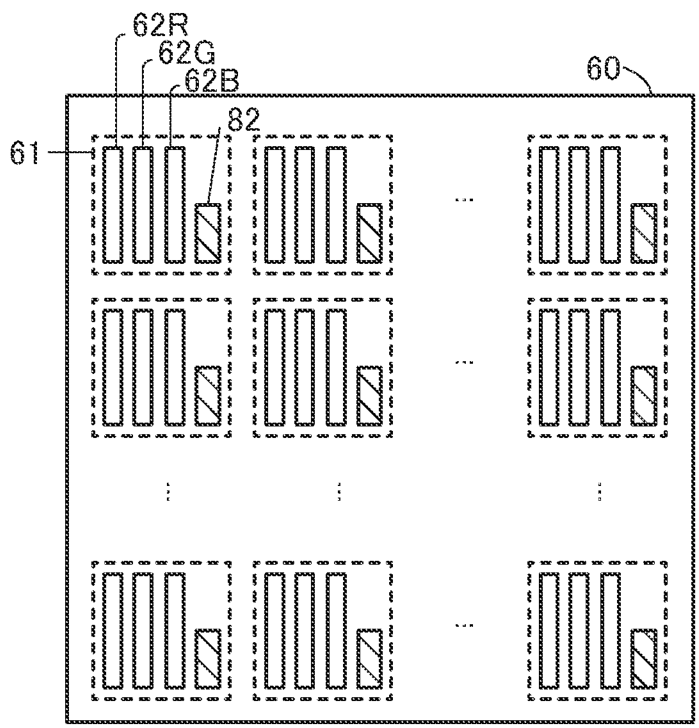
FIG. 9 is a diagram illustrating a structure of a display device according to an embodiment.

FIG. 9 is a block diagram illustrating a structure of a display portion illustrated in FIG. 8.

Figure 10:
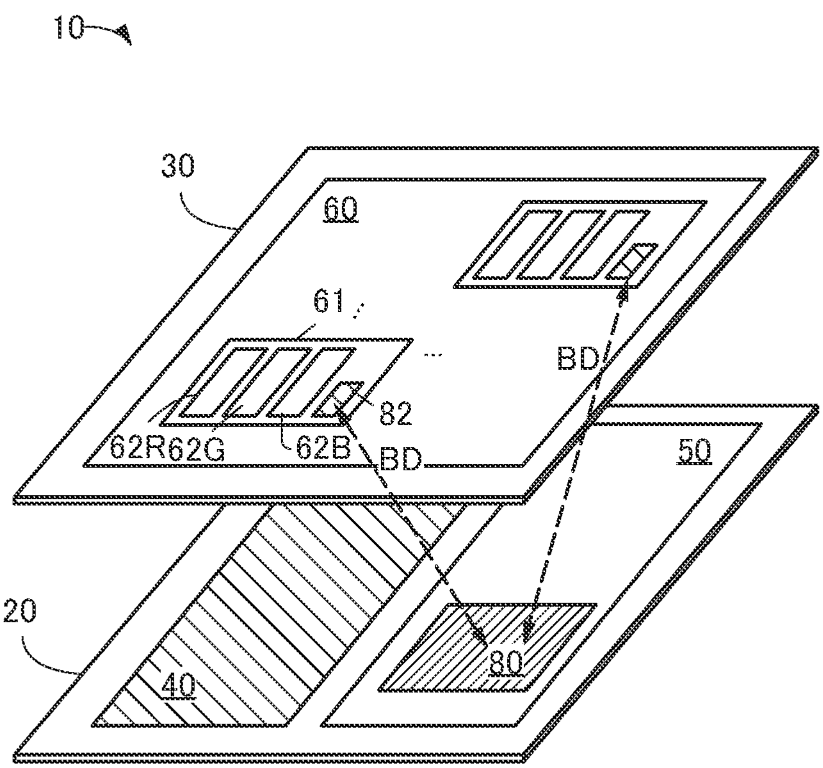
FIG. 10 is a diagram illustrating a structure of a display device according to an embodiment.

FIG. 10 is a block diagram illustrating a structure of a display device of one embodiment of the present invention.

FIG. 11 shows circuit diagrams illustrating the structure of a pixel illustrated in FIG. 10.

Figure 12:
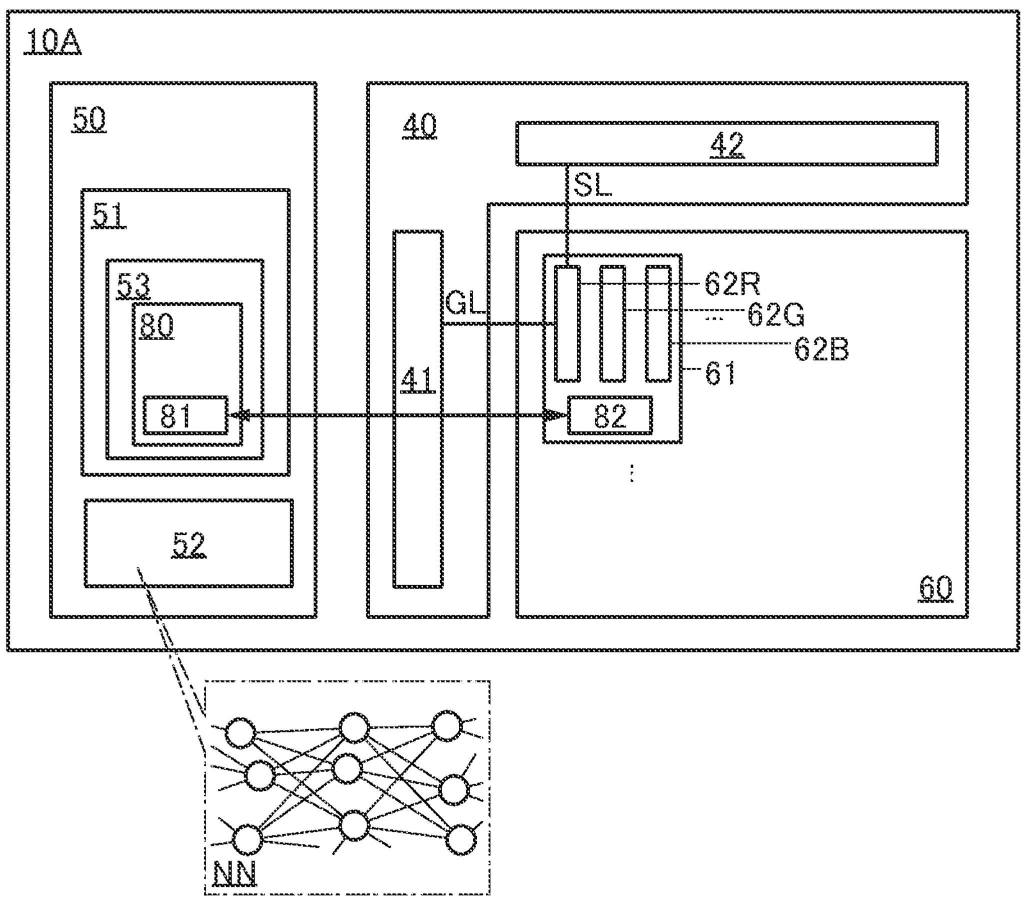
FIG. 12 is a diagram illustrating a structure of a display device according to an embodiment.

FIG. 12 is a block diagram illustrating a structure of a display device of one embodiment of the present invention.

Figure 13A:
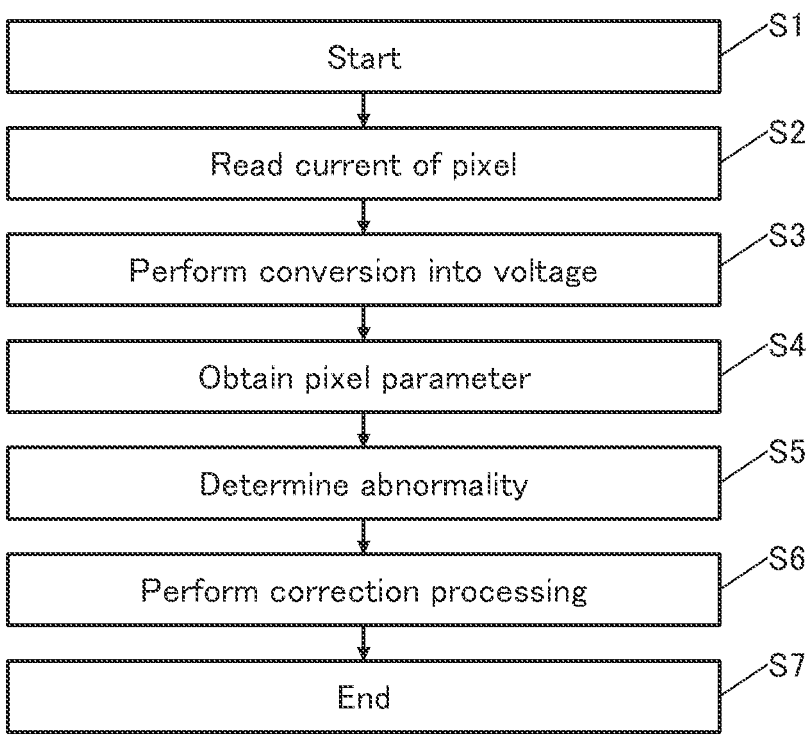
FIG. 13A and FIG. 13B are diagrams illustrating a structure of a display device according to an embodiment.
Figure 13B:
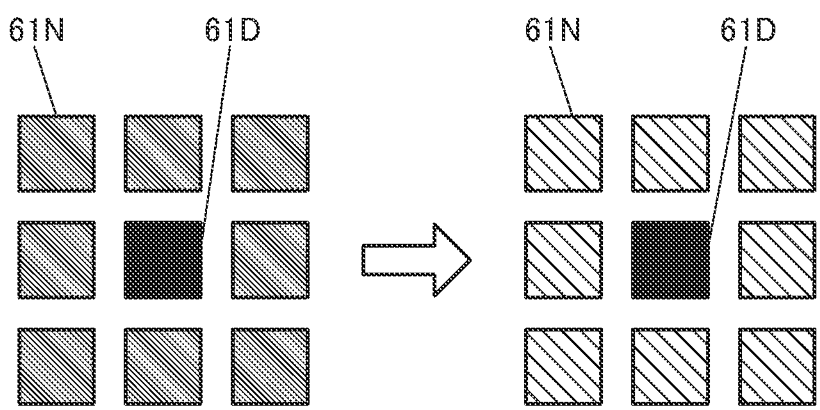

FIG. 13A is a flowchart for a correction method, and FIG. 13B is a schematic diagram explaining the correction method.

Structure Example 7 of Display Device

Next, FIG. 8 is a block diagram illustrating components included in a display device 10. The display device includes a driver circuit 40, a functional circuit 50, and a display portion 60.

Structure Example 1 of Driver Circuit 40

The driver circuit 40 includes agate driver 41 and a source driver 42, for example. The gate driver 41 has a function of driving a plurality of gate lines GL for outputting signals to pixel circuits 62R, 62G, and 62B. The source driver 42 has a function of driving a plurality of source lines SL for outputting signals to the pixel circuits 62R, 62G, and 62B. The driver circuit 40 supplies voltage for performing display with the pixel circuits 62R, 62G, and 62B to the pixel circuits 62R, 62G, and 62B through a plurality of wirings.

Structure Example 1 of Functional Circuit 50

The functional circuit 50 includes a CPU 51, and the CPU 51 can be used for arithmetic processing of data. The CPU 51 includes a CPU core 53. The CPU core 53 includes a flip-flop 80 for temporarily retaining data used for arithmetic processing. The flip-flop 80 includes a plurality of scan flip-flops 81, and each of the scan flip-flops 81 is electrically connected to a backup circuit 82 provided in the display portion 60. The flip-flop 80 inputs and outputs data of the scan flip-flops (backup data) to/from the backup circuit 82.

<<Display Portion 60>>

FIG. 9 and FIG. 8 illustrate a structure example of the layout of the backup circuit 82 and the pixel circuits 62R, 62G, and 62B functioning as subpixels in the display portion 60.

FIG. 9 illustrates a structure in which a plurality of pixels 61 are arranged in a matrix in the display portion 60. The pixels 61 each include the backup circuit 82 in addition to the pixel circuits 62R, 62G, and 62B. As described above, the backup circuit 82 and the pixel circuits 62R, 62G, and 62B can be formed using OS transistors and thus can be placed in the same pixel.

The display portion 60 includes the plurality of pixels 61 each including the pixel circuits 62R, 62G, and 62B and the backup circuit 82. The backup circuit 82 is not necessarily placed in each of the pixels 61 that are repeating units, as described with reference to FIG. 9. The backup circuit 82 can be placed freely in accordance with the shape of the display portion 60, the shapes of the pixel circuits 62R, 62G, and 62B, and the like.

Structure Example 8 of Display Device

FIG. 10 is a block diagram schematically illustrating a structure example of the display device 10 that is a display device of one embodiment of the present invention. The display device 10 includes a layer 20 and a layer 30, and the layer 30 can be stacked above the layer 20, for example. An interlayer insulator or a conductor for electrical connection between different layers can be provided between the layer 20 and the layer 30.

<<Layer 20>>

A transistor provided in the layer 20 can be a transistor containing silicon in a channel formation region (also referred to as a Si transistor), such as a transistor containing single crystal silicon in a channel formation region, for example. In particular, the use of a transistor containing single crystal silicon in a channel formation region as the transistor provided in the layer 20 can increase the on-state current of the transistor. This is preferable because circuits included in the layer 20 can be driven at high speed. The Si transistor can be formed by microfabrication to have a channel length of 3 nm to 10 nm, for example; thus, the display device 10 can be provided with a CPU, an accelerator such as a GPU, an application processor, or the like.

The driver circuit 40 and the functional circuit 50 are provided in the layer 20. The Si transistor of the layer 20 can have a high on-state current. Thus, each circuit can be driven at high speed.

Structure Example 2 of Driver Circuit 40

The driver circuit 40 includes a gate line driver circuit, a source line driver circuit, and the like for driving the pixel circuits 62R, 62G, and 62B. The driver circuit 40 includes, for example, the gate line driver circuit and the source line driver circuit for driving the pixels 61 in the display portion 60. With a structure in which the driver circuit 40 is provided not in the layer 30 where the display is provided but in the layer 20, an area occupied by the display portion in the layer 30 can be large. In addition, the driver circuit 40 may include an LVDS (Low Voltage Differential Signaling) circuit, a D/A (Digital to Analog) converter circuit, or the like functioning as an interface for receiving data such as image data from the outside of the display device 10. The Si transistor of the layer 20 can have a high on-state current. The channel length, the channel width, or the like of the Si transistor may be varied in accordance with the operation speed of each circuit.

<<Layer 30>>

As a transistor provided in the layer 30, an OS transistor can be used, for example. In particular, a transistor including an oxide containing at least one of indium, an element M (the element M is aluminum, gallium, yttrium, or tin), and zinc in a channel formation region is preferably used as the OS transistor. Such an OS transistor has a characteristic of an extremely low off-state current. Thus, it is particularly preferable to use the OS transistor as a transistor provided in a pixel circuit included in a display portion, in which case analog data written to the pixel circuit can be retained for a long period.

The display portion 60 including the plurality of pixels 61 is provided in the layer 30. The pixel circuits 62R, 62G, and 62B that control emission of red light, green light, and blue light are provided in the pixels 61. The pixel circuits 62R, 62G, and 62B function as the subpixels of the pixels 61. Since the pixel circuits 62R, 62G, and 62B include the OS transistors, analog data written to the pixel circuits can be retained for a long period. The backup circuit 82 is provided in each of the pixels 61 included in the layer 30. Note that the backup circuit is sometimes referred to as a storage circuit or a memory circuit. The backup circuit inputs and outputs data of the scan flip-flops (backup data BD) to/from the flip-flop 80.

Structure Example 1 of Pixel Circuit

Figure 11A:
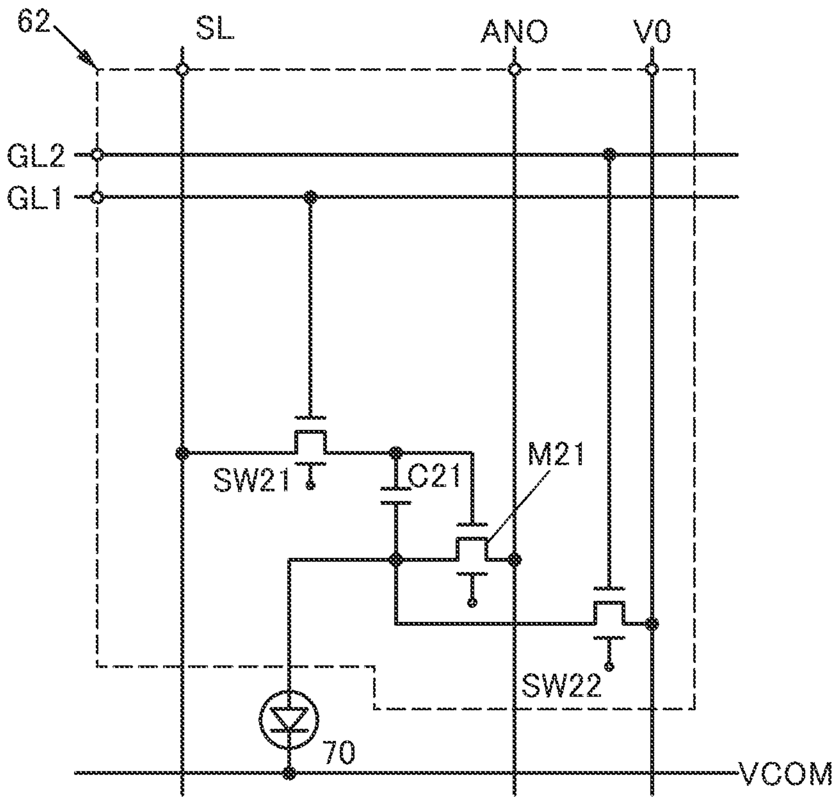
FIG. 11A and FIG. 11B are diagrams illustrating a structure of a display device according to an embodiment.
Figure 11B:
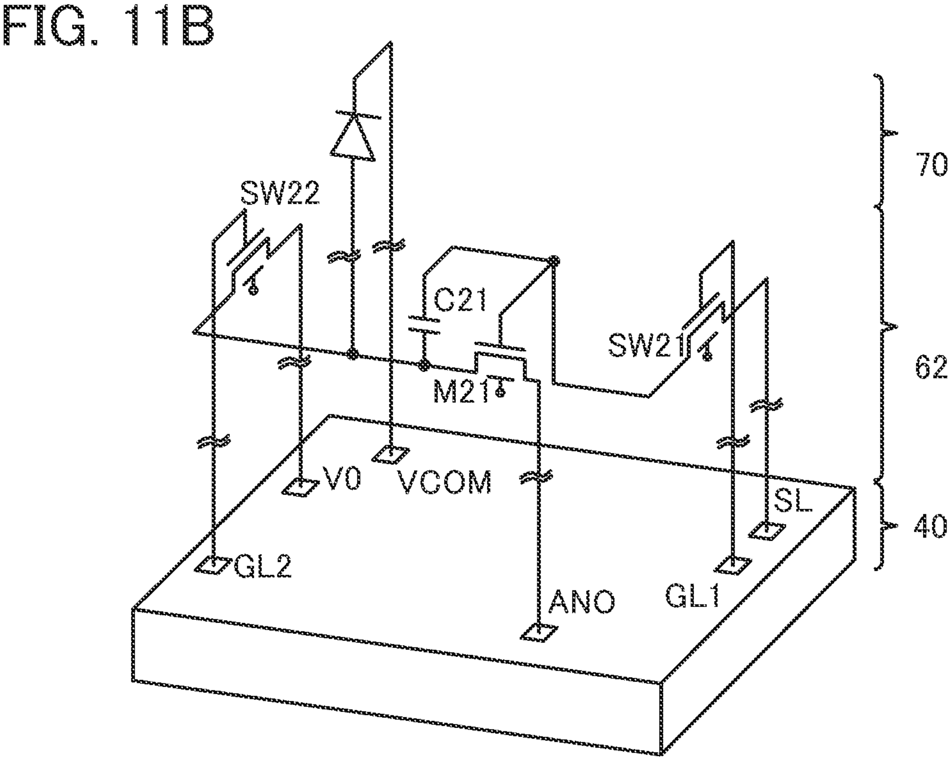

FIG. 11A and FIG. 11B illustrate a structure example of a pixel circuit 62 that can be used as the pixel circuits 62R, 62G, and 62B and a light-emitting element 70 connected to the pixel circuit 62. FIG. 11A is a diagram illustrating connection between elements, and FIG. 11B is a diagram schematically illustrating the vertical positional relationship of the driver circuit 40, the pixel circuit 62, and the light-emitting element 70.

In this specification and the like, the term "element" can be replaced with the term "device" in some cases. For example, a display element, a light-emitting element, and a liquid crystal element can be replaced with a display device, a light-emitting device, and a liquid crystal device, respectively.

The pixel circuit 62, which is illustrated as an example in FIG. 11A and FIG. 11B, includes the switch SW21, the switch SW22, the transistor M21, and the capacitor C21. The switch SW21, the switch SW22, and the transistor M21 can be formed of OS transistors. Each of the OS transistors of the switch SW21, the switch SW22, and the transistor M21 preferably includes a back gate electrode, in which case the back gate electrode can be supplied with the same signal as the gate electrode or the back gate electrode can be supplied with signals different from those supplied to the gate electrode can be used.

The transistor M21 includes a gate electrode electrically connected to the switch SW21, a first electrode electrically connected to the light-emitting element 70, and a second electrode electrically connected to the conductive film ANO. The conductive film ANO is a wiring for supplying a potential for supplying current to the light-emitting element 70.

The switch SW21 includes a first terminal electrically connected to the gate electrode of the transistor M21, a second terminal electrically connected to a source line SL, and a gate electrode having a function of controlling the on state or the off state on the basis of the potential of a gate line GL1.

The switch SW22 includes a first terminal electrically connected to a wiring V0, a second terminal electrically connected to the light-emitting element 70, and a gate electrode having a function of controlling the on state or the off state on the basis of the potential of a gate line GL2. The wiring V0 is a wiring for supplying a reference potential and outputting current flowing in the pixel circuit 62 to the driver circuit 40 or the functional circuit 50.

The capacitor C21 includes a conductive film electrically connected to the gate electrode of the transistor M21 and a conductive film electrically connected to a second electrode of the switch SW22.

The light-emitting element 70 includes a first electrode electrically connected to the first electrode of the transistor M21 and a second electrode electrically connected to a conductive film VCOM. The conductive film VCOM is a wiring for supplying a potential for supplying current to the light-emitting element 70.

Accordingly, the intensity of light emitted by the light-emitting element 70 can be controlled in accordance with an image signal supplied to the gate electrode of the transistor M21. Furthermore, the amount of current flowing to the light-emitting element 70 can be increased by the reference potential of the wiring V0 that is supplied through the switch SW22. Moreover, it is possible to estimate the amount of current flowing to the light-emitting element by monitoring the amount of current flowing through the wiring V0 with an external circuit. Thus, a defect of a pixel or the like can be detected.

Structure Example 2 of Pixel Circuit

Note that in the structure illustrated as an example in FIG. 11B, the wirings electrically connecting the pixel circuit 62 and the driver circuit 40 can be shortened, so that wiring resistance of the wirings can be reduced. Thus, data can be written at high speed, which enables high-speed driving of the display device 10. Accordingly, even when the number of pixels 61 included in the display device 10 is large, a sufficient frame period can be ensured, thereby increasing the pixel density of the display device 10. In addition, the increased pixel density of the display device 10 can increase the resolution of an image displayed by the display device 10. For example, the pixel density of the display device 10 can be higher than or equal to 1000 ppi, higher than or equal to 5000 ppi, or higher than or equal to 7000 ppi. Thus, the display device 10 can be, for example, a display device for AR or VR and can be suitably used in an electronic device with a short distance between the display portion and the user, such as an HMD.

Although the gate line GL1, the gate line GL2, the conductive film VCOM, the wiring V0, the conductive film ANO, and the source line SL are supplied with signals and voltage from the driver circuit 40 below the pixel circuit 62 through the wirings in FIG. 11B, one embodiment of the present invention is not limited thereto. For example, wirings for supplying signals and voltage of the driver circuit 40 may be led to an outer region of the display portion 60 and electrically connected to the pixel circuits 62 arranged in a matrix in the layer 30. In this case, a structure in which the gate driver 41 included in the driver circuit 40 is provided in the layer 30 is effective. That is, a structure in which OS transistors are used as transistors of the gate driver 41 is effective. A structure in which part of the function of the source driver 42 included in the driver circuit 40 is provided in the layer 30 is effective. For example, a structure in which a demultiplexer distributing signals output from the source driver 42 to source lines is provided in the layer 30 is effective. A structure in which OS transistors are used as transistors of the demultiplexer is effective.

<<Backup Circuit 82>>

As the backup circuit 82, for example, a memory including OS transistors is suitable. The backup circuit formed using OS transistors has advantages of, for example, inhibiting a decrease in voltage corresponding to data to be backed up and consuming almost no power for data retention, because the OS transistors have an extremely low off-state current. The backup circuit 82 including the OS transistors can be provided in the display portion 60 in which the plurality of pixels 61 are placed. FIG. 10 illustrates a state in which the backup circuit 82 is provided in each of the pixels 61.

The backup circuit 82 formed using the OS transistors can be stacked over the layer 20 including the Si transistor. The backup circuits 82 may be arranged in a matrix like the subpixels in the pixels 61; alternatively, one backup circuit 82 may be provided for every plurality of pixels. That is, the backup circuits 82 can be arranged in the layer 30 without being limited by the arrangement of the pixels 61. Therefore, the backup circuits 82 can be arranged without any increase in the circuit area and the degree of flexibility in the layout of the display portion or the circuits is enhanced, so that memory capacity of the backup circuits 82 required for arithmetic processing can be increased.

Structure Example 9 of Display Device

FIG. 12 illustrates a modification example of the components included in the display device 10 described above.

A block diagram of a display device 10A illustrated in FIG. 12 corresponds to a structure in which an accelerator 52 is added to the functional circuit 50 in the display device 10 in FIG. 8.

The accelerator 52 functions as a dedicated arithmetic circuit to product-sum operation processing of an artificial neural network NN. In the arithmetic operation using the accelerator 52, processing for correcting the outline of an image by up-conversion of display data or the like can be performed, for example. During the arithmetic processing with the accelerator 52, it is possible to reduce the power consumption by power gating control on the CPU 51.

Structure Example of Display System

In the display device of one embodiment of the present invention, the pixel circuit and the functional circuit can be stacked; thus, a defective pixel can be detected using the functional circuit provided below the screen circuit. Information on the defective pixel can be used to correct a display defect due to the defective pixel, leading to normal display.

Part of a correction method described below as an example may be performed by a circuit provided outside the display device. Part of the correction method may be performed by the functional circuit 50 of the display device 10.

A more specific example of the correction method will be described below. FIG. 13A is a flowchart for the correction method described below.

First, the correction operation starts in Step S1 "Start".

Next, in Step S2 "Read current of pixel", current of the pixels is read. For example, each of the pixels can be driven to output current to a monitor line electrically connected to the pixel.

Then, in Step S3 "Perform conversion into voltage", the read current is converted into voltage. In the case of using a digital signal in a subsequent process, conversion into digital data can be performed in Step S3. For example, analog data can be converted into digital data using an analog-digital converter circuit (ADC).

Next, in Step S4 "Obtain pixel parameter", pixel parameters of the pixels are obtained on the basis of the acquired data. Examples of the pixel parameters include the threshold voltage and field-effect mobility of a driving transistor, the threshold voltage of a light-emitting element, and a current value at a certain voltage.

Subsequently, in Step S5 "Determine abnormality", each of the pixels is determined to be abnormal or not on the basis of the pixel parameter. For example, a pixel is determined to be abnormal when its pixel parameter has a value exceeding (or lower than) a predetermined threshold value.

An abnormal pixel is recognized as a dark spot defect when luminance is significantly lower than that corresponding to an input data potential, or recognized as a bright spot defect when luminance is significantly higher than that corresponding to an input data potential, for example.

The address of the abnormal pixel and the kind of the defect can be specified and acquired in Step S5.

Then, correction processing is performed in Step S6 "Perform correction processing".

An example of the correction processing is described with reference to FIG. 13B. FIG. 13B schematically illustrates 3×3 pixels. Here, a pixel 61D at the center is regarded as a dark spot defect. FIG. 13B schematically illustrates a state in which the pixel 61D is in a non-lighting state and pixels 61N around the pixel 61D are in lighting states with predetermined luminance.

A dark spot defect is due to a pixel unlikely to have normal luminance even when correction for increasing a data potential input to the pixel is performed. Hence, correction for increasing luminance is performed on the pixels 61N around the pixel 61D recognized as a dark spot defect, as illustrated in FIG. 13B. As a result, a normal image can be displayed even when a dark spot defect exists.

In the case of a bright spot defect, the luminance of pixels around the defect is decreased, so that the bright spot defect can be less noticeable.

Such a correction method for compensating for an abnormal pixel by pixels around the abnormal pixel is effective particularly in the case of a display device with a higher resolution (e.g., 1000 ppi or higher) because it is difficult to see individual pixels separately from each other.

It is preferable that correction be performed such that a data potential is not input to an abnormal pixel recognized as a dark spot defect, a bright spot defect, or the like.

As described above, a correction parameter can be set for each pixel. When the correction parameter is used for image data to be input, correction image data that enables the display device 10 to display an optimal image can be generated.

As well as in an abnormal pixel and pixels around the abnormal pixel, pixel parameters vary in pixels not determined to be abnormal; thus, display unevenness due to the variation might be recognized when an image is displayed, in some cases. Hence, correction parameters for the pixels not determined to be abnormal can be set so as to cancel (level off) the variation of the pixel parameters. For example, a reference value based on the mean value, average value, or the like of pixel parameters of some or all of the pixels can be set, and a correction value used for canceling a difference of a pixel parameter of a certain pixel from the reference value can be set as a correction parameter of the pixel.

For each of the pixels around an abnormal pixel, it is preferred to set correction data that takes into consideration both a correction amount for compensating for the abnormal pixel and a correction amount for canceling pixel parameter variation.

Next, the correction operation ends in Step S7.

After that, an image can be displayed on the basis of the correction parameters obtained in the correction operation and image data to be input.

Note that a neural network may be used for the correction operation. In the case where an arithmetic operation based on an artificial neural network is performed in the above-described display correction system, a product-sum operation is repeatedly performed. In the arithmetic operation using the accelerator 52, the above-mentioned correction of the display defects can be performed. During the arithmetic processing with the accelerator 52, it is possible to reduce the power consumption by power gating control on the CPU 51. The neural network can determine correction parameters on the basis of inference results obtained by machine learning, for example. Estimation can be performed by executing an arithmetic operation based on an artificial neural network such as a deep neural network (DNN), a convolutional neural network (CNN), a recurrent neural network (RNN), an autoencoder, a deep Boltzmann machine (DBM), or a deep belief network (DBN), for example. In the case where correction parameters are determined by a neural network, high-accuracy correction can be performed to make an abnormal pixel less noticeable without using a detailed algorithm for correction.

The above is the description of the correction method.

Note that during the arithmetic operation by the display correction system, which is performed for correcting current flowing through a pixel, data in the arithmetic operation can be retained as backup data in the CPU 51. Therefore, the display correction system is particularly effective in arithmetic processing performed with an enormous amount of calculation, such as an arithmetic operation based on an artificial neural network. Note that it is also possible to reduce power consumption in addition to a reduction in display defects by making the CPU 51 function as an application processor, in combination with, for example, driving that makes a frame frequency changeable.

This embodiment can be combined with the description of the other embodiments as appropriate.

Embodiment 7

In this embodiment, an example of a cross-sectional structure of the display device 10 one embodiment of the present invention will be described.

Structure Example 10 of Display Device

Figure 14:
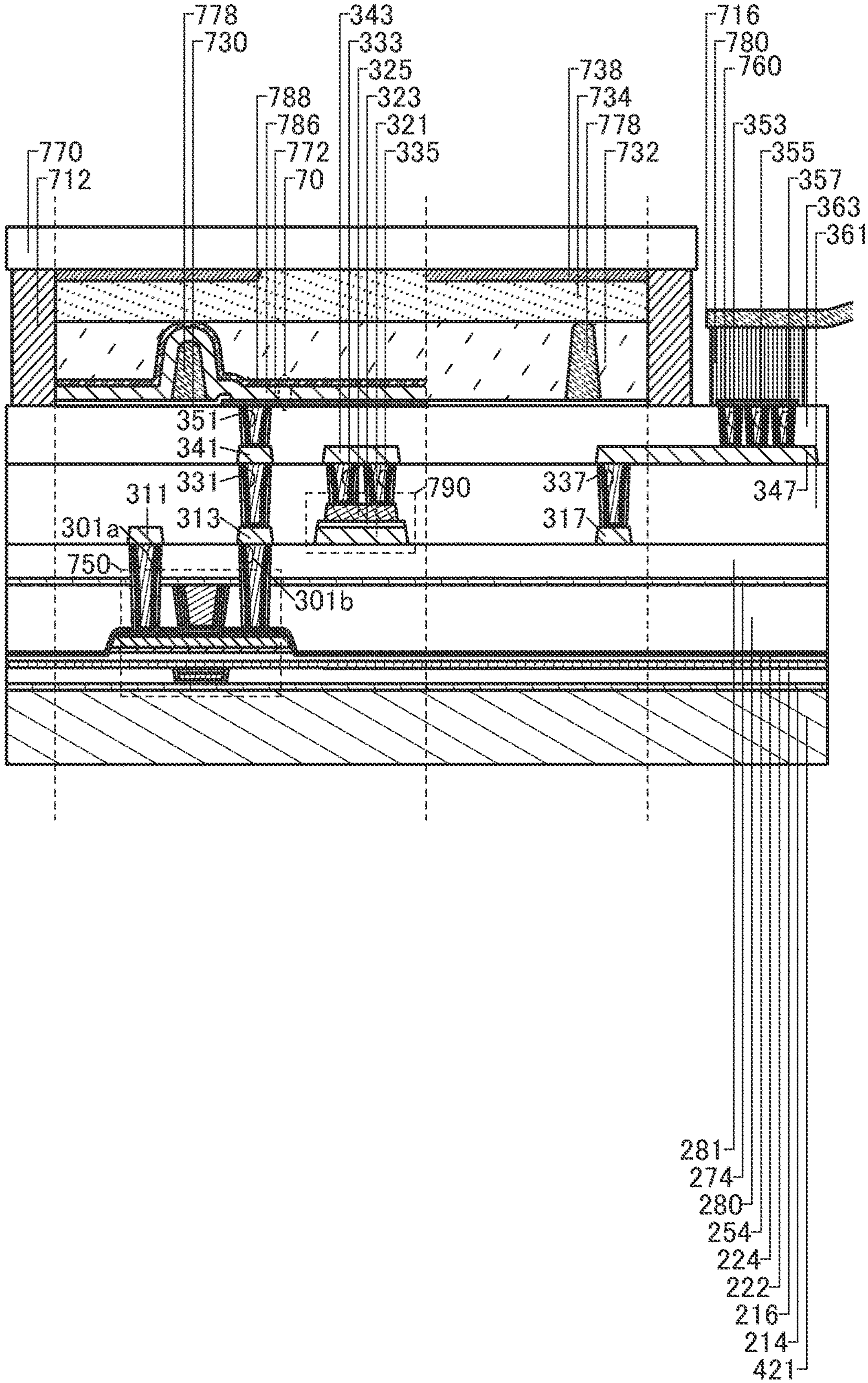
FIG. 14 is a diagram illustrating a structure of a display device according to an embodiment.

FIG. 14 is a cross-sectional view illustrating a structure example of the display device 10. The display device 10 includes an insulator 421 and the base 770, and the insulator 421 and the base 770 are bonded to each other with a sealant 712. It is preferable to use an OS transistor for the pixel circuit. Furthermore, at least part of the driver circuit may be formed using an OS transistor. In addition, at least part of the functional circuit may be formed using an OS transistor. Moreover, at least part of the driver circuit may be externally provided. At least part of the functional circuit may be externally provided.

<<Insulator 421, Insulator 214, and Insulator 216>>

Any of a variety of insulator substrates such as a glass substrate and a sapphire substrate can be used for the insulator 421. An insulator 214 is provided over the insulator 421, and an insulator 216 is provided over the insulator 214.

<<Insulator 222, Insulator 224, Insulator 254, Insulator 280, Insulator 274, and Insulator 281>>

An insulator 222, an insulator 224, an insulator 254, an insulator 280, an insulator 274, and an insulator 281 are provided over the insulator 216.

The insulator 421, the insulator 214, the insulator 280, the insulator 274, and the insulator 281 function as an interlayer film and may function as a planarization film that covers an uneven shape thereunder.

<<Insulator 361>>

An insulator 361 is provided over the insulator 281. A conductor 317 and a conductor 337 are embedded in the insulator 361. Here, the top surface of the conductor 337 and the top surface of the insulator 361 can be substantially level with each other.

<<Insulator 363>>

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 361 and the insulator 363 function as an interlayer film and may function as a planarization film that covers an uneven shape thereunder. For example, the top surface of the insulator 363 may be planarized by planarization treatment using a chemical mechanical polishing (CMP) method or the like to have the increased planarity.

<<Connection Electrode 760>>

A connection electrode 760 is provided over the conductor 353, the conductor 355, the conductor 357, and the insulator 363. An anisotropic conductor 780 is provided to be electrically connected to the connection electrode 760, and an FPC (Flexible Printed Circuit) 716 is provided to be electrically connected to the anisotropic conductor 780. A variety of signals and the like are supplied to the display device 10 from the outside of the display device 10 through the FPC 716.

Although FIG. 14 illustrates three conductors of the conductor 353, the conductor 355, and the conductor 357 as conductors having a function of electrically connecting the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

<<Transistor 750>>

A transistor 750 is provided over the insulator 214. The transistor 750 can be the transistor provided in the layer 30 described in Embodiment 6. For example, the transistor provided in the pixel circuit 62 can be used. An OS transistor can be suitably used as the transistor 750. The OS transistor has a feature of an extremely low off-state current. Thus, the retention time for image data or the like can be increased, so that the frequency of the refresh operation can be reduced. Accordingly, the power consumption of the display device 10 can be reduced.

The transistor 750 can be the transistor provided in the backup circuit 82. The OS transistor can be suitably used as the transistor 750. The OS transistor has a feature of an extremely low off-state current. Thus, data in the flip-flop can be retained even in a period during which the sharing of power supply voltage is stopped. Hence, a normally-off operation (the intermittent stop operation of the supply of the power supply voltage) of the CPU can be performed. Accordingly, the power consumption of the display device 10 can be reduced.

A conductor 301*a* and a conductor 301*b* are embedded in the insulator 254, the insulator 280, the insulator 274, and the insulator 281. The conductor 301*a* is electrically connected to one of a source and a drain of the transistor 750, and the conductor 301*b* is electrically connected to the other of the source and the drain of the transistor 750. Here, the top surfaces of the conductor 301*a* and the conductor 301*b* and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and function as a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

<<Capacitor 790>>

As illustrated in FIG. 14, the capacitor 790 includes a lower electrode 321 and an upper electrode 325. An insulator 323 is provided between the lower electrode 321 and the upper electrode 325. In other words, the capacitor 790 has a stacked-layer structure in which the insulator 323 functioning as a dielectric is provided between the pair of electrodes. Although FIG. 14 illustrates the example in which the capacitor 790 is provided over the insulator 281, the capacitor 790 may be provided over an insulator different from the insulator 281.

In the example illustrated in FIG. 14, the conductor 301*a*, the conductor 301*b*, and a conductor 305 are formed in the same layer. In the illustrated example, the conductor 311, the conductor 313, the conductor 317, and the lower electrode 321 are formed in the same layer. In the illustrated example, the conductor 331, the conductor 333, the conductor 335, and the conductor 337 are formed in the same layer. In the illustrated example, the conductor 341, the conductor 343, and the conductor 347 are formed in the same layer. In the illustrated example, the conductor 351, the conductor 353, the conductor 355, and the conductor 357 are formed in the same layer. Forming a plurality of conductors in the same layer simplifies the fabrication process of the display device 10 and thus the manufacturing cost of the display device 10 can be reduced. Note that these conductors may be formed in different layers or may contain different types of materials.

<<Light-Emitting Element 70>>

The display device 10 illustrated in FIG. 14 includes the light-emitting element 70. The light-emitting element 70 includes a conductor 772, an EL layer 786, and a conductor 788. The EL layer 786 contains an organic compound or an inorganic compound such as quantum dots.

Examples of materials that can be used as the organic compound include a fluorescent material and a phosphorescent material. Examples of materials that can be used as the quantum dots include a colloidal quantum dot material, an alloyed quantum dot material, a core-shell quantum dot material, and a core quantum dot material.

Note that the luminance of the display device 10 can be, for example, 500 cd/m$^2$ or higher, preferably higher than or equal to 1000 cd/m$^2$ and lower than or equal to 10000 cd/m$^2$, further preferably higher than or equal to 2000 cd/m$^2$ and lower than or equal to 5000 cd/m$^2$.

The conductor 772 is electrically connected to the other of the source and the drain of the transistor 750 through the conductor 351, the conductor 341, the conductor 331, the conductor 313, and the conductor 301*b*. The conductor 772 is formed over the insulator 363 and functions as a pixel electrode.

A material that transmits visible light or a material that reflects visible light can be used for the conductor 772. As alight-transmitting material, for example, an oxide material containing indium, zinc, tin, or the like is preferably used. As a reflective material, for example, a material containing aluminum, silver, or the like is preferably used.

The light-emitting element 70 is a top-emission light-emitting element, which includes the conductor 788 with alight-transmitting property. Note that the light-emitting element 70 may have a bottom-emission structure in which light is emitted to the conductor 772 side or a dual-emission structure in which light is emitted towards both the conductor 772 and the conductor 788.

The light-emitting element 70 can have a micro optical resonator (microcavity) structure. Accordingly, light of predetermined colors (e.g., RGB) can be extracted, and the display device 10 can display high-luminance images. In addition, the power consumption of the display device 10 can be reduced.

<<Light-Blocking Layer 738 and Insulator 734>>

On the base 770 side, a light-blocking layer 738 and an insulator 734 that is in contact with the light-blocking layer 738 are provided. The light-blocking layer 738 has a function of blocking light emitted from adjacent regions. Alternatively, the light-blocking layer 738 has a function of preventing external light from reaching the transistor 750 or the like.

<<Insulator 730>>

In the display device 10 illustrated in FIG. 14, an insulator 730 is provided over the insulator 363. Here, the insulator 730 can cover part of the conductor 772. Although the structure where the insulator 730 is provided is described in this embodiment, the present invention is not limited thereto. For example, the insulator 730 is not necessarily provided. Note that it is preferable that insulator 730 not be provided because the opening portion of the display device can be increased.

The light-blocking layer 738 is provided to include a region overlapping with the insulator 730. The light-blocking layer 738 is covered with the insulator 734. A gap between the light-emitting element 70 and the insulator 734 is filled with a sealing layer 732.

<<Component 778>>

A component 778 is provided between the insulator 730 and the EL layer 786. Moreover, the component 778 is provided between the insulator 730 and the insulator 734.

Although not illustrated in FIG. 14, an optical member (an optical substrate) such as a polarizing member, a retardation member, or an anti-reflection member can be provided in the display device 10, for example.

In addition, a coloring layer can be provided. The coloring layer is provided to include a region overlapping with the light-emitting element 70. Providing the coloring layer can improve the color purity of light extracted from the light-emitting element 70. Thus, the display device 10 can display high-quality images. Furthermore, all the light-emitting elements 70, for example, in the display device 10 can be light-emitting elements that emit white light; hence, the EL layers 786 are not necessarily formed separately for each color, leading to higher resolution of the display device 10.

Structure Example 11 of Display Device

Figure 15:
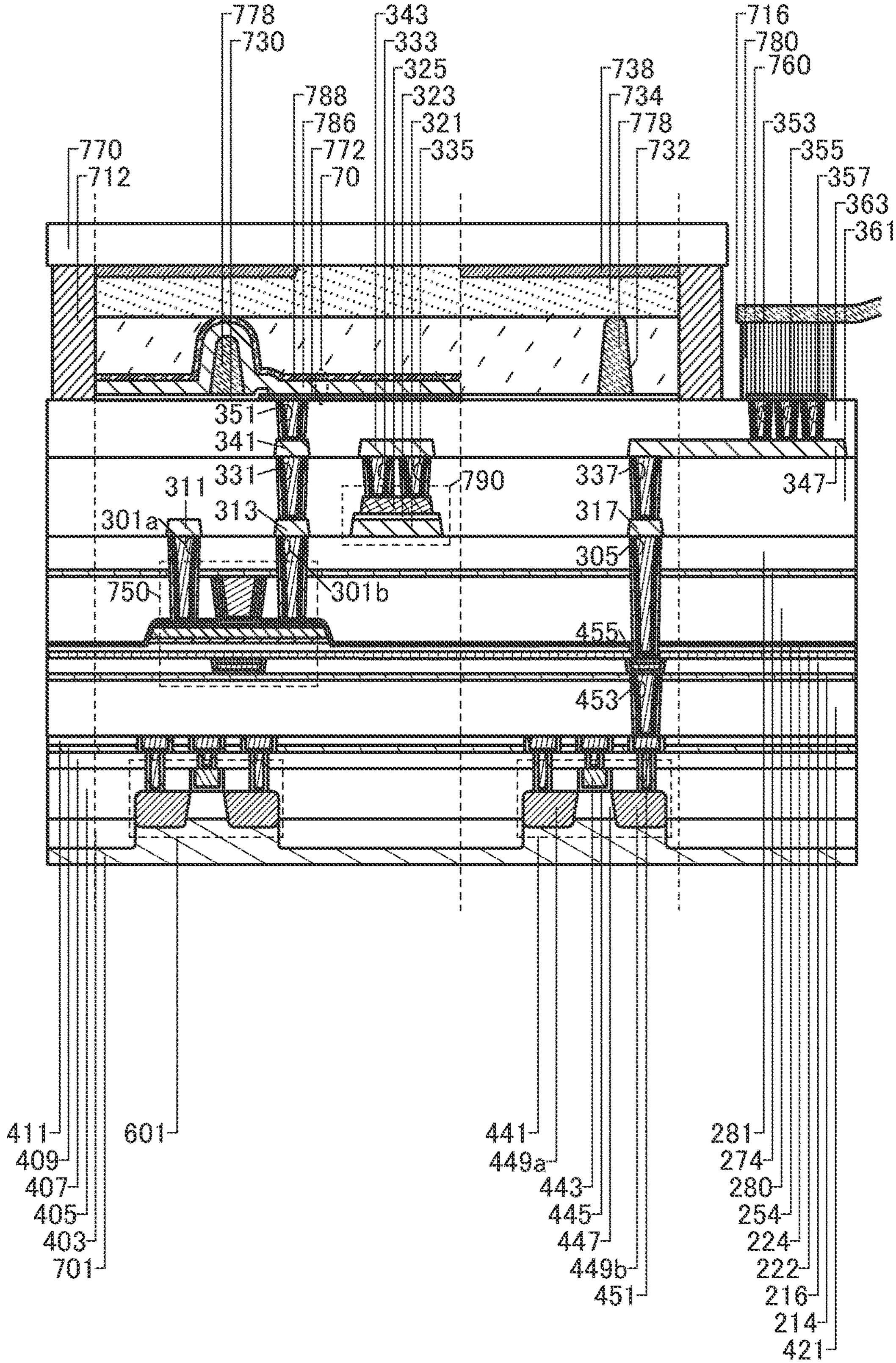
FIG. 15 is a diagram illustrating a structure of a display device according to an embodiment.

FIG. 15 is a cross-sectional view illustrating a structure example of the display device 10. The display device 10 includes a substrate 701 and the base 770, and the substrate 701 and the base 770 are bonded to each other with the sealant 712. The display device 10 illustrated in FIG. 15 is different from the display device 10 illustrated in FIG. 14 in including a transistor 601.

<<Substrate 701>>

As the substrate 701, a single crystal semiconductor substrate such as a single crystal silicon substrate can be used. Note that a semiconductor substrate other than a single crystal semiconductor substrate may be used as the substrate 701.

The transistor 441 and the transistor 601 are provided over the substrate 701. The transistor 441 and the transistor 601 can be the transistors provided in the layer 20 described in Embodiment 6. For example, the transistor 441 and the transistor 601 can be used as the transistors in the driver circuit 40 or the transistors in the functional circuit 50 included in the layer 20.

<<Transistor 441>>

The transistor 441 is formed of the conductor 443 functioning as a gate electrode, the insulator 445 functioning as a gate insulator, and part of the substrate 701 and includes the semiconductor region 447 including a channel formation region, the low-resistance region 449*a* functioning as one of a source region and a drain region, and the low-resistance region 449*b* functioning as the other of the source region and the drain region. The transistor 441 may be either a p-channel transistor or an n-channel transistor.

The transistor 441 is electrically isolated from other transistors by an element isolation layer 403. FIG. 15 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 15, the semiconductor region 447 has a projecting shape. Moreover, the conductor 443 is provided to cover the side surface and the top surface of the semiconductor region 447 with the insulator 445 therebetween. Note that FIG. 15 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator functioning as a mask for forming a projecting portion may be provided in contact with an upper portion of the projecting portion. Although FIG. 15 illustrates the structure in which the projecting portion is formed by processing part of the substrate 701, a semiconductor having a projecting shape may be formed by processing an SOI substrate.

Note that the structure of the transistor 441 illustrated in FIG. 15 is an example; the structure is not limited thereto and can be changed as appropriate in accordance with the circuit structure, an operation method for the circuit, or the like. For example, the transistor 441 may be a planar transistor.

<<Transistor 601>>

The transistor 601 can have a structure similar to that of the transistor 441.

<<Insulator 405, Insulator 407, Insulator 409, and Insulator 411>>

The insulator 405, the insulator 407, the insulator 409, and the insulator 411 are provided over the substrate 701, in addition to the element isolation layer 403, the transistor 441, and the transistor 601. The conductor 451 is embedded in the insulator 405, the insulator 407, the insulator 409, and the insulator 411. Here, the top surface of the conductor 451 and the top surface of the insulator 411 can be substantially level with each other.

The insulator 405, the insulator 407, the insulator 409, and the insulator 411 function as an interlayer film and may function as a planarization film that covers an uneven shape thereunder.

<<Insulator 421, Insulator 214, and Insulator 216>>

The insulator 421 and the insulator 214 are provided over the conductor 451 and the insulator 411. The conductor 453 is embedded in the insulator 421 and the insulator 214. Here, the top surface of the conductor 453 and the top surface of the insulator 214 can be substantially level with each other.

The insulator 216 is provided over the conductor 453 and the insulator 214. The conductor 455 is embedded in the insulator 216. Here, the top surface of the conductor 455 and the top surface of the insulator 216 can be substantially level with each other.

<<Insulator 222, Insulator 224, Insulator 254, Insulator 280, Insulator 274, and Insulator 281>>

The insulator 222, the insulator 224, the insulator 254, the insulator 280, the insulator 274, and the insulator 281 are provided over the conductor 455 and the insulator 216.

The conductor 305 is embedded in the insulator 222, the insulator 224, the insulator 254, the insulator 280, the insulator 274, and the insulator 281. Here, the top surface of the conductor 305 and the top surface of the insulator 281 can be substantially level with each other.

The insulator 421, the insulator 214, the insulator 280, the insulator 274, and the insulator 281 function as an interlayer film and may function as a planarization film that covers an uneven shape thereunder.

<<Insulator 361>>

The insulator 361 is provided over the conductor 305 and the insulator 281.

<<Transistor 441>>

As illustrated in FIG. 15, the low-resistance region **449*b* functioning as the other of the source region and the drain region of the transistor 441 is electrically connected to the FPC 716 through the conductor 451, the conductor 453, the conductor 455, the conductor 305, the conductor 317, the conductor 337, the conductor 347, the conductor 353, the conductor 355, the conductor 357, the connection electrode 760, and the anisotropic conductor 780**.

Structure Example 12 of Display Device

Figure 16:
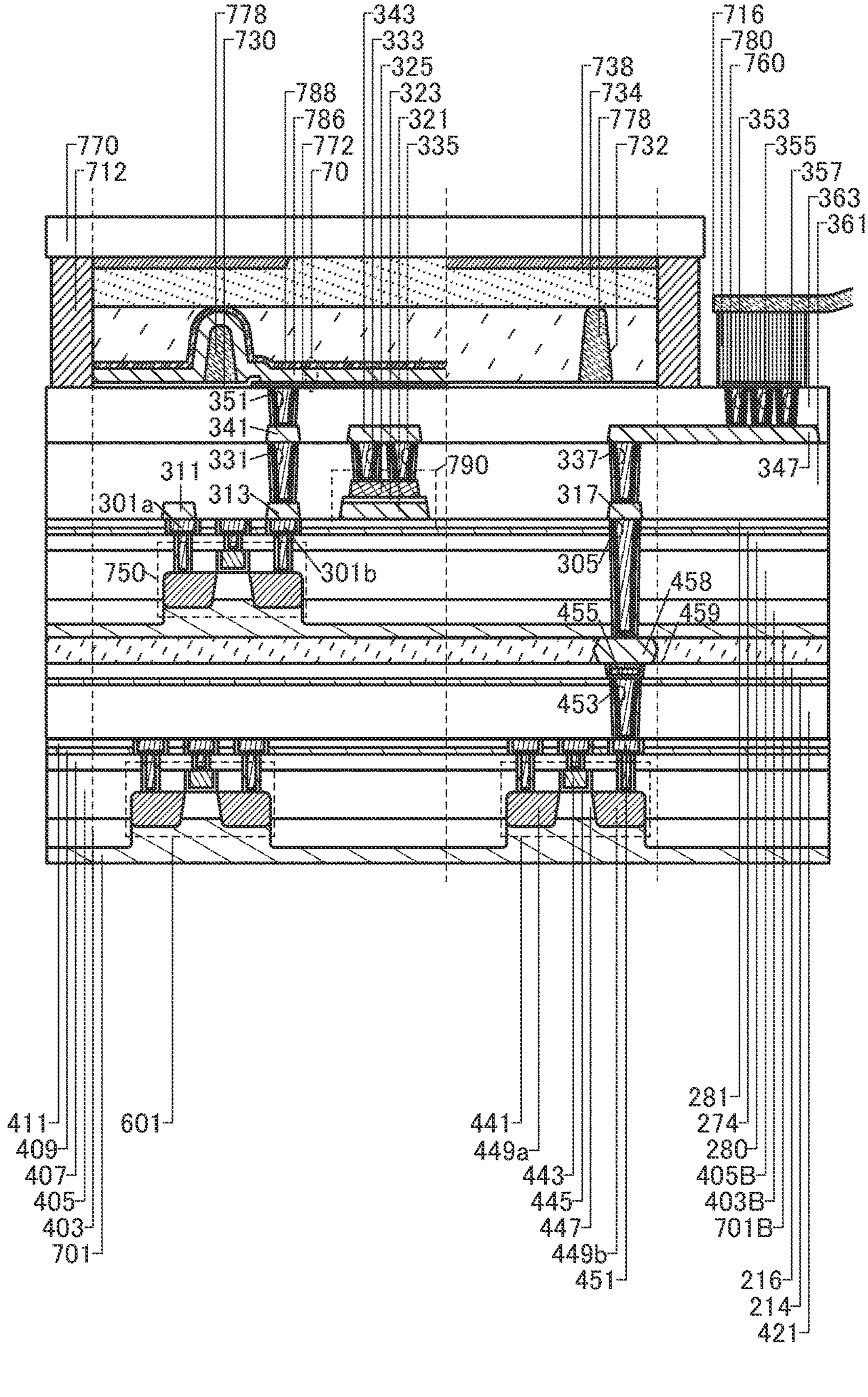
FIG. 16 is a diagram illustrating a structure of a display device according to an embodiment.

FIG. 16 is a cross-sectional view illustrating a structure example of the display device 10. The display device 10 includes the substrate 701 and the base 770, and the substrate 701 and the base 770 are bonded to each other with the sealant 712. The display device 10 in FIG. 16 is different from the display device 10 illustrated in FIG. 15 in that the transistor 750 has the same structure as the transistor 441.

<<Substrate 701>>

As the substrate 701, a single crystal semiconductor substrate such as a single crystal silicon substrate can be used. Note that a semiconductor substrate other than a single crystal semiconductor substrate may be used as the substrate 701.

The transistor 441 and the transistor 601 are provided over the substrate 701. The transistor 441 and the transistor 601 can be the transistors provided in the layer 20 described in Embodiment 6. For example, the transistor 441 and the transistor 601 can be used as the transistors in the driver circuit 40 or the transistors in the functional circuit 50 included in the layer 20.

<<Transistor 441>>

The transistor 441 is formed of the conductor 443 functioning as a gate electrode, the insulator 445 functioning as a gate insulator, and part of the substrate 701 and includes the semiconductor region 447 including a channel formation region, the low-resistance region **449*a* functioning as one of a source region and a drain region, and the low-resistance region 449*b* functioning as the other of the source region and the drain region. The transistor 441** may be either a p-channel transistor or an n-channel transistor.

As illustrated in FIG. 16, the low-resistance region **449*b* functioning as the other of the source region and the drain region of the transistor 441 is electrically connected to the FPC 716 through the conductor 451, the conductor 453, the conductor 455, the bump 458, the conductor 305, the conductor 317, the conductor 337, the conductor 347, the conductor 353, the conductor 355, the conductor 357, the connection electrode 760, and the anisotropic conductor 780**.

The transistor 441 is electrically isolated from other transistors by an element isolation layer 403. FIG. 16 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 16, the semiconductor region 447 has a projecting shape. Moreover, the conductor 443 is provided to cover the side surface and the top surface of the semiconductor region 447 with the insulator 445 therebetween. Note that FIG. 16 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator functioning as a mask for forming a projecting portion may be provided in contact with an upper portion of the projecting portion. Although FIG. 16 illustrates the structure in which the projecting portion is formed by processing part of the substrate 701, a semiconductor having a projecting shape may be formed by processing an SOI substrate.

Note that the structure of the transistor 441 illustrated in FIG. 16 is an example; the structure is not limited thereto and can be changed as appropriate in accordance with the circuit structure, an operation method for the circuit, or the like. For example, the transistor 441 may be a planar transistor.

<<Transistor 601>>

The transistor 601 can have a structure similar to that of the transistor 441.

<<Insulator 405, Insulator 407, Insulator 409, and Insulator 411>>

The insulator 405, the insulator 407, the insulator 409, and the insulator 411 are provided over the substrate 701, in addition to the element isolation layer 403, the transistor 441, and the transistor 601. The conductor 451 is embedded in the insulator 405, the insulator 407, the insulator 409, and the insulator 411. Here, the top surface of the conductor 451 and the top surface of the insulator 411 can be substantially level with each other.

The insulator 405, the insulator 407, the insulator 409, and the insulator 411 function as an interlayer film and may function as a planarization film that covers an uneven shape thereunder.

<<Insulator 421, Insulator 214, and Insulator 216>>

The insulator 421 and the insulator 214 are provided over the conductor 451 and the insulator 411. The conductor 453 is embedded in the insulator 421 and the insulator 214. Here, the top surface of the conductor 453 and the top surface of the insulator 214 can be substantially level with each other.

The insulator 216 is provided over the conductor 453 and the insulator 214. The conductor 455 is embedded in the insulator 216. Here, the top surface of the conductor 455 and the top surface of the insulator 216 can be substantially level with each other.

<<Bonding Layer 459>>

A bonding layer 459 is provided over the insulator 216. A bump 458 is embedded in the bonding layer 459. The bonding layer 459 bonds the insulator 216 and a substrate 701B. The bottom surface of the bump 458 is in contact with the conductor 455 and the top surface of the bump 458 is in contact with the conductor 305 so that the conductor 455 and the conductor 305 are electrically connected to each other.

<<Substrate 701B>>

As the substrate 701B, a single crystal semiconductor substrate such as a single crystal silicon substrate can be used. Note that a semiconductor substrate other than a single crystal semiconductor substrate may be used as the substrate 701B.

The transistor 750 is provided over the substrate 701B. The transistor 750 can be the transistor provided in the layer 30 described in Embodiment 6. For example, the transistor provided in the pixel circuit 62 can be used.

<<Transistor 750>>

The transistor 750 can have a structure similar to that of the transistor 441.

<<Insulator 405B, Insulator 280, Insulator 274, and Insulator 281>>

An insulator 405B, the insulator 280, the insulator 274, and the insulator 281 are provided over the substrate 701B, in addition to an element isolation layer 403B and the transistor 750. The conductor 305 is embedded in the insulator 405B, the insulator 280, the insulator 274, and the insulator 281. Here, the top surface of the conductor 305 and the top surface of the insulator 281 can be substantially level with each other.

The insulator 405B, the insulator 280, the insulator 274, and the insulator 281 function as an interlayer film and may function as a planarization film that covers an uneven shape thereunder.

<<Insulator 361>>

The insulator 361 is provided over the conductor 305 and the insulator 281

Structure Example 13 of Display Device

Figure 17:
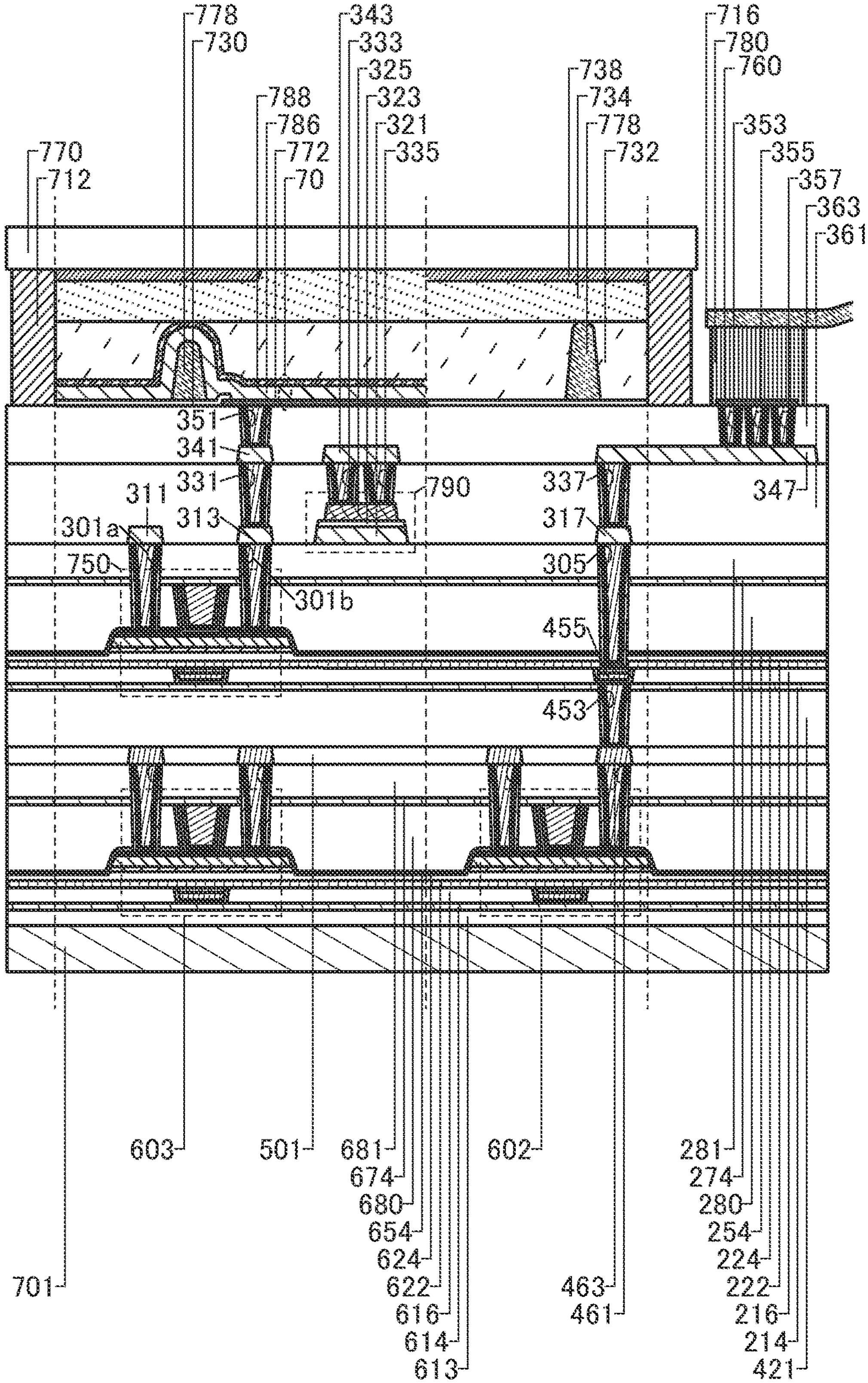
FIG. 17 is a diagram illustrating a structure of a display device according to an embodiment.

The display device 10 illustrated in FIG. 17 is different from the display device 10 illustrated in FIG. 15 mainly in that a transistor 602 and a transistor 603 that are OS transistors are provided in place of the transistor 441 and the transistor 601. Moreover, the OS transistor can be used as the transistor 750. That is, the display device 10 illustrated in FIG. 17 includes a stack of OS transistors. In the example illustrated in FIG. 17, the transistor 602 and the transistor 603 are provided over the substrate 701. As the substrate 701, a single crystal semiconductor substrate such as a single crystal silicon substrate, or another semiconductor substrate can be used as described above. In addition, a variety of insulator substrates such as a glass substrate or a sapphire substrate may be used as the substrate 701.

<<Insulator 613 and Insulator 614>>

An insulator 613 and an insulator 614 are provided over the substrate 701, and the transistor 602 and the transistor 603 are provided over the insulator 614. Note that a transistor or the like may be provided between the substrate 701 and the insulator 613. For example, a transistor having a structure similar to those of the transistor 441 and the transistor 601 illustrated in FIG. 15 may be provided between the substrate 701 and the insulator 613.

<<Transistor 602 and transistor 603>>

The transistor 602 and the transistor 603 can be the transistors provided in the layer 20 described in Embodiment 6.

The transistor 602 and the transistor 603 can be transistors having a structure similar to that of the transistor 750. Note that the transistor 602 and the transistor 603 may be OS transistors having a structure different from that of the transistor 750.

<<Insulator 616, Insulator 622, Insulator 624, Insulator 654, Insulator 680, Insulator 674, and Insulator 681>>

An insulator 616, an insulator 622, an insulator 624, an insulator 654, an insulator 680, an insulator 674, and an insulator 681 are provided over the insulator 614, in addition to the transistor 602 and the transistor 603. A conductor 461 is embedded in the insulator 654, the insulator 680, the insulator 674, and the insulator 681. Here, the top surface of the conductor 461 and the top surface of the insulator 681 can be substantially level with each other.

<<Insulator 501>>

An insulator 501 is provided over the conductor 461 and the insulator 681. A conductor 463 is embedded in the insulator 501. Here, the top surface of the conductor 463 and the top surface of the insulator 501 can be substantially level with each other.

The insulator 421 and the insulator 214 are provided over the conductor 463 and the insulator 501. The conductor 453 is embedded in the insulator 421 and the insulator 214. Here, the top surface of the conductor 453 and the top surface of the insulator 214 can be substantially level with each other.

As illustrated in FIG. 17, one of a source and a drain of the transistor 602 is electrically connected to the FPC 716 through the conductor 461, the conductor 463, the conductor 453, the conductor 455, the conductor 305, the conductor 317, the conductor 337, the conductor 347, the conductor 353, the conductor 355, the conductor 357, the connection electrode 760, and the anisotropic conductor 780.

The conductor 305 is embedded in the insulator 222, the insulator 224, the insulator 254, the insulator 280, the insulator 274, and the insulator 281. Here, the top surface of the conductor 305 and the top surface of the insulator 281 can be substantially level with each other.

The insulator 613, the insulator 614, the insulator 680, the insulator 674, the insulator 681, and the insulator 501 function as an interlayer film and may function as a planarization film that covers an uneven shape thereunder.

When the display device 10 has the structure illustrated in FIG. 17, all the transistors included in the display device 10 can be OS transistors while the bezel and size of the display device 10 are reduced. Accordingly, the transistors provided in the layer 20 and the transistors provided in the layer 30 described in Embodiment 6 can be fabricated using the same apparatus, for example. Consequently, the fabrication cost of the display device 10 can be reduced, making the display device 10 inexpensive.

Structure Example 14 of Display Device

Figure 18:
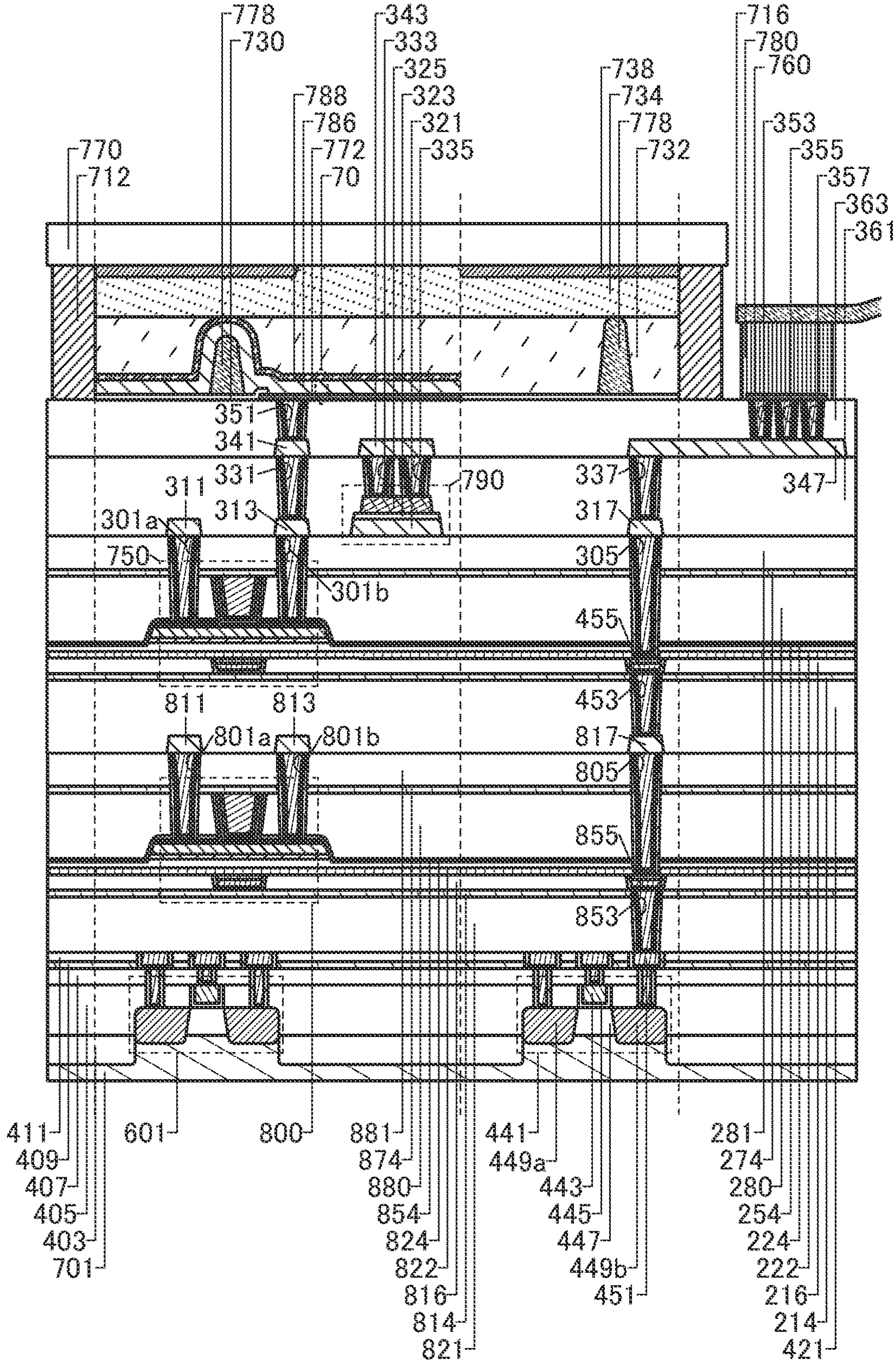
FIG. 18 is a diagram illustrating a structure of a display device according to an embodiment.

FIG. 18 is a cross-sectional view illustrating a structure example of the display device 10. The display device 10 in FIG. 18 is different from the display device 10 illustrated in FIG. 15 mainly in that a layer including a transistor 800 is provided between the layer including the transistor 750 and the layer including the transistor 601 and the transistor 441.

In the structure of FIG. 18, the layer 20 described in Embodiment 6 can include the layer including the transistor 601 and the transistor 441 and the layer including the transistor 800. The transistor 750 can be the transistor provided in the layer 30 described in Embodiment 6.

<<Insulator 821 and Insulator 814>>

An insulator 821 and an insulator 814 are provided over the conductor 451 and the insulator 411. A conductor 853 is embedded in the insulator 821 and the insulator 814. Here, the top surface of the conductor 853 and the top surface of the insulator 814 can be substantially level with each other.

<<Insulator 816>>

An insulator 816 is provided over the conductor 853 and the insulator 814. A conductor 855 is embedded in the insulator 816. Here, the top surface of the conductor 855 and the top surface of the insulator 816 can be substantially level with each other.

<<Insulator 822, Insulator 824, Insulator 854, Insulator 880, Insulator 874, and Insulator 881>>

An insulator 822, an insulator 824, an insulator 854, an insulator 880, an insulator 874, and an insulator 881 are provided over the conductor 855 and the insulator 816. A conductor 805 is embedded in the insulator 822, the insulator 824, the insulator 854, the insulator 880, the insulator 874, and the insulator 881. Here, the top surface of the conductor 805 and the top surface of the insulator 881 can be substantially level with each other.

The insulator 421 and the insulator 214 are provided over a conductor 817 and the insulator 881.

As illustrated in FIG. 18, the low-resistance region 449*b* functioning as the other of the source region and the drain region of the transistor 441 is electrically connected to the FPC 716 through the conductor 451, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780.

<<Transistor 800>>

The transistor 800 is provided over the insulator 814. The transistor 800 can be the transistor provided in the layer 20 described in Embodiment 6. The transistor 800 is preferably an OS transistor. For example, the transistor 800 can be the transistor provided in the backup circuit 82.

A conductor 801*a* and a conductor 801*b* are embedded in the insulator 854, the insulator 880, the insulator 874, and the insulator 881. The conductor 801*a* is electrically connected to one of a source and a drain of the transistor 800, and the conductor 801*b* is electrically connected to the other of the source and the drain of the transistor 800. Here, the top surfaces of the conductor 801*a* and the conductor 801*b* and the top surface of the insulator 881 can be substantially level with each other.

<<Transistor 750>>

The transistor 750 can be the transistor provided in the layer 30 described in Embodiment 6. For example, the transistor 750 can be the transistor provided in the pixel circuit 62. The transistor 750 is preferably an OS transistor.

The insulator 405, the insulator 407, the insulator 409, the insulator 411, the insulator 821, the insulator 814, the insulator 880, the insulator 874, the insulator 881, the insulator 421, the insulator 214, the insulator 280, the insulator 274, the insulator 281, the insulator 361, and the insulator 363 function as an interlayer film and may function as a planarization film that covers an uneven shape thereunder.

In the example illustrated in FIG. 18, the conductor 801*a*, the conductor 801*b*, and the conductor 805 are formed in the same layer. In the illustrated example, a conductor 811, a conductor 813, and the conductor 817 are formed in the same layer.

At least part of this embodiment can be implemented in combination with the other embodiments described in this specification as appropriate.

Embodiment 8

In this embodiment, a transistor that can be used in the display device of one embodiment of the present invention will be described.

Structure Example of Transistor

Figure 19A:
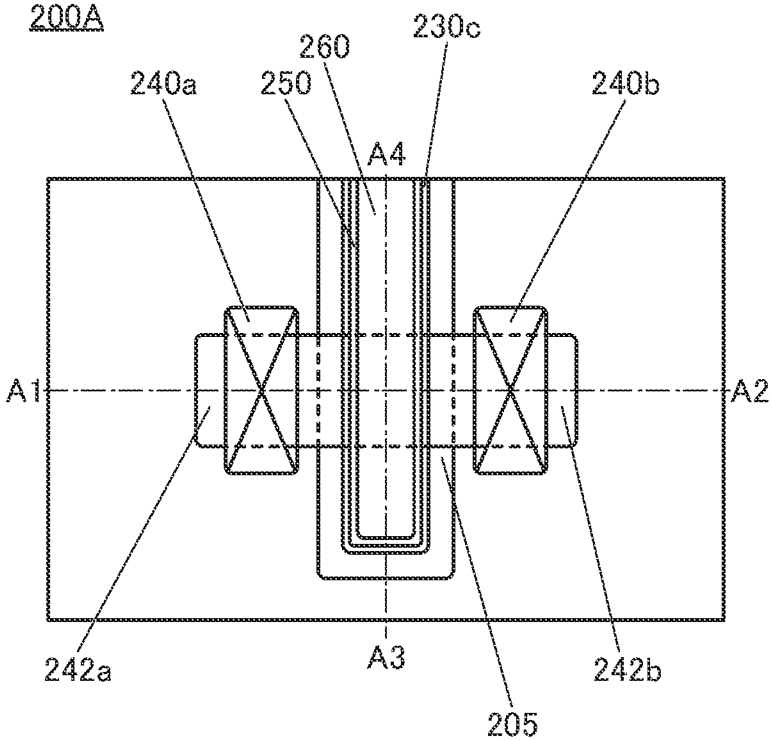
FIG. 19A to FIG. 19C are diagrams illustrating a structure of a transistor according to an embodiment.
Figure 19C:
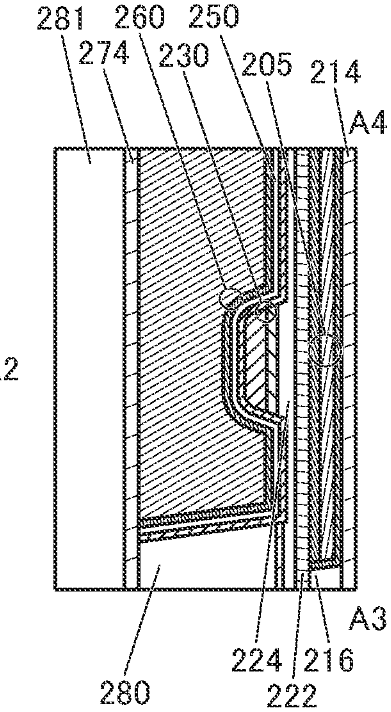
Figure 19B:
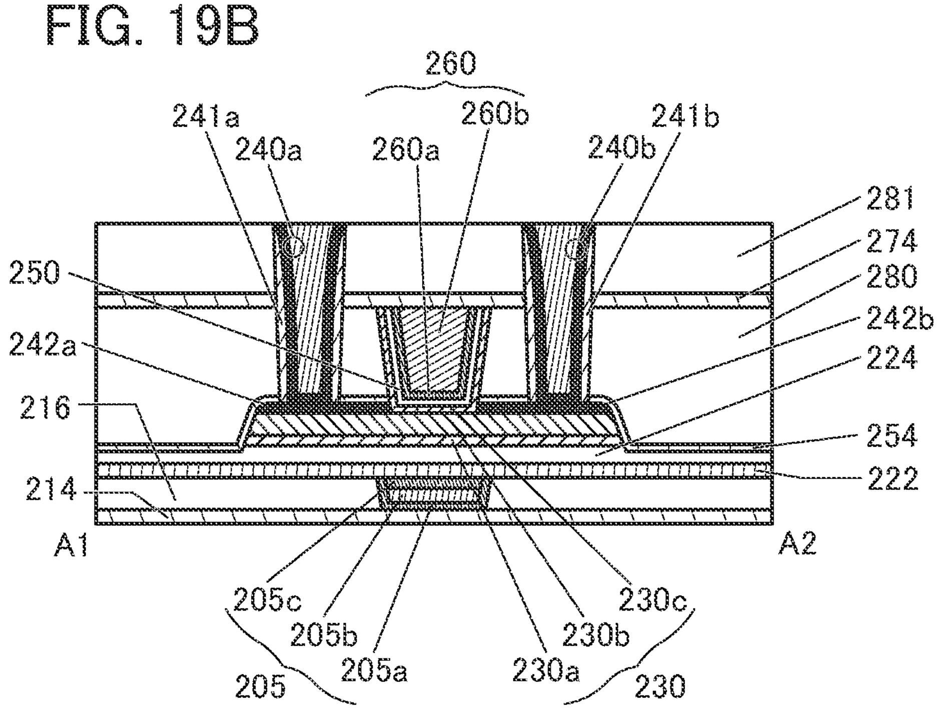

FIG. 19A, FIG. 19B, and FIG. 19C are a top view and cross-sectional views of a transistor 200A that can be used in the display device of one embodiment of the present invention and the periphery of the transistor 200A. The transistor 200A can be used in the display device of one embodiment of the present invention.

FIG. 19A is the top view of the transistor 200A. FIG. 19B and FIG. 19C are the cross-sectional views of the transistor 200A. Here, FIG. 19B is a cross-sectional view of a portion indicated by the dashed-dotted line A1-A2 in FIG. 19A and is a cross-sectional view of the transistor 200A in the channel length direction. FIG. 19C is a cross-sectional view of a portion indicated by the dashed-dotted line A3-A4 in FIG. 19A and is a cross-sectional view of the transistor 200A in the channel width direction. Note that some components are omitted in the top view of FIG. 19A for clarity of the drawing.

As illustrated in FIG. 19, the transistor 200A includes a metal oxide 230*a* placed over a substrate (not illustrated); a metal oxide 230*b* placed over the metal oxide 230*a*; a conductor 242*a* and a conductor 242*b* that are placed apart from each other over the metal oxide 230*b*; the insulator 280 that is placed over the conductor 242*a* and the conductor 242*b* and has an opening between the conductor 242*a* and the conductor 242*b*; a conductor 260 placed in the opening; an insulator 250 placed between the conductor 260 and each of the metal oxide 230*b*, the conductor 242*a*, the conductor 242*b*, and the insulator 280; and a metal oxide 230*c* placed between the insulator 250 and each of the metal oxide 230*b*, the conductor 242*a*, the conductor 242*b*, and the insulator 280. Here, as illustrated in FIG. 19B and FIG. 19C, preferably, the top surface of the conductor 260 is substantially aligned with the top surfaces of the insulator 250, the insulator 254, the metal oxide 230*c*, and the insulator 280. Hereinafter, the metal oxide 230*a*, the metal oxide 230*b*, and the metal oxide 230*c* may be collectively referred to as a metal oxide 230. The conductor 242*a* and the conductor 242*b* may be collectively referred to as a conductor 242.

In the transistor 200A illustrated in FIG. 19, the side surfaces of the conductor 242*a* and the conductor 242*b* on the conductor 260 side are substantially perpendicular. Note that the transistor 200A illustrated in FIG. 19 is not limited thereto, and the angle formed between the side surfaces and the bottom surfaces of the conductor 242*a* and the conductor 242*b* may be greater than or equal to 10° and less than or equal to 80°, preferably greater than or equal to 30° and less than or equal to 60°. The side surfaces of the conductor 242*a* and the conductor 242*b* that face each other may have a plurality of surfaces.

As illustrated in FIG. 19, the insulator 254 is preferably placed between the insulator 280 and each of the insulator 224, the metal oxide 230*a*, the metal oxide 230*b*, the conductor 242*a*, the conductor 242*b*, and the metal oxide 230*c*. Here, as illustrated in FIG. 19B and FIG. 19C, the insulator 254 is preferably in contact with the side surface of the metal oxide 230*c*, the top surface and the side surface of the conductor 242*a*, the top surface and the side surface of the conductor 242*b*, the side surfaces of the metal oxide 230*a* and the metal oxide 230*b*, and the top surface of the insulator 224.

In the transistor 200A, three layers of the metal oxide 230*a*, the metal oxide 230*b*, and the metal oxide 230*c* are stacked in and around a region where a channel is formed (hereinafter, also referred to as a channel formation region); however, the present invention is not limited thereto. For example, a two-layer structure of the metal oxide 230*b* and the metal oxide 230*c* or a stacked-layer structure of four or more layers may be employed. Although the conductor 260 is illustrated to have a stacked-layer structure of two layers in the transistor 200A, the present invention is not limited thereto. For example, the conductor 260 may have a single-layer structure or a stacked-layer structure of three or more layers. Furthermore, each of the metal oxide 230*a*, the metal oxide 230*b*, and the metal oxide 230*c* may have a stacked-layer structure of two or more layers.

For example, in the case where the metal oxide 230*c* has a stacked-layer structure including a first metal oxide and a second metal oxide over the first metal oxide, the first metal oxide preferably has a composition similar to that of the metal oxide 230*b* and the second metal oxide preferably has a composition similar to that of the metal oxide 230*a*.

Here, the conductor 260 functions as a gate electrode of the transistor, and the conductor 242*a* and the conductor 242*b* function as a source electrode and a drain electrode. As described above, the conductor 260 is formed to be embedded in the opening of the insulator 280 and the region interposed between the conductor 242*a* and the conductor 242*b*. Here, the positions of the conductor 260, the conductor 242*a*, and the conductor 242*b* are selected in a self-aligned manner with respect to the opening of the insulator 280. That is, in the transistor 200A, the gate electrode can be placed between the source electrode and the drain electrode in a self-aligned manner. Thus, the conductor 260 can be formed without an alignment margin, resulting in a reduction in the area occupied by the transistor 200A. Accordingly, the display device can have higher resolution. In addition, the display device can have a narrow bezel.

As illustrated in FIG. 19, the conductor 260 preferably includes a conductor 260*a* provided on the inner side of the insulator 250 and a conductor 260*b* provided to be embedded on the inner side of the conductor 260*a*.

The transistor 200A preferably includes the insulator 214 placed over the substrate (not illustrated); the insulator 216 placed over the insulator 214; a conductor 205 placed to be embedded in the insulator 216; the insulator 222 placed over the insulator 216 and the conductor 205; and the insulator 224 placed over the insulator 222. The metal oxide 230*a* is preferably placed over the insulator 224.

The insulator 274 and the insulator 281 functioning as interlayer films are preferably placed over the transistor 200A. Here, the insulator 274 is preferably placed in contact with the top surfaces of the conductor 260, the insulator 250, the insulator 254, the metal oxide 230*c*, and the insulator 280.

The insulator 222, the insulator 254, and the insulator 274 preferably have a function of inhibiting diffusion of hydrogen (e.g., at least one of a hydrogen atom and a hydrogen molecule). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of oxygen (e.g., at least one of an oxygen atom and an oxygen molecule). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of impurities such as hydrogen contained in the insulator 280 and the insulator 281 into the insulator 224, the metal oxide 230, and the insulator 250 or excess oxygen into the insulator 224, the metal oxide 230*a*, the metal oxide 230*b*, and the insulator 250.

A conductor 240 (a conductor 240*a* and a conductor 240*b*) that is electrically connected to the transistor 200A and functions as a plug is preferably provided. Note that an insulator 241 (an insulator 241*a* and an insulator 241*b*) is provided in contact with the side surface of the conductor 240 functioning as a plug. That is, the insulator 241 is provided in contact with the inner wall of an opening in the insulator 254, the insulator 280, the insulator 274, and the insulator 281. In addition, a structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the transistor 200A has a structure in which the first conductor of the conductor 240 and the second conductor of the conductor 240 are stacked, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

In the transistor 200A, a metal oxide functioning as an oxide semiconductor (hereinafter, also referred to as an oxide semiconductor) is preferably used as the metal oxide 230 including the channel formation region (the metal oxide 230*a*, the metal oxide 230*b*, and the metal oxide 230*c*). For example, the metal oxide to be the channel formation region of the metal oxide 230 preferably has a band gap of 2 eV or more, further preferably 2.5 eV or more.

The metal oxide preferably contains at least indium (In) or zinc (Zn). In particular, indium (In) and zinc (Zn) are preferably contained. In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 19B, the metal oxide 230*b* in a region not overlapping with the conductor 242 sometimes has a smaller thickness than the metal oxide 230*b* in a region overlapping with the conductor 242. The thin region is formed when part of the top surface of the metal oxide 230*b* is removed at the time of forming the conductor 242*a* and the conductor 242*b*. When a conductive film to be the conductor 242 is formed, a low-resistance region is sometimes formed on the top surface of the metal oxide 230*b* in the vicinity of the interface with the conductive film. Removing the low-resistance region positioned between the conductor 242*a* and the conductor 242*b* on the top surface of the metal oxide 230*b* in the above manner can prevent formation of the channel in the region.

According to one embodiment of the present invention, a display device that includes small-size transistors and has high resolution can be provided. A display device that includes a transistor with a high on-state current and has high luminance can be provided. A display device that includes a transistor operating at high speed and thus operates at high speed can be provided. A display device that includes a transistor having stable electrical characteristics and is highly reliable can be provided. A display device that includes a transistor with a low off-state current and has low power consumption can be provided.

The structure of the transistor 200A that can be used in the display device of one embodiment of the present invention will be described in detail.

The conductor 205 is placed to include a region overlapping with the metal oxide 230 and the conductor 260. Furthermore, the conductor 205 is preferably provided to be embedded in the insulator 216.

The conductor 205 includes a conductor 205*a*, a conductor 205*b*, and a conductor 205*c*. The conductor 205*a* is provided in contact with the bottom surface and the side wall of the opening provided in the insulator 216. The conductor 205*b* is provided to be embedded in a recessed portion formed by the conductor 205*a*. Here, the level of the top surface of the conductor 205*b* is lower than the levels of the top surface of the conductor 205*a* and the top surface of the insulator 216. The conductor 205*c* is provided in contact with the top surface of the conductor 205*b* and the side surface of the conductor 205*a*. Here, the top surface of the conductor 205*c* is substantially level with the top surface of the conductor 205*a* and the top surface of the insulator 216. That is, the conductor 205*b* is surrounded by the conductor 205*a* and the conductor 205*c*.

For the conductor 205*a* and the conductor 205*c*, it is preferable to use a conductive material having a function of inhibiting diffusion of impurities such as a hydrogen atom, a hydrogen molecule, a water molecule, a nitrogen atom, a nitrogen molecule, a nitrogen oxide molecule (N2O, NO, NO2, or the like), and a copper atom. Alternatively, it is preferable to use a conductive material having a function of inhibiting diffusion of oxygen (e.g., at least one of an oxygen atom and an oxygen molecule).

When the conductor 205*a* and the conductor 205*c* are formed using a conductive material having a function of inhibiting diffusion of hydrogen, impurities such as hydrogen contained in the conductor 205*b* can be inhibited from diffusing into the metal oxide 230 through the insulator 224 and the like. When the conductor 205*a* and the conductor 205*c* are formed using a conductive material having a function of inhibiting diffusion of oxygen, the conductivity of the conductor 205*b* can be inhibited from being lowered because of oxidation. As the conductive material having a function of inhibiting diffusion of oxygen, for example, titanium, titanium nitride, tantalum, tantalum nitride, ruthenium, ruthenium oxide, or the like is preferably used. Thus, the conductor 205*a* is a single layer or stacked layers of the above conductive materials. For example, titanium nitride is used for the conductor 205*a*.

For the conductor 205*b*, a conductive material containing tungsten, copper, or aluminum as its main component is preferably used. For example, tungsten is used for the conductor 205*b*.

The conductor 260 sometimes functions as a first gate (also referred to as top gate) electrode. The conductor 205 sometimes functions as a second gate (also referred to as bottom gate) electrode. In that case, by changing a potential applied to the conductor 205 not in synchronization with but independently of a potential applied to the conductor 260, Vth of the transistor 200A can be controlled. In particular, by application of a negative potential to the conductor 205, Vth of the transistor 200A can be higher than 0 V and the off-state current can be made low. Thus, drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. In particular, it is preferable that the conductor 205 extend beyond an end portion of the metal oxide 230 that intersects with the channel width direction, as illustrated in FIG. 19C. In other words, the conductor 205 and the conductor 260 preferably overlap with each other with the insulator placed therebetween, in a region outside the side surface of the metal oxide 230 in the channel width direction.

With the above structure, the channel formation region of the metal oxide 230 can be electrically surrounded by an electric field of the conductor 260 functioning as the first gate electrode and an electric field of the conductor 205 functioning as the second gate electrode.

As illustrated in FIG. 19C, the conductor 205 extends to function as a wiring as well. However, without limitation to this structure, a structure in which a conductor functioning as a wiring is provided below the conductor 205 may be employed.

The insulator 214 preferably functions as a barrier insulating film that inhibits entry of an impurity such as water or hydrogen into the transistor 200A from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the impurities are less likely to pass). Alternatively, it is preferable to use an insulating material having a function of inhibiting diffusion of oxygen (e.g., at least one of an oxygen atom and an oxygen molecule) (an insulating material through which the oxygen is less likely to pass).

For example, aluminum oxide or silicon nitride is preferably used for the insulator 214. Accordingly, it is possible to inhibit diffusion of an impurity such as water or hydrogen to the transistor 200A side from the substrate side through the insulator 214. Alternatively, it is possible to inhibit diffusion of oxygen contained in the insulator 224 and the like to the substrate side through the insulator 214.

The permittivity of each of the insulator 216, the insulator 280, and the insulator 281 functioning as an interlayer film is preferably lower than that of the insulator 214. When a material with a low permittivity is used for an interlayer film, the parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 function as a gate insulator.

Here, the insulator 224 in contact with the metal oxide 230 preferably releases oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 200A.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably within the range of 100° C. to 700° C. or 100° C. to 400° C.

As illustrated in FIG. 19C, the insulator 224 in a region overlapping with neither the insulator 254 nor the metal oxide 230*b* sometimes has a smaller thickness than that in the other regions. In the insulator 224, the region overlapping with neither the insulator 254 nor the metal oxide 230*b* preferably has a thickness with which the above oxygen can be adequately diffused.

Like the insulator 214 and the like, the insulator 222 preferably functions as a barrier insulating film that inhibits entry of an impurity such as water or hydrogen into the transistor 200A from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, entry of an impurity such as water or hydrogen into the transistor 200A from the outside can be inhibited.

Furthermore, it is preferable that the insulator 222 have a function of inhibiting diffusion of oxygen (e.g., at least one of an oxygen atom and an oxygen molecule) (it is preferable that the oxygen be less likely to pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 230 is less likely to diffuse to the substrate side. Moreover, the conductor 205 can be inhibited from reacting with oxygen contained in the insulator 224 or the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer inhibiting release of oxygen from the metal oxide 230 and entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over any of the above insulators.

The insulator 222 may be a single layer or a stacked layer using an insulator containing what is called a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST). With scaling down and higher integration of transistors, a problem such as leakage current may arise because of a thinned gate insulator. When a high-k material is used for the insulator functioning as a gate insulator, a gate potential at the time of the operation of the transistor can be reduced while the physical thickness is maintained.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230*a*, the metal oxide 230*b* over the metal oxide 230*a*, and the metal oxide 230*c* over the metal oxide 230*b*. Since the metal oxide 230*a* under the metal oxide 230*b* is provided, it is possible to inhibit diffusion of impurities into the metal oxide 230*b* from the components formed below the metal oxide 230*a*. Moreover, since the metal oxide 230*c* over the metal oxide 230*b* is included, it is possible to inhibit diffusion of impurities into the metal oxide 230*b* from the components formed above the metal oxide 230*c*.

Note that the metal oxide 230 preferably has a stacked-layer structure of a plurality of oxide layers that differ in the atomic ratio of metal atoms. For example, in the case where the metal oxide 230 contains at least indium (In) and the element M, the proportion of the number of atoms of the element M contained in the metal oxide 230*a* to the number of atoms of all elements that constitute the metal oxide 230*a* is preferably higher than the proportion of the number of atoms of the element M contained in the metal oxide 230*b* to the number of atoms of all elements that constitute the metal oxide 230*b*. In addition, the atomic ratio of the element M to In in the metal oxide 230*a* is preferably greater than the atomic ratio of the element M to In in the metal oxide 230*b*. Here, a metal oxide that can be used as the metal oxide 230*a* or the metal oxide 230*b* can be used as the metal oxide 230*c*.

The energy of the conduction band minimum of each of the metal oxide 230*a* and the metal oxide 230*c* is preferably higher than the energy of the conduction band minimum of the metal oxide 230*b*. In other words, the electron affinity of each of the metal oxide 230*a* and the metal oxide 230*c* is preferably smaller than the electron affinity of the metal oxide 230*b*. In this case, a metal oxide that can be used as the metal oxide 230*a* is preferably used as the metal oxide 230*c*. Specifically, the proportion of the number of atoms of the element M contained in the metal oxide 230*c* to the number of atoms of all elements that constitute the metal oxide 230*c* is preferably higher than the proportion of the number of atoms of the element M contained in the metal oxide 230*b* to the number of atoms of all elements that constitute the metal oxide 230*b*. In addition, the atomic ratio of the element M to In in the metal oxide 230*c* is preferably greater than the atomic ratio of the element M to In in the metal oxide 230*b*.

Here, the energy level of the conduction band minimum gently changes at junction portions between the metal oxide 230*a*, the metal oxide 230*b*, and the metal oxide 230*c*. In other words, at the junction portions between the metal oxide 230*a*, the metal oxide 230*b*, and the metal oxide 230*c*, the energy level of the conduction band minimum continuously changes or the energy levels are continuously connected. This can be achieved by decreasing the densities of defect states in mixed layers formed at the interface between the metal oxide 230*a* and the metal oxide 230*b* and the interface between the metal oxide 230*b* and the metal oxide 230*c*.

Specifically, when the metal oxide 230*a* and the metal oxide 230*b* or the metal oxide 230*b* and the metal oxide 230*c* contain the same element (as a main component) in addition to oxygen, a mixed layer with a low density of defect states can be formed. For example, an In—Ga—Zn oxide, a Ga—Zn oxide, gallium oxide, or the like may be used as the metal oxide 230*a* and the metal oxide 230*c*, in the case where the metal oxide 230*b* is an In—Ga—Zn oxide. The metal oxide 230*c* may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230*c* may have a stacked-layer structure of an In—Ga—Zn oxide and an oxide that does not contain In.

Specifically, as the metal oxide 230*a*, a metal oxide with In:Ga:Zn=1:3:4 [atomic ratio] or 1:1:0.5 [atomic ratio] can be used. As the metal oxide 230*b*, a metal oxide with In:Ga:Zn=4:2:3 [atomic ratio] or 3:1:2 [atomic ratio] can be used. As the metal oxide 230*c*, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 230*c* include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 230*b* serves as a main carrier path. When the metal oxide 230*a* and the metal oxide 230*c* have the above structure, the densities of defect states at the interface between the metal oxide 230*a* and the metal oxide 230*b* and the interface between the metal oxide 230*b* and the metal oxide 230*c* can be made low. This reduces the influence of interface scattering on carrier conduction, and the transistor 200A can have a high on-state current and high frequency characteristics. Note that in the case where the metal oxide 230*c* has a stacked-layer structure, not only the effect of reducing the density of defect states at the interface between the metal oxide 230*b* and the metal oxide 230*c*, but also the effect of inhibiting diffusion of the constituent elements contained in the metal oxide 230*c* to the insulator 250 side can be expected. Specifically, the metal oxide 230*c* has a stacked-layer structure in which an oxide not containing In is positioned in the upper layer of the stacked-layer structure, whereby the diffusion of In to the insulator 250 side can be inhibited. Since the insulator 250 functions as a gate insulator, the transistor has defects in characteristics when In diffuses. Thus, the metal oxide 230*c* having a stacked-layer structure allows a highly reliable display device to be provided.

The conductor 242 (the conductor 242*a* and the conductor 242*b*) functioning as the source electrode and the drain electrode is provided over the metal oxide 230*b*. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region in the metal oxide 230 in the vicinity of the conductor 242 increases, and the region becomes a low-resistance region.

Here, the region between the conductor 242*a* and the conductor 242*b* is formed to overlap with the opening of the insulator 280. Accordingly, the conductor 260 can be placed in a self-aligned manner between the conductor 242*a* and the conductor 242*b*.

The insulator 250 functions as a gate insulator. The insulator 250 is preferably placed in contact with the top surface of the metal oxide 230*c*. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of an impurity such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Accordingly, a gate potential applied during the operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although the conductor 260 is illustrated to have a two-layer structure in FIG. 19, the conductor 260 may have a single-layer structure or a stacked-layer structure of three or more layers.

The conductor 260*a* is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom and an oxygen molecule).

When the conductor 260*a* has a function of inhibiting diffusion of oxygen, the conductivity of the conductor 260*b* can be inhibited from being lowered by oxidation due to oxygen contained in the insulator 250. As a conductive material having a function of inhibiting oxygen diffusion, for example, tantalum, tantalum nitride, ruthenium, ruthenium oxide, or the like is preferably used.

A conductive material containing tungsten, copper, or aluminum as its main component is preferably used for the conductor 260*b*. The conductor 260 also functions as a wiring and thus is preferably formed using a conductor having high conductivity. For example, a conductive material containing tungsten, copper, or aluminum as its main component can be used. The conductor 260*b* may have a stacked-layer structure, for example, a stacked-layer structure of titanium or titanium nitride and the above conductive material.

As illustrated in FIG. 19A and FIG. 19C, the side surface of the metal oxide 230 is covered with the conductor 260 in a region where the metal oxide 230*b* does not overlap with the conductor 242, that is, the channel formation region of the metal oxide 230. Accordingly, an electric field of the conductor 260 functioning as the first gate electrode is likely to act on the side surface of the metal oxide 230. Thus, the on-state current of the transistor 200A can be increased and the frequency characteristics can be improved.

The insulator 254, like the insulator 214 and the like, preferably functions as a barrier insulating film that inhibits entry of an impurity such as water or hydrogen into the transistor 200A from the insulator 280 side. The insulator 254 preferably has a lower hydrogen permeability than the insulator 224, for example. Furthermore, as illustrated in FIG. 19B and FIG. 19C, the insulator 254 is preferably in contact with the side surface of the metal oxide 230*c*, the top and side surfaces of the conductor 242*a*, the top and side surfaces of the conductor 242*b*, the side surfaces of the metal oxide 230*a* and the metal oxide 230*b*, and the top surface of the insulator 224. Such a structure can inhibit entry of hydrogen contained in the insulator 280 into the metal oxide 230 through the top surfaces or side surfaces of the conductor 242*a*, the conductor 242*b*, the metal oxide 230*a*, the metal oxide 230*b*, and the insulator 224.

Furthermore, it is preferable that the insulator 254 have a function of inhibiting diffusion of oxygen (e.g., at least one of an oxygen atom and an oxygen molecule) (it is preferable that the oxygen be less likely to pass through the insulator 254). For example, the insulator 254 preferably has a lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward diffusion of oxygen, oxygen can be prevented from diffusing from the metal oxide 230 into the insulator 280. Moreover, with the insulator 222 having a function of inhibiting downward diffusion of oxygen, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be inhibited from having normally-on characteristics.

As the insulator 254, an insulator containing an oxide of one or both of aluminum and hafnium is preferably formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This can inhibit entry of impurities such as hydrogen from the outside of the transistor 200A, resulting in excellent electrical characteristics and high reliability of the transistor 200A.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. In particular, materials such as silicon oxide, silicon oxynitride, and porous silicon oxide are preferably used, in which case a region containing oxygen to be released by heating can be easily formed.

The concentration of an impurity such as water or hydrogen in the insulator 280 is preferably reduced. In addition, the top surface of the insulator 280 may be planarized.

Like the insulator 214 and the like, the insulator 274 preferably functions as a barrier insulating film that inhibits entry of an impurity such as water or hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of an impurity such as water or hydrogen in the insulator 281 is preferably reduced.

The conductor 240*a* and the conductor 240*b* are placed in openings formed in the insulator 281, the insulator 274, the insulator 280, and the insulator 254. The conductor 240*a* and the conductor 240*b* are provided to face each other with the conductor 260 therebetween. Note that the top surfaces of the conductor 240*a* and the conductor 240*b* may be level with the top surface of the insulator 281.

The insulator 241*a* is provided in contact with the inner wall of the opening in the insulator 281, the insulator 274, the insulator 280, and the insulator 254, and the first conductor of the conductor 240*a* is formed in contact with the side surface of the insulator 241*a*. The conductor 242*a* is positioned on at least part of the bottom portion of the opening, and the conductor 240*a* is in contact with the conductor 242*a*. Similarly, the insulator 241*b* is provided in contact with the inner wall of the opening in the insulator 281, the insulator 274, the insulator 280, and the insulator 254, and the first conductor of the conductor 240*b* is formed in contact with the side surface of the insulator 241*b*. The conductor 242*b* is positioned on at least part of the bottom portion of the opening, and the conductor 240*b* is in contact with the conductor 242*b*.

The conductor 240*a* and the conductor 240*b* are preferably formed using a conductive material containing tungsten, copper, or aluminum as its main component. The conductor 240*a* and the conductor 240*b* may each have a stacked-layer structure.

In the case where the conductor 240 has a stacked-layer structure, the aforementioned conductor having a function of inhibiting diffusion of an impurity such as water or hydrogen is preferably used as the conductor in contact with the metal oxide 230*a*, the metal oxide 230*b*, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of an impurity such as water or hydrogen can be used as a single layer or stacked layers. The use of the conductive material can inhibit oxygen added to the insulator 280 from being absorbed by the conductor 240*a* and the conductor 240*b*. Moreover, an impurity such as water or hydrogen can be inhibited from entering the metal oxide 230 through the conductor 240*a* and the conductor 240*b* from a layer above the insulator 281.

As the insulator 241*a* and the insulator 241*b*, for example, the insulator that can be used as the insulator 254 or the like can be used. Since the insulator 241*a* and the insulator 241*b* are provided in contact with the insulator 254, an impurity such as water or hydrogen in the insulator 280 or the like can be inhibited from entering the metal oxide 230 through the conductor 240*a* and the conductor 240*b*. Furthermore, oxygen contained in the insulator 280 can be inhibited from being absorbed by the conductor 240*a* and the conductor 240*b*.

Although not illustrated, a conductor functioning as a wiring may be placed in contact with the top surface of the conductor 240*a* and the top surface of the conductor 240*b*. For the conductor functioning as a wiring, a conductive material containing tungsten, copper, or aluminum as its main component is preferably used. Furthermore, the conductor may have a stacked-layer structure and may be a stack of titanium or titanium nitride and the above conductive material, for example. Note that the conductor may be formed to be embedded in an opening provided in an insulator.

<Materials for Transistor>

Materials that can be used for the transistor are described.

[Substrate]

As a substrate where the transistor 200A is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With scaling down and higher integration of transistors, for example, a problem such as leakage current may arise because of a thinned gate insulator. When a high-k material is used for the insulator functioning as a gate insulator, the voltage at the time of the operation of the transistor can be reduced while the physical thickness is maintained. By contrast, when a material with a low dielectric constant is used for the insulator functioning as an interlayer film, the parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting the passage of oxygen and impurities such as hydrogen (e.g., the insulator 214, the insulator 222, the insulator 254, and the insulator 274), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, when a structure is employed in which silicon oxide or silicon oxynitride that includes a region containing oxygen to be released by heating is provided in contact with the metal oxide 230, oxygen vacancies included in the metal oxide 230 can be filled.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably has a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

At least part of this embodiment can be implemented in combination with the other embodiments described in this specification as appropriate.

Embodiment 9

Described in this embodiment is a metal oxide (hereinafter, also referred to as an oxide semiconductor) that can be used in the OS transistor described in the above embodiment.

<Classification of Crystal Structures>

First, the classification of the crystal structures of an oxide semiconductor will be described with reference to FIG. 20A. FIG. 20A is a diagram showing the classification of the crystal structures of an oxide semiconductor, typically IGZO (a metal oxide containing In, Ga, and Zn).

As shown in FIG. 20A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame shown in FIG. 20A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 20B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 20B and obtained by GIXD measurement is hereinafter simply referred to as an XRD spectrum. The CAAC-IGZO film in FIG. 20B has a composition in the neighborhood of In:Ga:Zn=4:2:3 [atomic ratio]. The CAAC-IGZO film in FIG. 20B has a thickness of 500 nm.

As shown in FIG. 20B, a clear peak indicating crystallinity is observed in the XRD spectrum of the CAAC-IGZO film. Specifically, a peak indicating c-axis alignment is detected at 2θ of around 31° in the XRD spectrum of the CAAC-IGZO film. As shown in FIG. 20B, the peak at 2θ of around 310 is asymmetric with the angle at which the peak intensity is detected as the axis.

A crystal structure of a film or a substrate can also be evaluated with a diffraction pattern obtained by a nanobeam electron diffraction method (NBED) (such a pattern is also referred to as a nanobeam electron diffraction pattern). FIG. 20C shows a diffraction pattern of the CAAC-IGZO film. FIG. 20C shows a diffraction pattern obtained by the NBED method in which an electron beam is incident in the direction parallel to the substrate. The CAAC-IGZO film in FIG. 20C has a composition in the neighborhood of In:Ga:Zn=4:2:3 [atomic ratio]. In the nanobeam electron diffraction method, electron diffraction is performed with a probe diameter of 1 nm.

As shown in FIG. 20C, a plurality of spots indicating c-axis alignment are observed in the diffraction pattern of the CAAC-IGZO film.

[Structure of Oxide Semiconductor]

Oxide semiconductors might be classified in a manner different from that in FIG. 20A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at or around 2θ of 31°. Note that the position of the peak indicating c-axis alignment (the value of 2θ) may change depending on the kind, composition, or the like of the metal elements contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like is included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear grain boundary is observed is what is called polycrystal. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has a small amount of impurities or defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

[Composition of Oxide Semiconductor]

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS functions as a semiconductor. Separation of the conducting function and the insulating function can maximize each function. Accordingly, when the CAC-OS is used for a transistor, a high on-state current ($I_{on}$), high field-effect mobility (μ), and excellent switching operation can be achieved.

An oxide semiconductor can have any of various structures that show different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the oxide semiconductor is used for a transistor will be described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, the impurity concentration in an adjacent film is also preferably reduced. Examples of impurities include hydrogen, nitrogen, alkali metal, alkaline earth metal, iron, nickel, and silicon.

<Impurity>

Here, the influence of impurities in the oxide semiconductor will be described.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by SIMS) are each set lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor using an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. As a result, a transistor using, as a semiconductor, an oxide semiconductor containing nitrogen tends to have normally-on characteristics. When nitrogen is contained in the oxide semiconductor, a trap state is sometimes formed. This might make the electrical characteristics of the transistor unstable. Thus, the nitrogen concentration in the oxide semiconductor, which is obtained by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen tends to have normally-on characteristics. For this reason, hydrogen in the oxide semiconductor is preferably reduced as much as possible. Specifically, the hydrogen concentration in the oxide semiconductor, which is obtained by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, stable electrical characteristics can be given.

At least part of this embodiment can be implemented in combination with the other embodiments described in this specification as appropriate.

Embodiment 10

In this embodiment, electronic devices each including the display device and the display system of one embodiment of the present invention will be described.

Figure 21A:
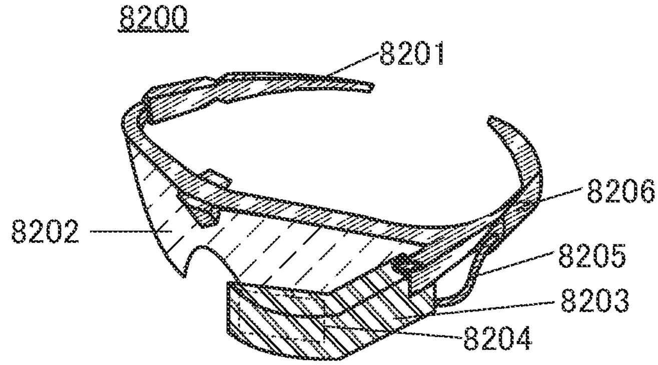
FIG. 21A to FIG. 21D are diagrams illustrating electronic devices according to an embodiment.

FIG. 21A is a diagram illustrating an external view of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies electric power from the battery 8206 to the main body 8203. The main body 8203 includes a wireless receiver or the like and can display an image corresponding to the received image data or the like on the display portion 8204. The movement of the eyeball and the eyelid of the user can be captured by a camera provided in the main body 8203 and then coordinates of the sight line of the user can be calculated using the information to utilize the sight line of the user as an input means.

A plurality of electrodes may be provided in the wearing portion 8201 at a position in contact with the user. The main body 8203 may have a function of sensing current flowing through the electrodes along with the movement of the user's eyeball to recognize the user's sight line. The main body 8203 may have a function of sensing current flowing through the electrodes to monitor the user's pulse. The wearing portion 8201 may include various sensors such as a temperature sensor, a pressure sensor, and an acceleration sensor to have a function of displaying the user's biological information on the display portion 8204. The main body 8203 may sense the movement of the user's head or the like to change an image displayed on the display portion 8204 in synchronization with the movement.

The display device of one embodiment of the present invention can be used in the display portion 8204. Thus, the power consumption of the head-mounted display 8200 can be reduced, so that the head-mounted display 8200 can be used continuously for a long time. The power consumption of the head-mounted display 8200 can be reduced, which allows the battery 8206 to be downsized and lighter and accordingly allows the head-mounted display 8200 to be downsized and lighter. Thus, a burden of the user of the head-mounted display 8200 can be reduced, and the user is less likely to feel fatigue.

Figure 21B:
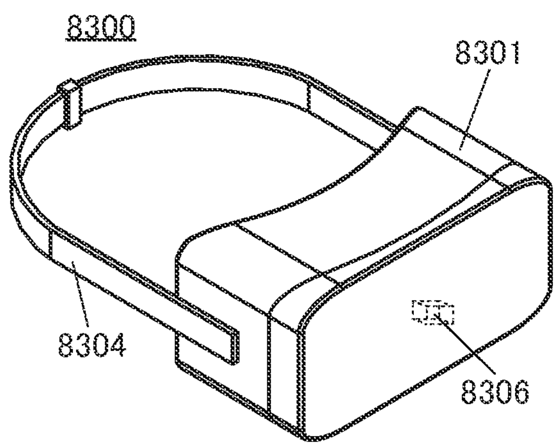
Figure 21C:
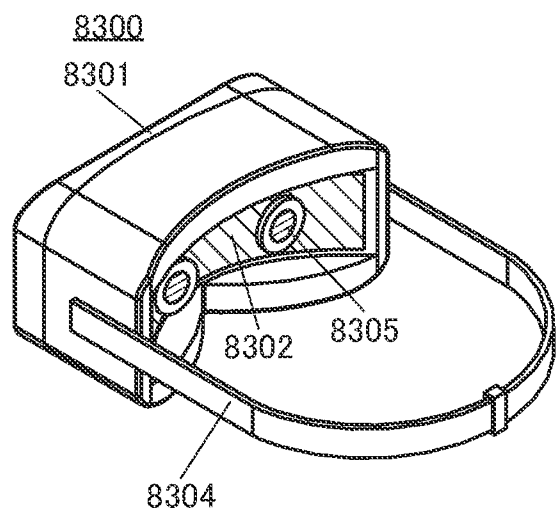
Figure 21D:
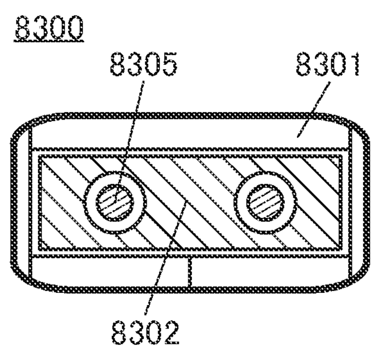

FIG. 21B, FIG. 21C, and FIG. 21D are external views of a head-mounted display 8300. The head-mounted display 8300 includes a housing 8301, a display portion 8302, a fixing band 8304, and a pair of lenses 8305. A battery 8306 is incorporated in the housing 8301, and electric power can be supplied from the battery 8306 to the display portion 8302 and the like.

A user can see display on the display portion 8302 through the lenses 8305. It is suitable that the display portion 8302 be curved and placed. When the display portion 8302 is curved and placed, a user can feel a high realistic sensation. Note that although the structure in which one display portion 8302 is provided is described in this embodiment as an example, the structure is not limited thereto, and a structure in which two display portions 8302 are provided may also be employed. In that case, one display portion is placed for one eye of the user, so that three-dimensional display using parallax or the like is possible.

The display device of one embodiment of the present invention can be used in the display portion 8302. Thus, the power consumption of the head-mounted display 8300 can be reduced, so that the head-mounted display 8300 can be used continuously for a long time. The power consumption of the head-mounted display 8300 can be reduced, which allows the battery 8306 to be downsized and lighter and accordingly allows the head-mounted display 8300 to be downsized and lighter. Thus, a burden of the user of the head-mounted display 8300 can be reduced, and the user is less likely to feel fatigue.

Figure 22A:
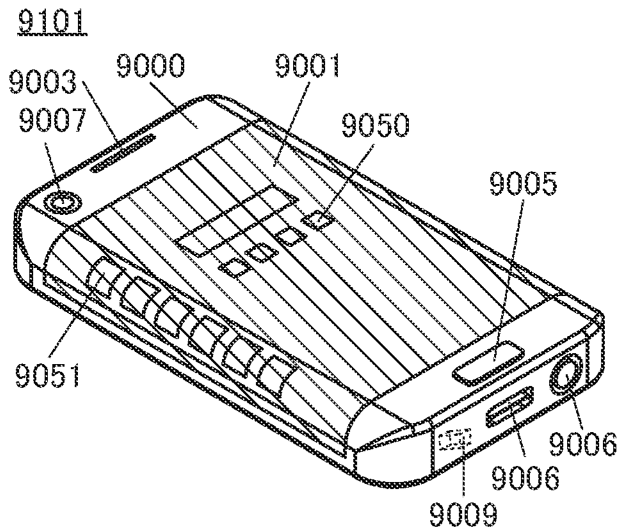
FIG. 22A and FIG. 22B are diagrams illustrating electronic devices according to an embodiment.
Figure 22B:
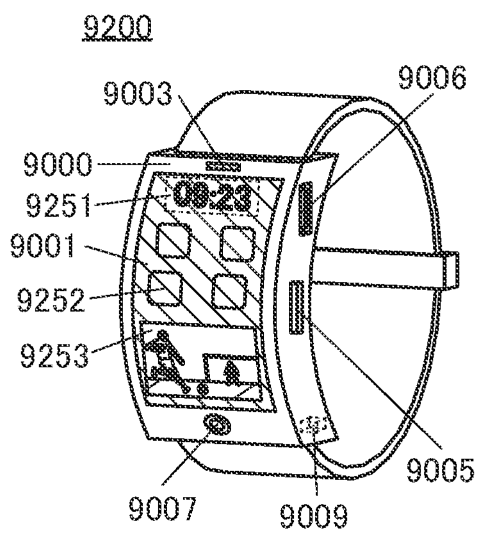

Next, FIG. 22A and FIG. 22B illustrate examples of electronic devices that are different from the electronic devices illustrated in FIG. 21A to FIG. 21D.

Electronic devices illustrated in FIG. 22A and FIG. 22B include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a battery 9009, and the like.

The electronic devices illustrated in FIG. 22A and FIG. 22B have a variety of functions. Examples of the functions include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 22A and FIG. 22B are not limited thereto, and the electronic devices can have a variety of functions. Although not illustrated in FIG. 22A and FIG. 22B, the electronic devices may each include a plurality of display portions. The electronic devices may each include a camera and the like and have a function of taking a still image, a function of taking a moving image, a function of storing the taken image in a memory medium (externally attached or incorporated in the camera), a function of displaying the taken image on the display portion, and the like.

The details of the electronic devices illustrated in FIG. 22A and FIG. 22B are described below.

FIG. 22A is a perspective view illustrating a portable information terminal 9101. The portable information terminal 9101 has a function of, for example, one or more selected from a telephone set, a notebook, an information browsing system, and the like. Specifically, the portable information terminal can be used as a smartphone. The portable information terminal 9101 can display text or an image on its plurality of surfaces. For example, three operation buttons 9050 (also referred to as operation icons, or simply, icons) can be displayed on one surface of the display portion 9001. Information 9051 indicated by a dashed rectangular can be displayed on another surface of the display portion 9001. Examples of the information 9051 include display indicating reception of an e-mail, an SNS (social networking service), a telephone call, or the like; the title of an e-mail, an SNS, or the like; the sender of an e-mail, an SNS, or the like; the date; the time; remaining battery; and the reception strength of an antenna. Alternatively, the operation buttons 9050 or the like may be displayed on the position where the information 9051 is displayed, in place of the information 9051.

The display device of one embodiment of the present invention can be used for the portable information terminal 9101. Thus, the power consumption of the portable information terminal 9101 can be reduced, so that the portable information terminal 9101 can be used continuously for a long time. The power consumption of the portable information terminal 9101 can be reduced, which allows the battery 9009 to be downsized and lighter and accordingly allows the portable information terminal 9101 to be downsized and lighter. Thus, the portability of the portable information terminal 9101 can be increased.

FIG. 22B is a perspective view of a watch-type portable information terminal 9200. The portable information terminal 9200 can execute a variety of applications such as mobile phone calls, e-mailing, viewing and editing texts, music reproduction, Internet communication, and computer games. The display surface of the display portion 9001 is curved, and display can be performed on the curved display surface. FIG. 22B illustrates an example in which time 9251, operation buttons 9252 (also referred to as operation icons, or simply, icons), and a content 9253 are displayed on the display portion 9001. The content 9253 can be a moving image, for example.

The portable information terminal 9200 is capable of executing near field communication conformable to a communication standard. For example, mutual communication with a headset capable of wireless communication enables hands-free calling. The portable information terminal 9200 includes the connection terminal 9006, and data can be directly transmitted to and received from another information terminal via a connector. Power charging through the connection terminal 9006 is also possible. Note that the charging operation may be performed by wireless power feeding not through the connection terminal 9006.

The display device of one embodiment of the present invention can be used for the portable information terminal 9200. Thus, the power consumption of the portable information terminal 9200 can be reduced, so that the portable information terminal 9200 can be used continuously for a long time. The power consumption of the portable information terminal 9200 can be reduced, which allows the battery 9009 to be downsized and lighter and accordingly allows the portable information terminal 9200 to be downsized and lighter. Thus, the portability of the portable information terminal 9200 can be increased.

At least part of this embodiment can be implemented in combination with the other embodiments described in this specification as appropriate.

<Supplementary Notes on Description in this Specification and the Like>

The following are notes on the description of the foregoing embodiments and the structures in the embodiments.

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that a content (or part thereof) described in one embodiment can be applied to, combined with, or replaced with another content (or part thereof) in the same embodiment and/or a content (or part thereof) described in another embodiment or other embodiments, for example.

Note that in each embodiment, a content described in the embodiment is a content described with reference to a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions, and shown as blocks independent of one another in block diagrams. However, in an actual circuit and the like, such components are sometimes hard to classify functionally, and there is a case where one circuit is associated with a plurality of functions and a case where a plurality of circuits are associated with one function. Therefore, the blocks in the block diagrams are not limited by the components described in the specification, and the description can be changed appropriately depending on the situation.

In drawings, the size, the layer thickness, or the region is shown arbitrarily for description convenience. Therefore, the size, the layer thickness, or the region is not limited to the illustrated scale. Note that the drawings are schematically shown for clarity, and embodiments of the present invention are not limited to shapes, values, or the like shown in the drawings. For example, variation in signal, voltage, or current due to noise or variation in signal, voltage, or current due to difference in timing can be included.

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" and "wiring" also includes the case where a plurality of "electrodes" or "wirings" are formed in an integrated manner, for example.

In this specification and the like, voltage and potential can be replaced with each other as appropriate. The term voltage refers to a potential difference from a reference potential, and when the reference potential is a ground potential, for example, voltage can be replaced with potential. The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Also, for example, the term "insulating film" can be changed into the term "insulating layer" in some cases.

In this specification and the like, a switch is in a conduction state (on state) or in a non-conduction state (off state) to determine whether current flows therethrough or not. Alternatively, a switch has a function of selecting and changing a current path.

In this specification and the like, the channel length refers to, for example, the distance between a source and a drain in a region where a semiconductor (or a portion where current flows in a semiconductor when a transistor is on) and a gate overlap with each other or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate electrode overlap with each other or a region where a channel is formed.

In this specification and the like, the expression "A and B are connected" means the case where A and B are electrically connected to each other as well as the case where A and B are directly connected to each other. Here, the expression "A and B are electrically connected" means the case where electric signals can be transmitted and received between A and B when an object having any electric action exists between A and B.

EXAMPLE

In this example, a light-emitting device that can be used for the display device of one embodiment of the present invention will be described with reference to FIG. 23 to FIG. 39.

Figure 23A:
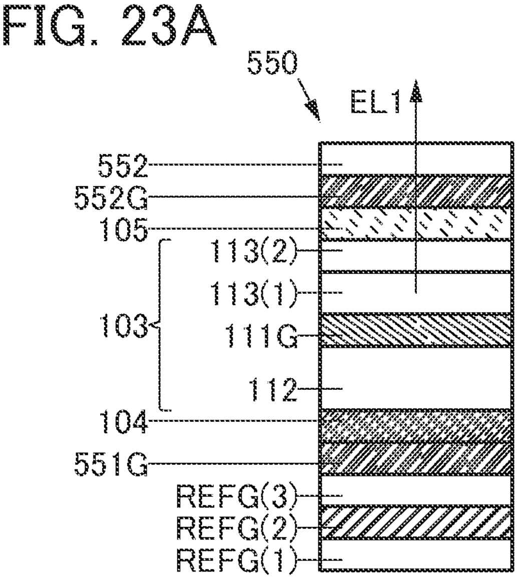
FIG. 23A and FIG. 23B are diagrams illustrating a structure of a light-emitting device according to an example.
Figure 23B:
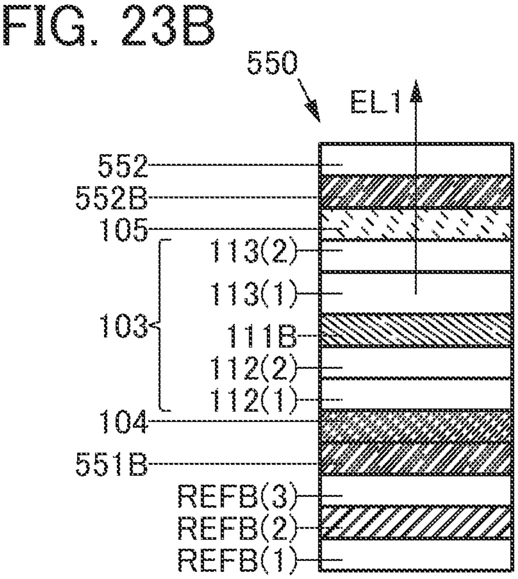

FIG. 23A and FIG. 23B are diagrams illustrating the structure of the light-emitting device 550.

Figure 24:
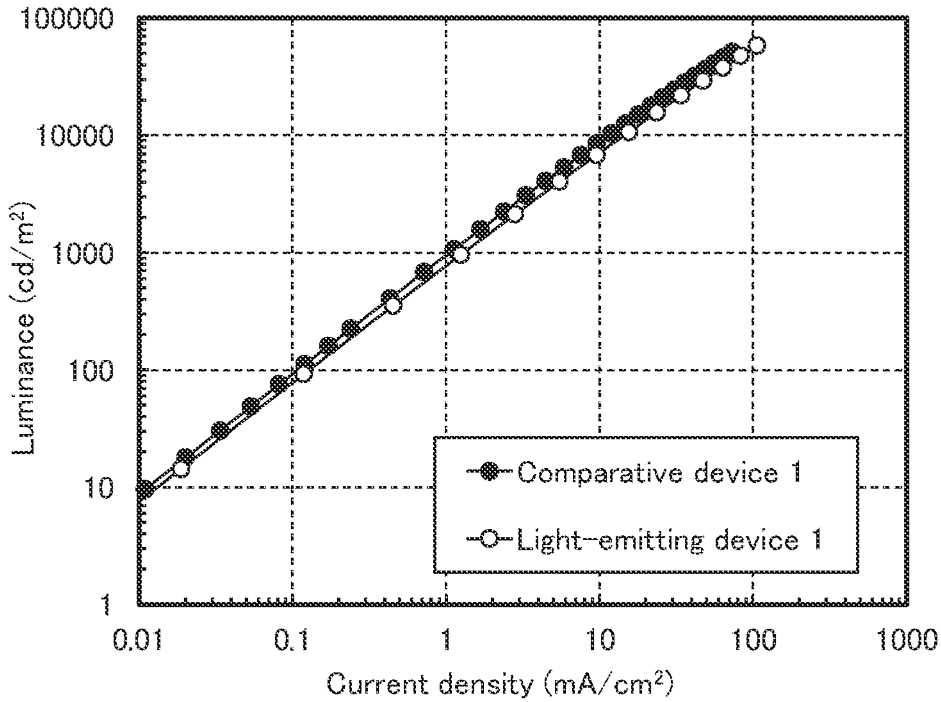
FIG. 24 is a graph showing current density-luminance characteristics of light-emitting devices according to an example.

FIG. 24 is a graph showing current density-luminance characteristics of a light-emitting device 1.

Figure 25:
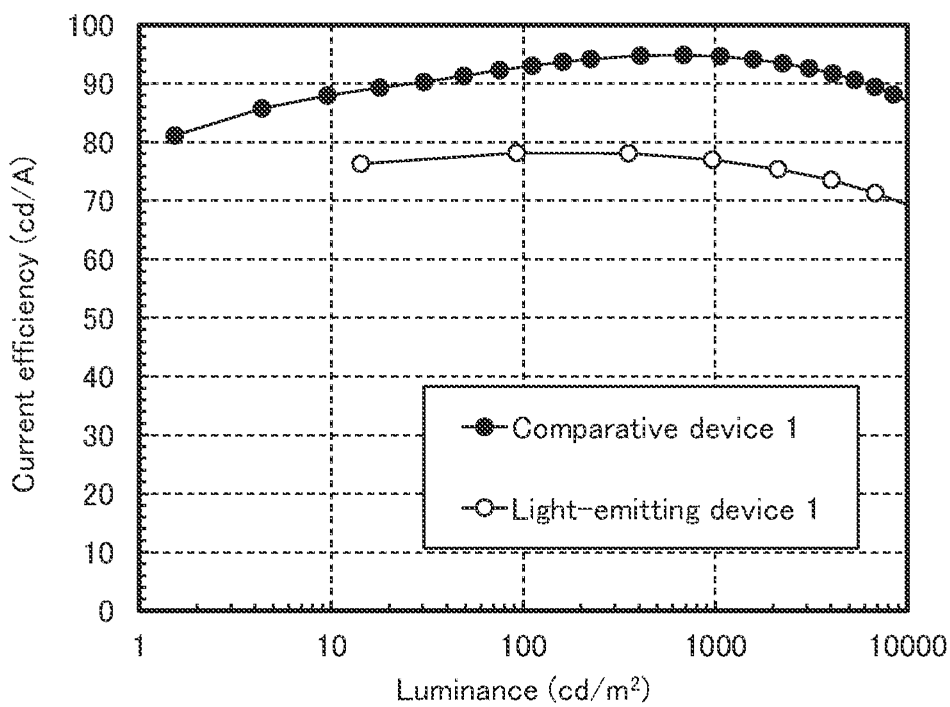
FIG. 25 is a graph showing luminance-current efficiency characteristics of light-emitting devices according to an example.

FIG. 25 is a graph showing luminance-current efficiency characteristics of the light-emitting device 1.

Figure 26:
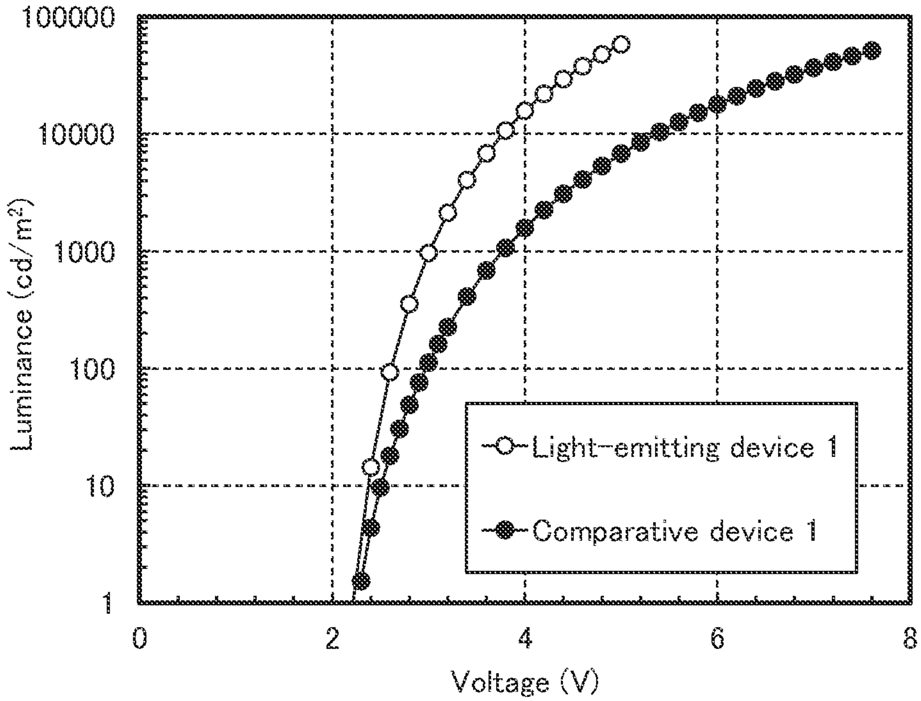
FIG. 26 is a graph showing voltage-luminance characteristics of light-emitting devices according to an example.

FIG. 26 is a graph showing voltage-luminance characteristics of the light-emitting device 1.

Figure 27:
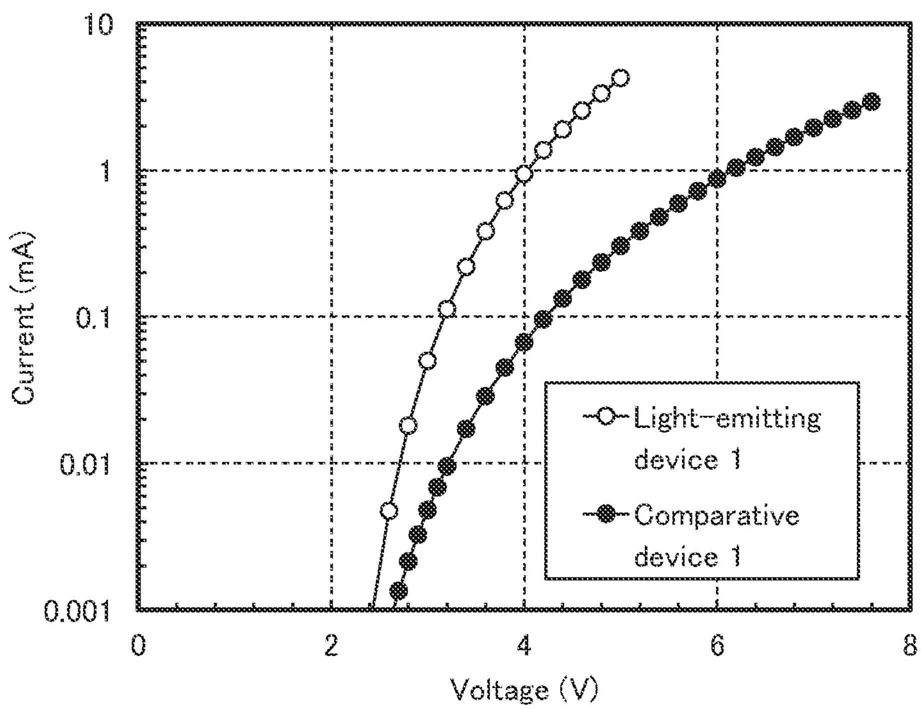
FIG. 27 is a graph showing voltage-current characteristics of light-emitting devices according to an example.

FIG. 27 is a graph showing voltage-current characteristics of the light-emitting device 1.

Figure 28:
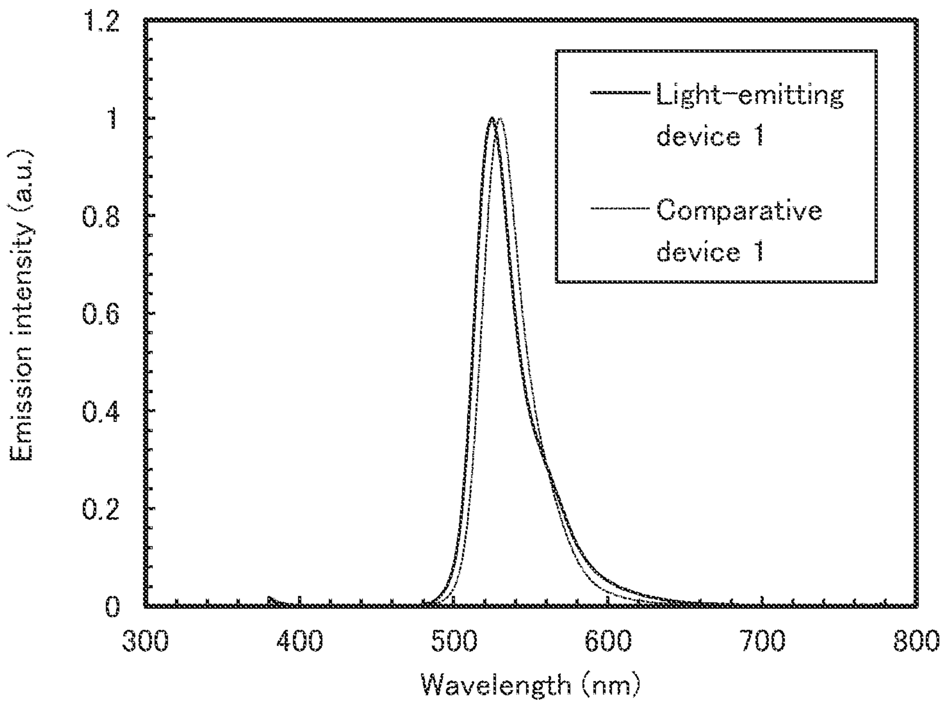
FIG. 28 is a graph showing emission spectra of light-emitting devices according to an example.

FIG. 28 is a graph showing an emission spectrum of the light-emitting device 1 emitting light at a luminance of 1000 cd/$m^2$.

Figure 29:
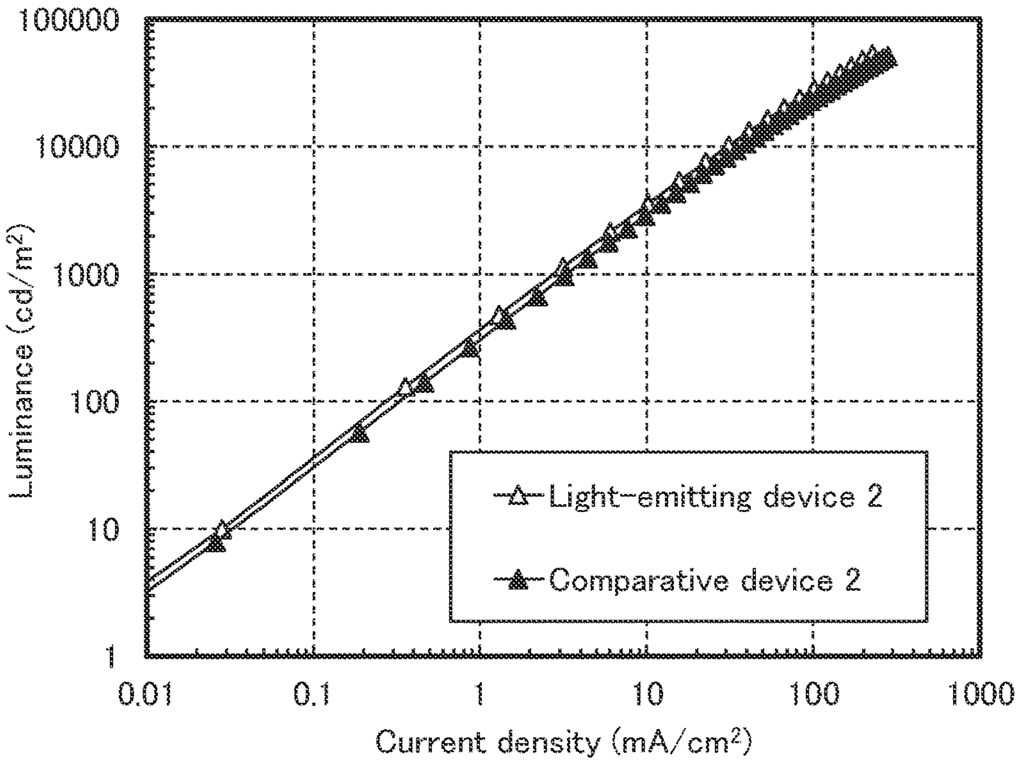
FIG. 29 is a graph showing current density-luminance characteristics of light-emitting devices according to an example.

FIG. 29 is a graph showing current density-luminance characteristics of a light-emitting device 2.

Figure 30:
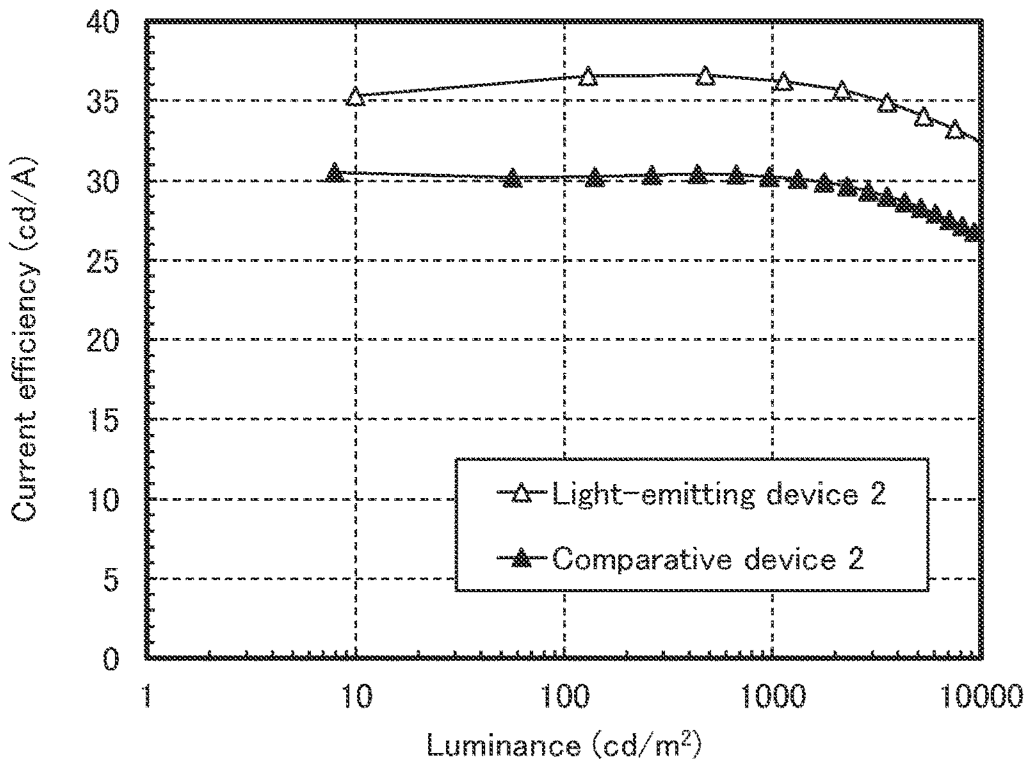
FIG. 30 is a graph showing luminance-current efficiency characteristics of light-emitting devices according to an example.

FIG. 30 is a graph showing luminance-current efficiency characteristics of the light-emitting device 2.

Figure 31:
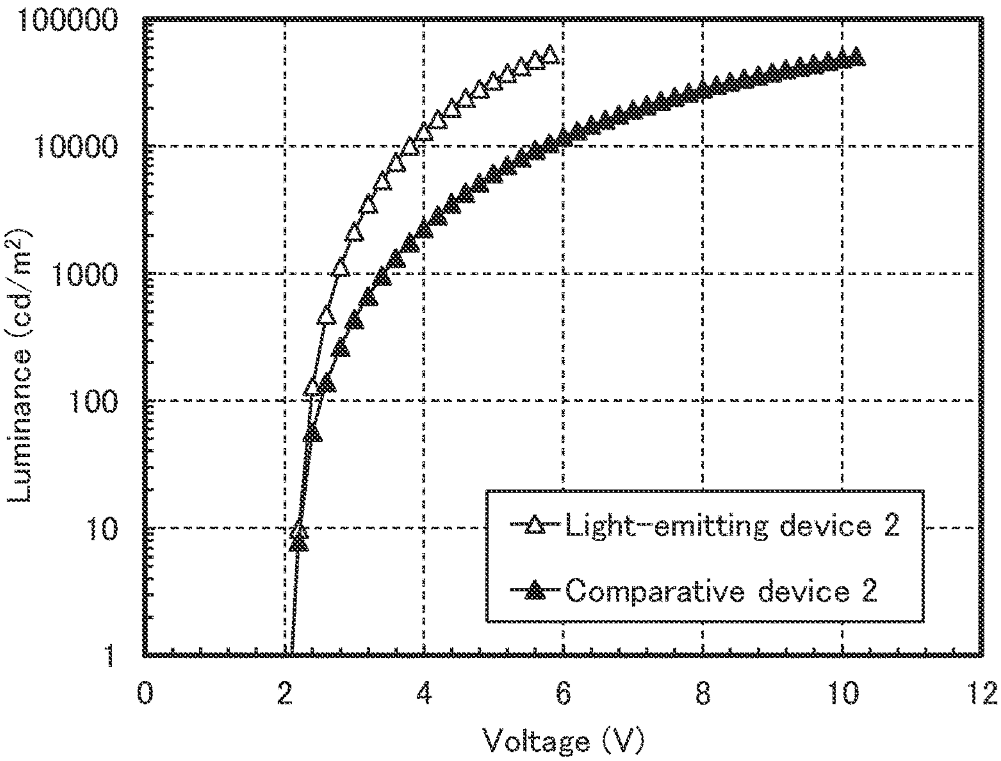
FIG. 31 is a graph showing voltage-luminance characteristics of light-emitting devices according to an example.

FIG. 31 is a graph showing voltage-luminance characteristics of the light-emitting device 2.

Figure 32:
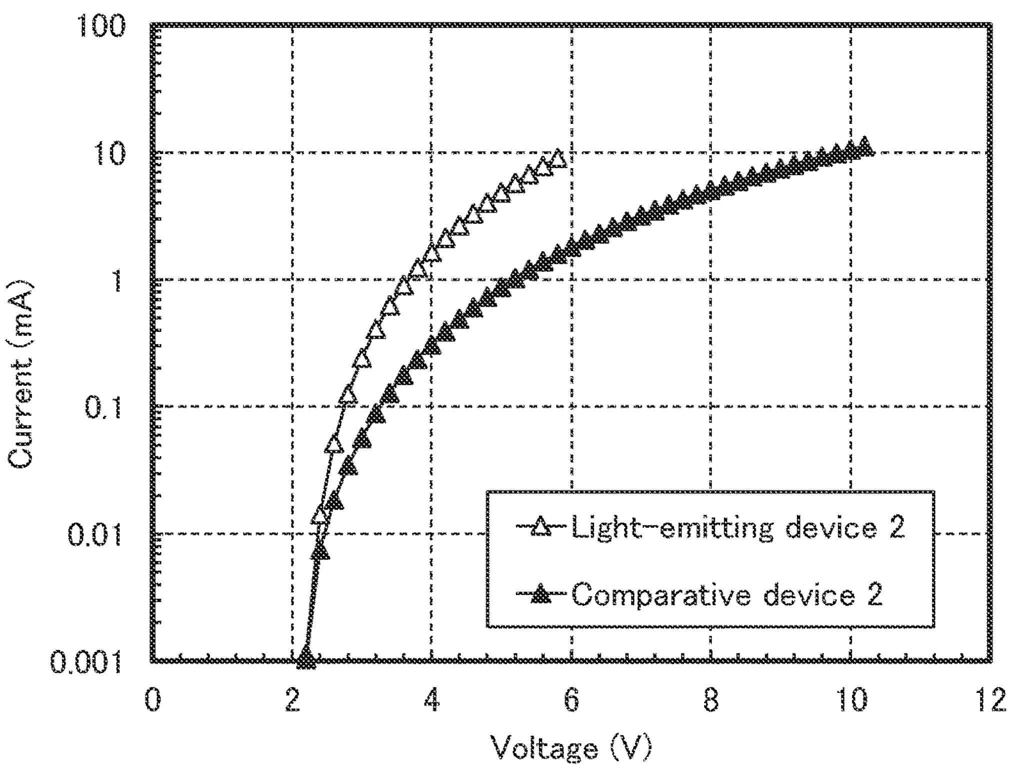
FIG. 32 is a graph showing voltage-current characteristics of light-emitting devices according to an example.

FIG. 32 is a graph showing voltage-current characteristics of the light-emitting device 2.

Figure 33:
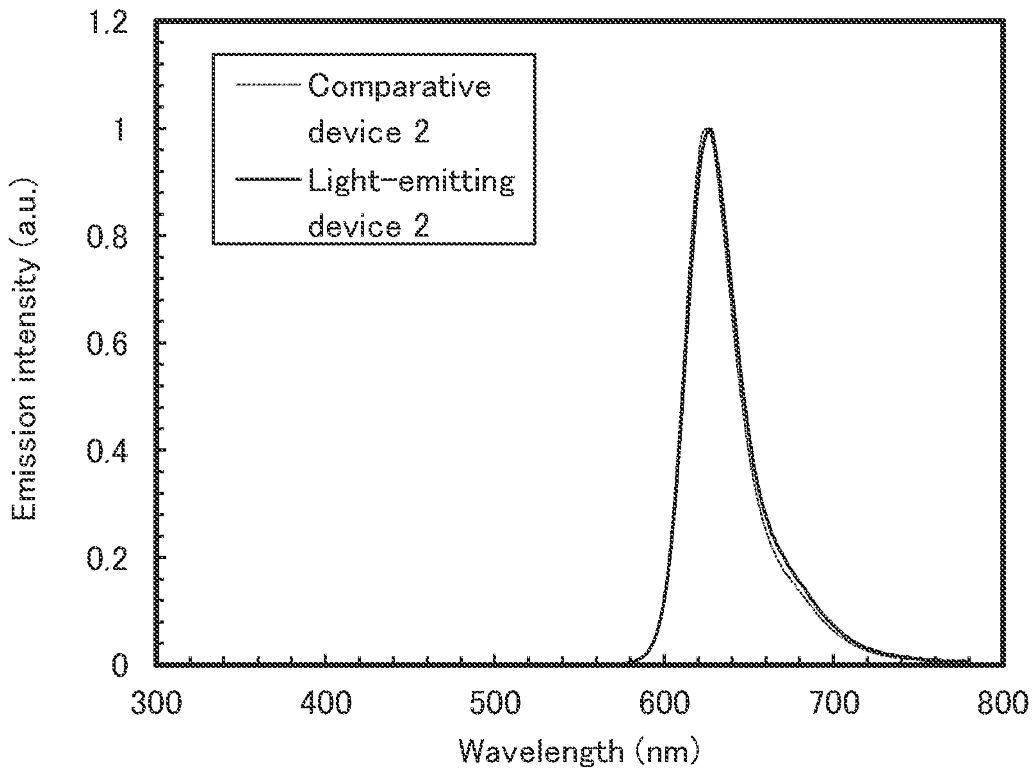
FIG. 33 is a graph showing emission spectra of light-emitting devices according to an example.

FIG. 33 is a graph showing an emission spectrum of the light-emitting device 2 emitting light at a luminance of 1000 cd/$m^2$.

Figure 34:
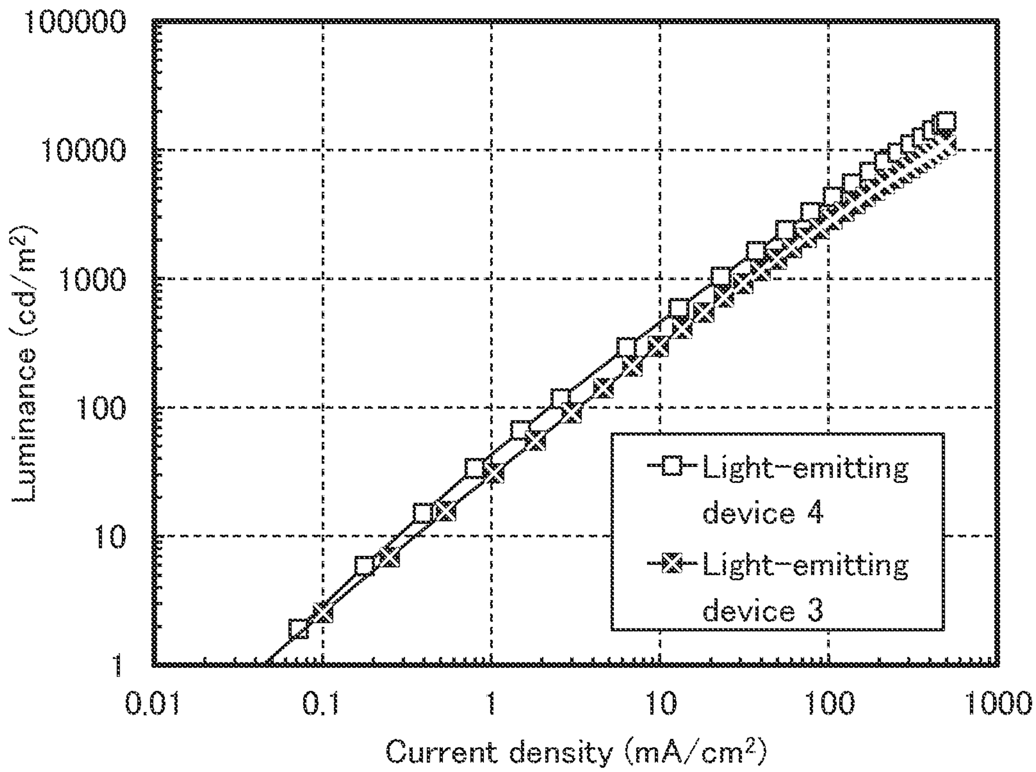
FIG. 34 is a graph showing current density-luminance characteristics of light-emitting devices according to an example.

FIG. 34 is a graph showing current density-luminance characteristics of a light-emitting device 3 and a light-emitting device 4.

Figure 35:
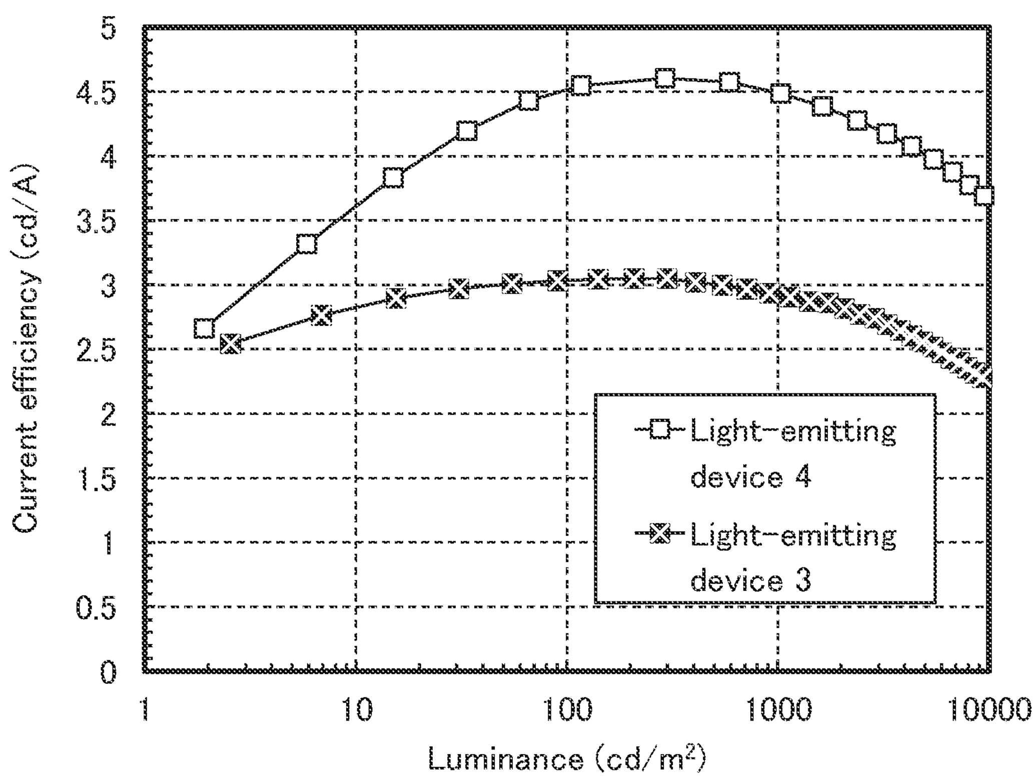
FIG. 35 is a graph showing luminance-current efficiency characteristics of light-emitting devices according to an example.

FIG. 35 is a graph showing luminance-current efficiency characteristics of the light-emitting device 3 and the light-emitting device 4.

Figure 36:
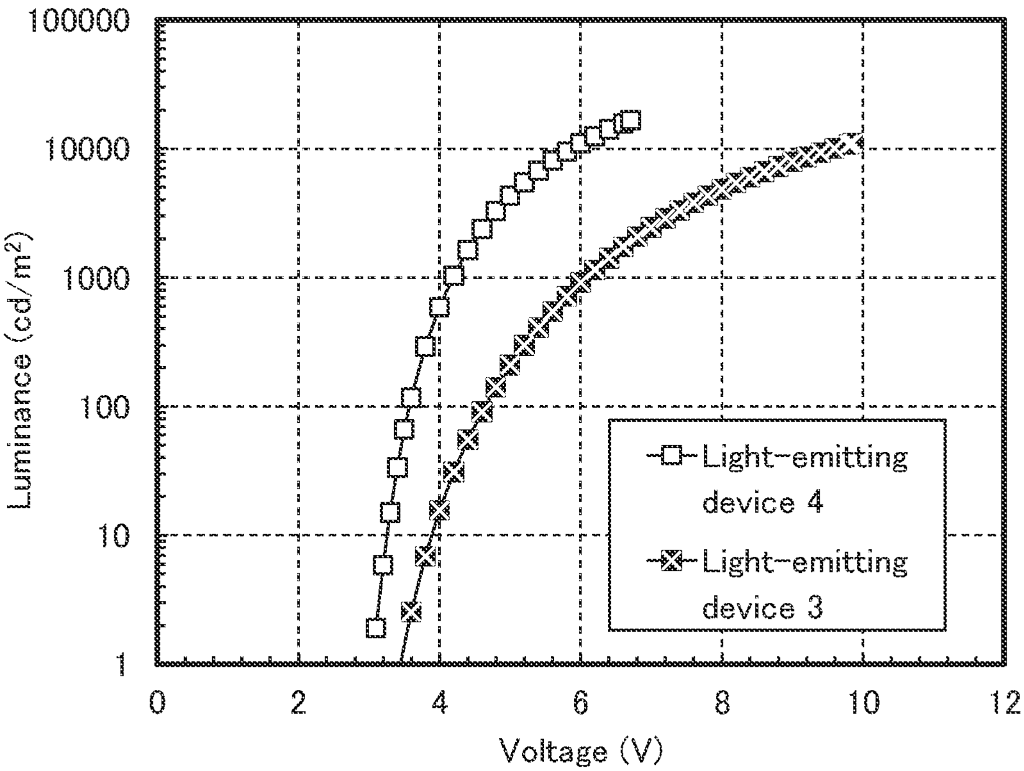
FIG. 36 is a graph showing voltage-luminance characteristics of light-emitting devices according to an example.

FIG. 36 is a graph showing voltage-luminance characteristics of the light-emitting device 3 and the light-emitting device 4.

Figure 37:
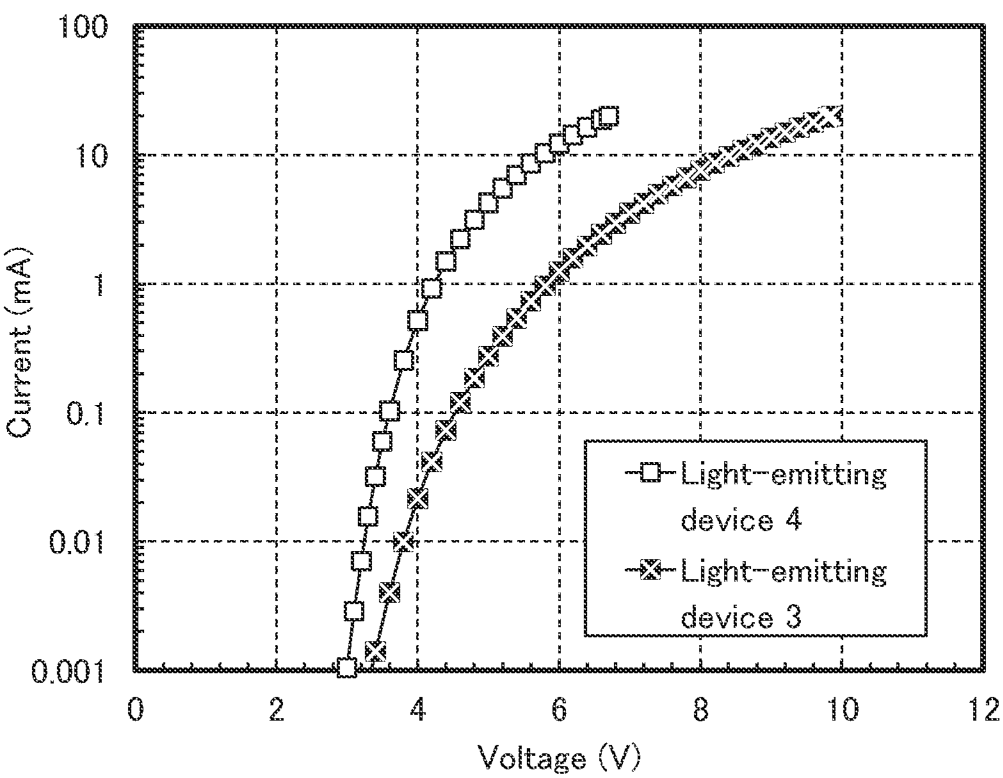
FIG. 37 is a graph showing voltage-current characteristics of light-emitting devices according to an example.

FIG. 37 is a graph showing voltage-current characteristics of the light-emitting device 3 and the light-emitting device 4.

Figure 38:
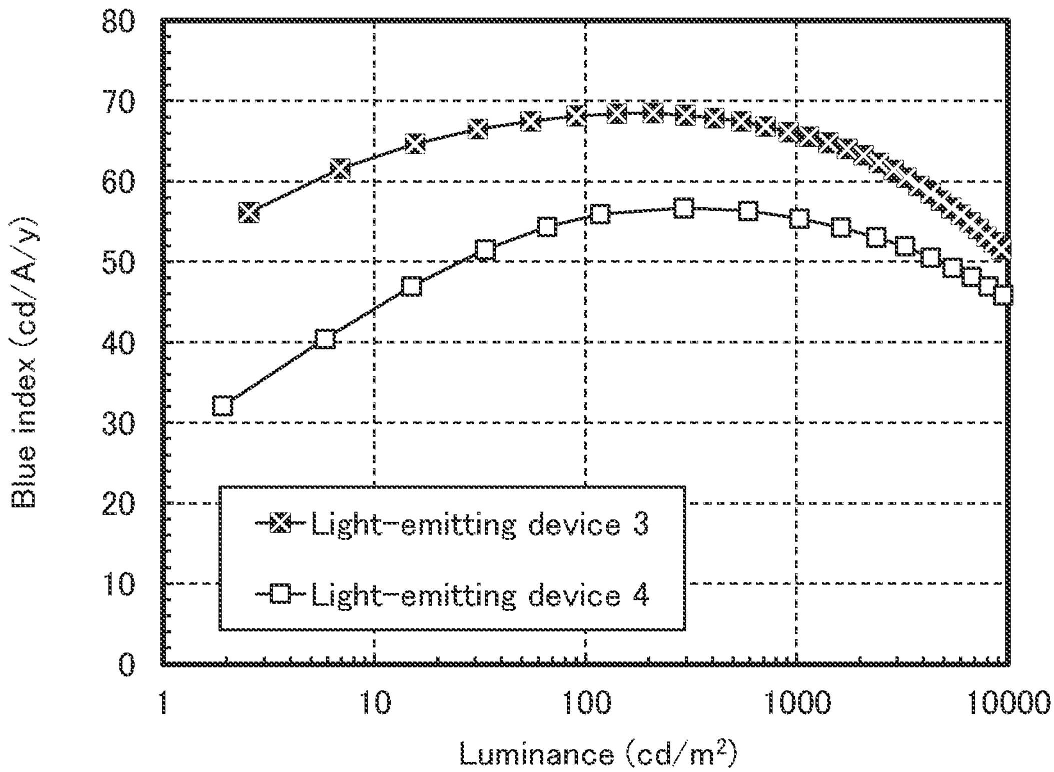
FIG. 38 is a graph showing luminance-blue index characteristics of light-emitting devices according to an example.

FIG. 38 is a graph showing luminance-blue index characteristics of the light-emitting device 3 and the light-emitting device 4.

Figure 39:
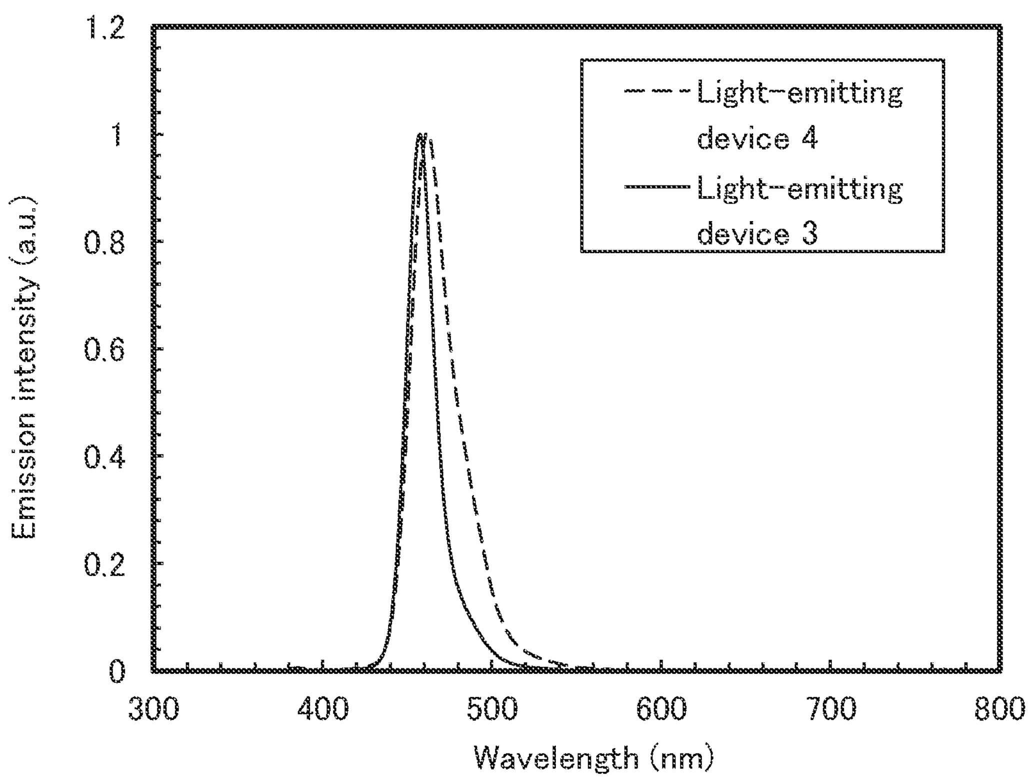
FIG. 39 is a graph showing emission spectra of light-emitting devices according to an example.

FIG. 39 is a graph showing emission spectra of the light-emitting device 3 and the light-emitting device 4 emitting light at a luminance of 1000 cd/$m^2$.

FIG. 40A to FIG. 40D are diagrams illustrating the structure of the light-emitting device 550.

Figure 41:
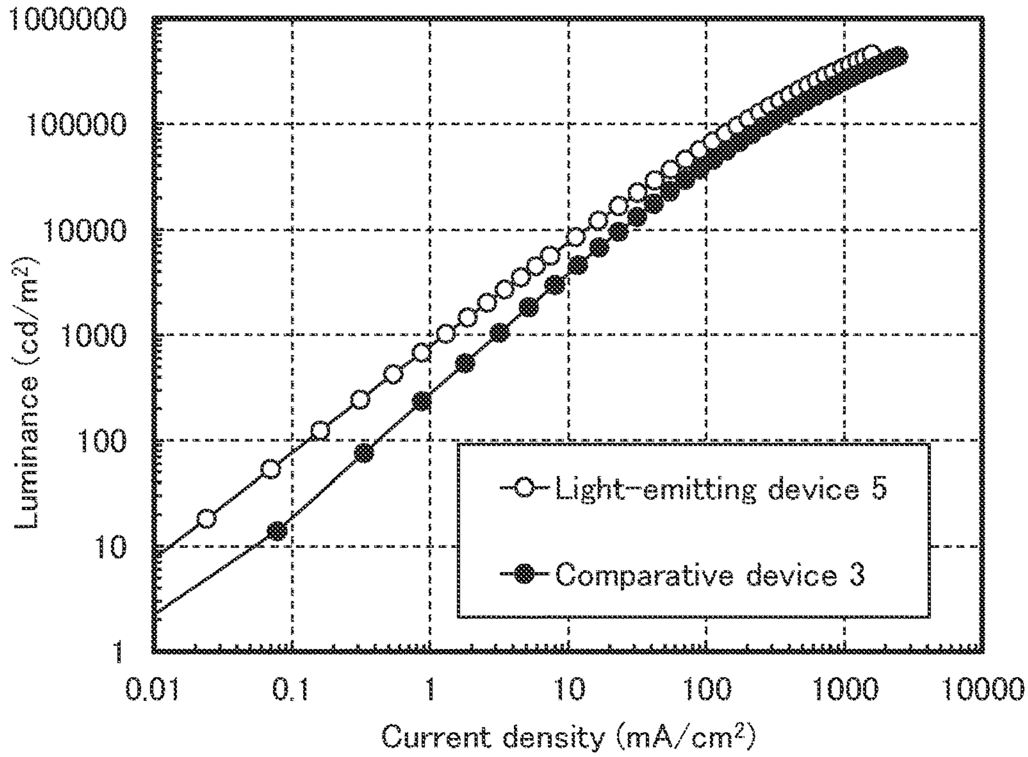
FIG. 41 is a graph showing current density-luminance characteristics of the light-emitting device 5 according to an example.

FIG. 41 is a graph showing current density-luminance characteristics of a light-emitting device 5.

Figure 42:
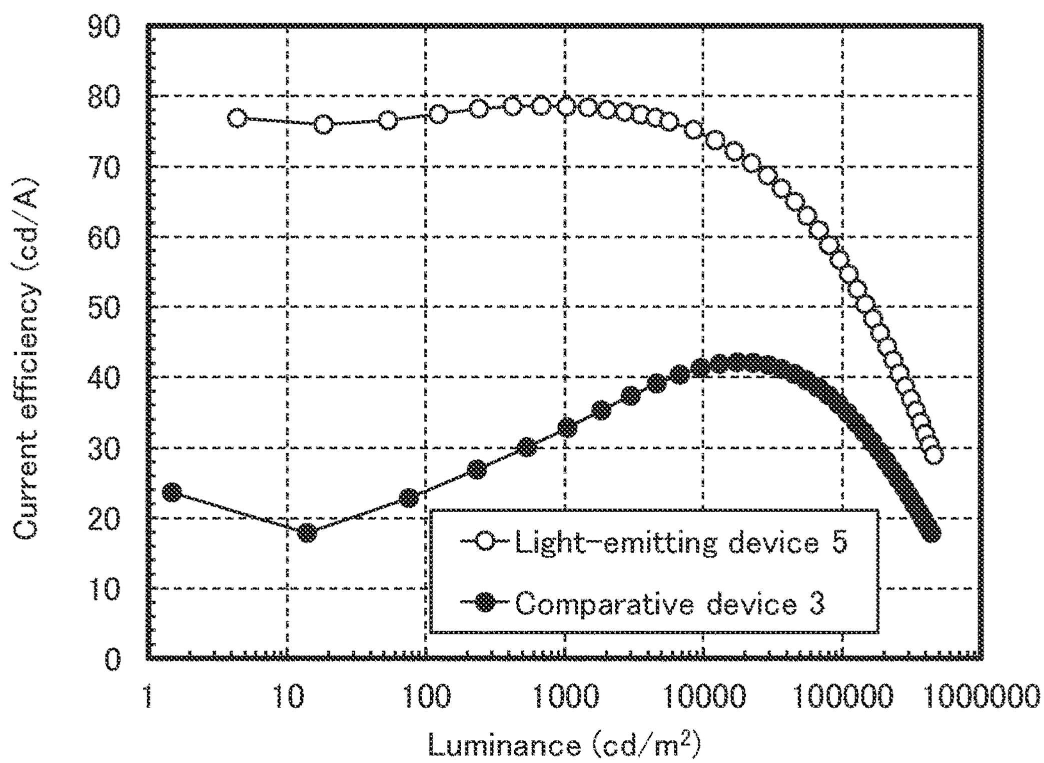
FIG. 42 is a graph showing luminance-current efficiency characteristics of the light-emitting device 5 according to an example.

FIG. 42 is a graph showing luminance-current efficiency characteristics of the light-emitting device 5.

Figure 43:
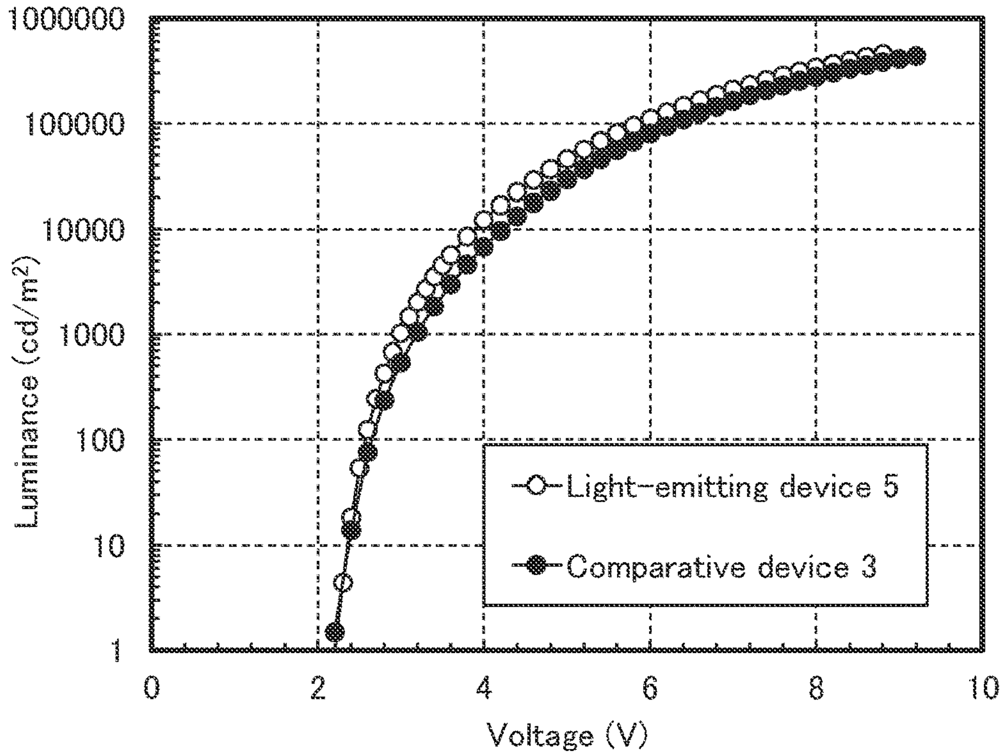
FIG. 43 is a graph showing voltage-luminance characteristics of the light-emitting device 5 according to an example.

FIG. 43 is a graph showing voltage-luminance characteristics of the light-emitting device 5.

Figure 44:
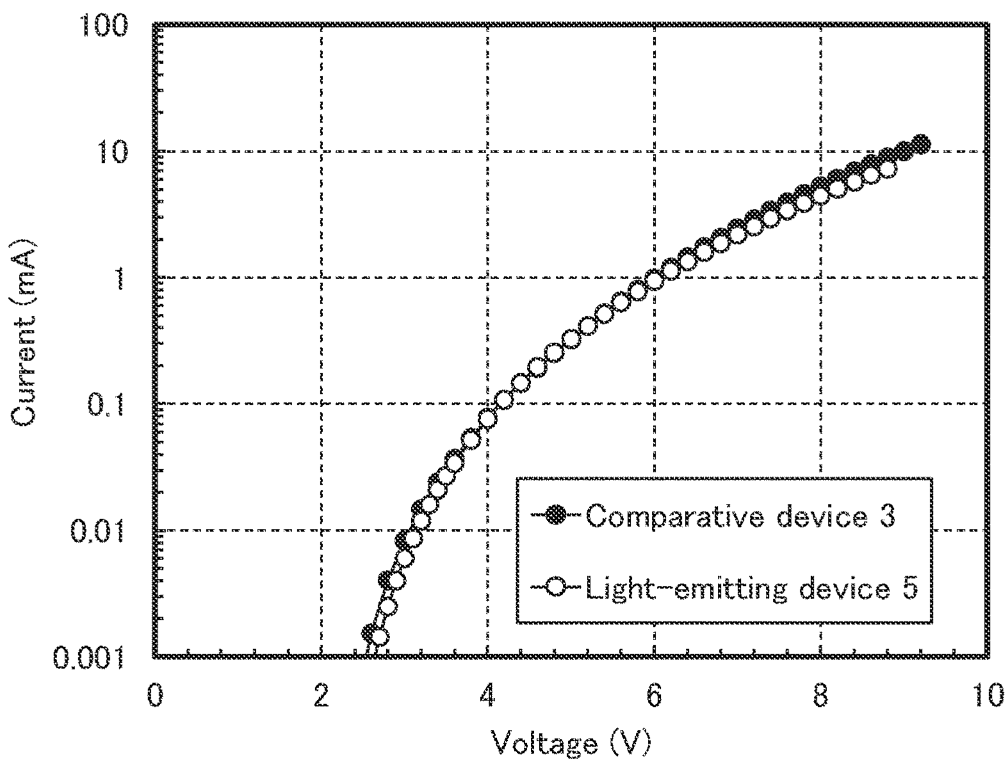
FIG. 44 is a graph showing voltage-current characteristics of the light-emitting device 5 according to an example.

FIG. 44 is a graph showing voltage-current characteristics of the light-emitting device 5.

Figure 45:
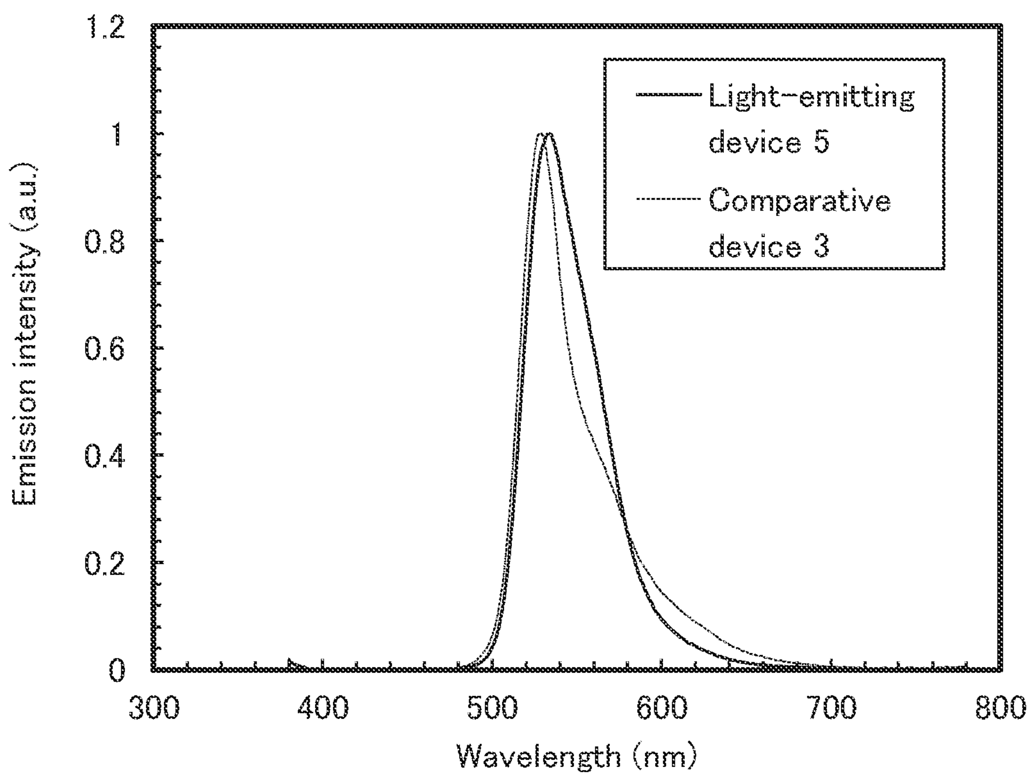
FIG. 45 is a graph showing emission spectrum of the light-emitting device 5 according to an example.

FIG. 45 is a graph showing an emission spectrum of the light-emitting device 5 emitting light at a luminance of 1000 cd/$m^2$.

Figure 46:
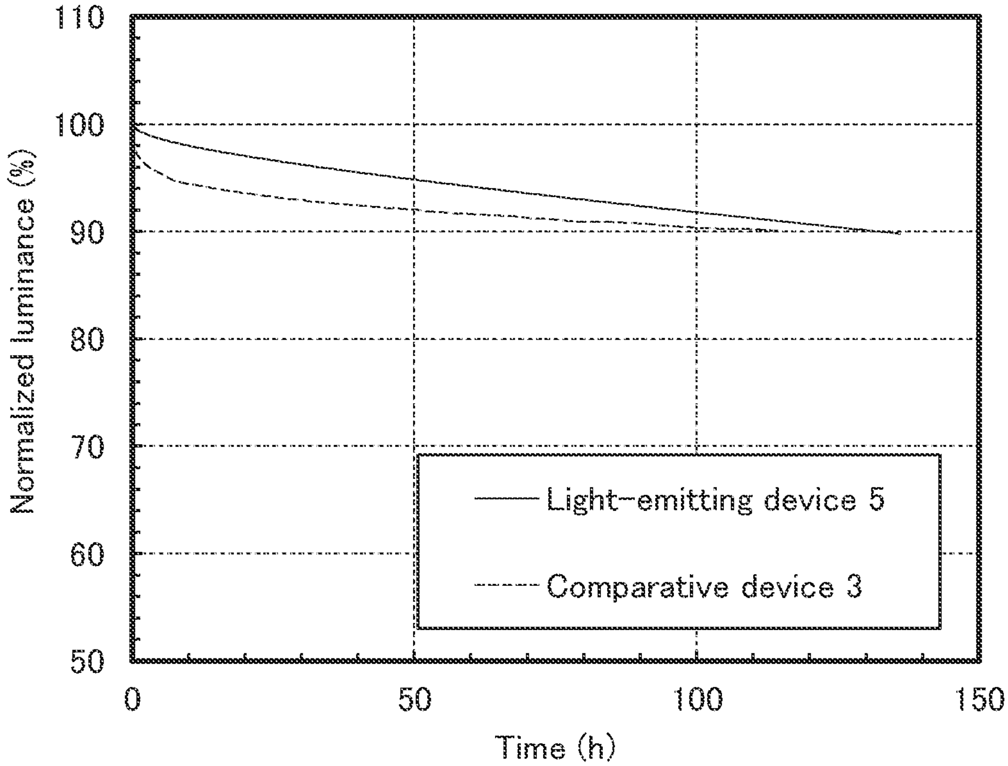
FIG. 46 is a graph showing temporal changes in normalized luminance of the light-emitting device 5 according to an example.

FIG. 46 is a graph showing a change in normalized luminance over time of the light-emitting device 5 emitting light at a constant current density (50 mA/$cm^2$).

<Light-Emitting Device 1>

The fabricated light-emitting device 1 described in this example can be used for the display device of one embodiment of the present invention. The light-emitting device 1 has a structure similar to that of the light-emitting device 550 (see FIG. 23A).

<<Structure of Light-Emitting Device 1>>

Table 1 shows the structure of the light-emitting device 1. Structural formulae of materials used for the light-emitting device described in this example are shown below. Note that in the tables in this example, subscript characters and superscript characters are written in ordinary size for convenience. For example, subscript characters in abbreviations and superscript characters in units are written in ordinary size in the tables. Such notations in the tables can be replaced by referring to the description in the specification. In the light-emitting device 1, there is the distance DG of 112 nm between a reflective film REFG(2) and an electrode 552G.

TABLE 1

| Structure | Reference numeral | Material | Composition ratio | Thickness/nm |
|---|---|---|---|---|
| Conductive film | 552 | ITO | | 70 |
| Electrode | 552G | Ag:Mg | 1:0.1 | 25 |
| Layer | 105 | LiF | | 1 |
| Layer | 113(2) | NBPhen | | 15 |
| Layer | 113(1) | 2mDBTBPDBq-II | | 15 |
| Layer | 111G | 8BP-4mDBtPBfpm: PCCP: Ir(ppy)2(mbfpypy-d3) | 0.6:0.4:0.1 | 40 |
| Layer | 112 | PCBBiF | | 10 |
| Layer | 104 | PCBBiF:OCHD-003 | 1:0.03 | 10 |
| Electrode | 551G | ITSO | | 10 |
| Conductive film | REFG(3) | Ti | | 6 |
| Reflective film | REFG(2) | Al | | 70 |
| Conductive film | REFG(1) | Ti | | 50 |

[Chemical Formulae 3]

TABLE 1-continued

| Structure | Reference numeral | Material | Composition ratio | Thickness/nm |
|---|---|---|---|---|

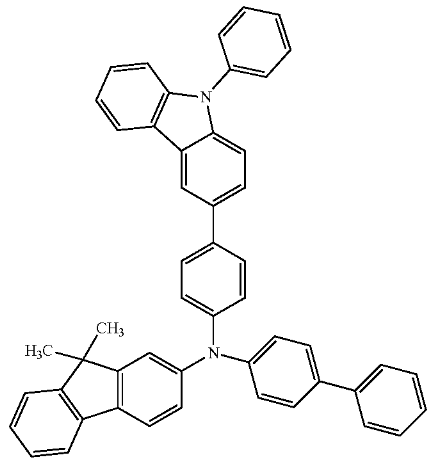

PCBBiF

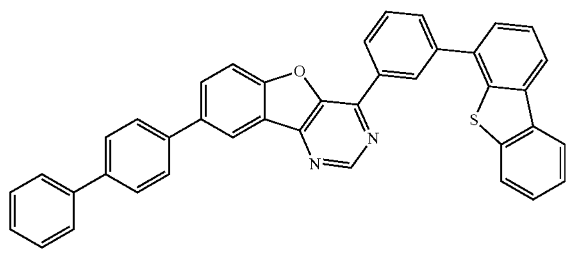

8BP-4mDBtPBfpm

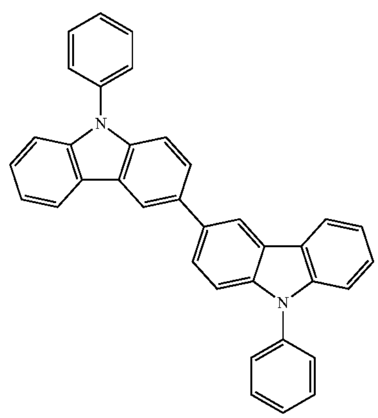

PCCP

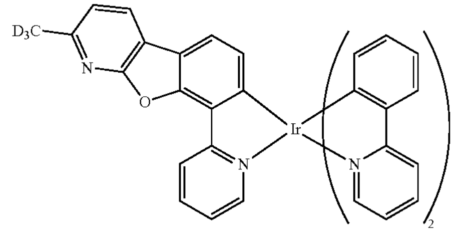

Ir(ppy)2(mbfpypy-d3)

TABLE 1-continued

| Structure | Reference numeral | Material | Composition ratio | Thickness/nm |
|---|---|---|---|---|
| 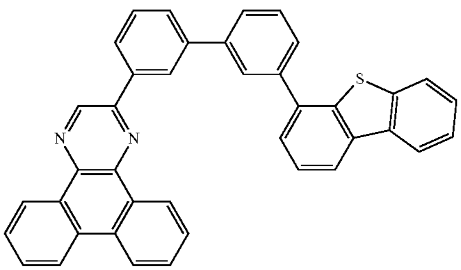 2mDBTBPDBq-II | | | | |
| 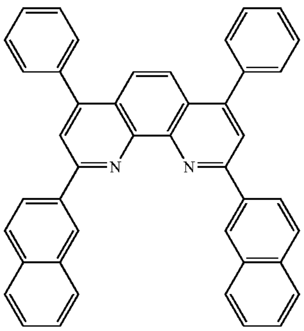 NBPhen | | | | |

<<Fabrication Method of Light-Emitting Device 1>>

The light-emitting device 1 described in this example was fabricated using a method including the following steps.

[Step 1]

In Step 1, a conductive film REFG(1) was formed. Specifically, the conductive film REFG(1) was formed by a sputtering method using titanium (Ti) as a target.

Note that the conductive film REFG(1) contains Ti and has a thickness of 50 nm.

[Step 2]

In Step 2, the reflective film REFG(2) was formed over the conductive film REFG(1). Specifically, the reflective film REFG(2) was formed by a sputtering method using aluminum (Al) as a target.

Note that the reflective film REFG(2) contains Al and has a thickness of 70 nm.

[Step 3]

In Step 3, a conductive film REFG(3) was formed over the reflective film REFG(2). Specifically, the conductive film REFG(3) was formed by a sputtering method using Ti as a target.

Note that the conductive film REFG(3) contains Ti and has a thickness of 6 nm.

[Step 4]

In Step 1, an electrode 551G was formed. Specifically, the electrode 551G was formed by a sputtering method using indium oxide-tin oxide containing silicon or silicon oxide (abbreviation: ITSO) as a target.

Note that the electrode 551G contains ITSO and has a thickness of 10 nm and an area of 4 $mm^2$ (2 mm×2 mm).

Next, a base material over which the electrode 551G was formed was washed with water, baked at 200° C. for an hour, and then subjected to UV ozone treatment for 370 seconds. After that, a substrate was transferred into a vacuum evaporation apparatus where the inside pressure was reduced to approximately $10^{-4}$ Pa, and vacuum baking was performed at 170° C. for 30 minutes in a heating chamber of the vacuum evaporation apparatus. Then, the substrate was cooled down for approximately 30 minutes.

[Step 5]

In Step 5, the layer 104 was formed over the electrode 551G. Specifically, materials were co-evaporated by a resistance-heating method.

Note that the layer 104 contains N-(1,1'-biphenyl-4-yl)-N-[4-(9-phenyl-9H-carbazol-3-yl)phenyl]-9,9-dimethyl-9H-fluoren-2-amine (abbreviation: PCBBiF) and an electron-accepting material (OCHD-003) at PCBBiF:OCHD-003=1:0.03 (weight ratio) and has a thickness of 10 nm. Note that the electron-accepting material OCHD-003 contains fluorine, and has a molecular weight of 672.

[Step 6]

In Step 6, the layer 112 was formed over the layer 104. Specifically, a material was evaporated by a resistance-heating method.

Note that the layer 112 contains PCBBiF and has a thickness of 10 nm.

[Step 7]

In Step 7, a layer 111G was formed over the layer 112. Specifically, materials were co-evaporated by a resistance-heating method.

Note that the layer 111G contains 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9,9'-diphenyl-9H,9'H-3,3'-bicarbazole (abbreviation: PCCP), and [2-d3-methyl-(2-pyridinyl-κN)benzofuro[2,3-b]pyridine-κC]bis[2-(2-pyridinyl-κN)phenyl-κC]iridium(III) (abbreviation: $Ir(ppy)_2(mbfpypy\text{-}d3)$) at 8BP-4mDBtPBfpm:PCCP:$Ir(ppy)_2(mbfpypy\text{-}d3)$=0.6:0.4:0.1 (weight ratio) and has a thickness of 40 nm.

[Step 8]

In Step 8, a layer 113(1) was formed over the layer 111G. Specifically, a material was evaporated by a resistance-heating method.

Note that the layer 113(1) contains 2-[3-(3'-dibenzothiophen-4-yl)biphenyl]dibenzo[f,h]quinoxaline (abbreviation: 2mDBTBPDBq-II) and has a thickness of 15 nm.

[Step 9]

In Step 9, a layer 113(2) was formed over the layer 113(1). Specifically, a material was evaporated by a resistance-heating method.

Note that the layer 113(2) contains 2,9-di(2-naphthalen-2-yl)-4,7-diphenyl-1,10-phenanthroline (abbreviation: NBPhen) and has a thickness of 15 nm.

TABLE 2

| | Distance (nm) | Voltage (V) | Current (mA) | Current density (mA/cm2) | Chromaticity x | Chromaticity y | Current efficiency (cd/A) | B.I. (cd/A/y) |
|---|---|---|---|---|---|---|---|---|
| Light-emitting device 1 | 112 | 3.0 | 0.05 | 1.3 | 0.25 | 0.70 | 77.0 | — |
| Light-emitting device 2 | 137 | 2.8 | 0.13 | 3.1 | 0.69 | 0.31 | 36.2 | — |
| Light-emitting device 3 | 193.8 | 6.0 | 1.25 | 31.1 | 0.14 | 0.04 | 2.9 | 66.1 |
| Light-emitting device 4 | 82 | 4.2 | 0.92 | 23.0 | 0.13 | 0.08 | 4.5 | 55.4 |
| Comparative device 1 | 250.3 | 3.8 | 0.05 | 1.1 | 0.25 | 0.71 | 94.6 | — |
| Comparative device 2 | 300.3 | 3.4 | 0.13 | 3.2 | 0.69 | 0.31 | 30.3 | — |

[Step 10]

In Step 10, the layer 105 was formed over the layer 113(2). Specifically, a material was evaporated by a resistance-heating method.

Note that the layer 105 contains lithium fluoride (abbreviation: LiF) and has a thickness of 1 nm.

[Step 11]

In Step 11, the electrode 552G was formed over the layer 105. Specifically, materials were co-evaporated by a resistance-heating method.

Note that the electrode 552G contains silver (abbreviation: Ag) and magnesium (abbreviation: Mg) at Ag:Mg=1:0.1 (volume ratio) and has a thickness of 25 nm.

[Step 12]

In Step 12, the conductive film 552 was formed over the electrode 552G. Specifically, the conductive film 552 was formed by a sputtering method using indium oxide-tin oxide (abbreviation: ITO) as a target.

Note that the conductive film 552 contains ITO and has a thickness of 70 nm.

<<Operation Characteristics of Light-Emitting Device 1>>

When supplied with electric power, the light-emitting device 1 emitted the light EL1 (see FIG. 23A). The operation characteristics of the light-emitting device 1 were measured at room temperature (see FIG. 24 to FIG. 28). The luminance, CIE chromaticity, and emission spectrum were measured using a spectroradiometer (SR-UL1R, manufactured by TOPCON TECHNOHOUSE CORPORATION).

Table 2 shows the results of main initial characteristics of the fabricated light-emitting device emitting light at a luminance of approximately 1000 cd/$m^2$. Note that the distance shown in the table is a distance from the reflective film REFG(2) to the electrode 552G, a distance from a reflective film REFR(2) to an electrode 552R, or a distance from a reflective film REFB(2) to an electrode 552B. Furthermore, the table also shows characteristics of other light-emitting devices and comparative devices described later.

Note that the blue index (BI) is one of the indicators representing characteristics of a blue-light-emitting device, and is a value obtained by dividing current efficiency (cd/A) by chromaticity y. In general, blue light with high color purity is useful in expressing a wide color gamut. In addition, blue light with higher color purity tends to have lower chromaticity y. Thus, the value obtained by dividing current efficiency (cd/A) by chromaticity y is the indicator representing usefulness of a blue-light-emitting device. In other words, a blue-light-emitting device with high BI is suitable for achieving a display device with a wide color gamut and high efficiency.

The light-emitting device 1 was found to have favorable characteristics. For example, the light-emitting device 1 can be driven at a lower voltage than a comparative device 1. High luminance can be obtained by the light-emitting device 1 with lower power than the comparative device 1. The amount of materials used for the light-emitting device 1 can be smaller than that of the comparative device 1. In addition, the time required for manufacturing the light-emitting device 1 can be shortened.

Reference Example 1

In the fabricated comparative device 1 described in this reference example, the layer 112 has a thickness of 137.5 nm instead of a thickness of 10 nm, the layer 111G has a thickness of 50 nm instead of a thickness of 40 nm, and the layer 105 contains LiF and Yb at LiF:Yb=1:1 (weight ratio) instead of LiF and has a thickness of 1.8 nm. The comparative device 1 is different from the light-emitting device 1 in that the electrode 552G has a thickness of 15 nm instead of a thickness of 25 nm. Note that in the comparative device 1, there is the distance DG of 250.3 nm between the reflective film REFG(2) and the electrode 552G.

<Light-Emitting Device 2>

The fabricated light-emitting device 2 described in this example can be used for the display device of one embodiment of the present invention.

<<Structure of Light-Emitting Device 2>>

Table 3 shows the structure of the light-emitting device 2. Structural formulae of materials used for the light-emitting device described in this example are shown below. Note that in the light-emitting device 2, there is the distance DR of 137 nm between the reflective film REFR(2) and the electrode 552R.

TABLE 3

| Structure | Reference numeral | Material | Composition ratio | Thickness/nm |
|---|---|---|---|---|
| Conductive film | 552 | ITO | | 70 |
| Electrode | 552R | Ag:Mg | 1:0.1 | 25 |
| Layer | 105 | LiF | | 1 |
| Layer | 113(2) | NBPhen | | 20 |
| Layer | 113(1) | 2mDBTBPDBq-II | | 20 |
| Layer | 111R | 9mDBtBPNfpr: PCBBiF: OCPG-006 | 0.6:0.4:0.1 | 40 |

TABLE 3-continued

| Structure | Reference numeral | Material | Composition ratio | Thickness/ nm |
|---|---|---|---|---|
| Layer | 112 | PCBBiF | | 30 |
| Layer | 104 | PCBBiF:OCHD-003 | 1:0.03 | 10 |
| Electrode | 551R | ITSO | | 10 |
| Conductive film | REFR(3) | Ti | | 6 |
| Reflective film | REFR(2) | Al | | 70 |
| Conductive film | REFR(1) | Ti | | 50 |

[Chemical formula 4]

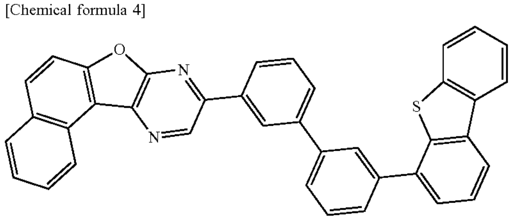

9mDBtBPNfpr

The structure of the light-emitting device 2 is different from that of the light-emitting device 1 in that the electrode 551R is provided instead of the electrode 551G, the layer 112 has a thickness of 30 nm instead of a thickness of 10 nm, a layer 111R is provided instead of the layer 111G, the layer 113(2) has a thickness of 20 nm instead of a thickness of 15 nm, and the electrode 552R is provided instead of the electrode 552G.

<<Fabrication Method of Light-Emitting Device 2>>

The light-emitting device 2 described in this example was fabricated using a method including the following steps.

The method for fabricating the light-emitting device 2 is different from the method for fabricating the light-emitting device 1 in Step 6 for forming the layer 112, Step 7 for forming the layer 111R, and Step 9 for forming the layer 113(2). Different portions are described in detail here, and the above description is referred to for portions formed by a similar method.

[Step 6]

In Step 6, the layer 112 was formed over the layer 104. Specifically, a material was evaporated by a resistance-heating method.

Note that the layer 112 contains PCBBiF and has a thickness of 30 nm.

[Step 7]

In Step 7, the layer 111R was formed over the layer 112. Specifically, materials were co-evaporated by a resistance-heating method.

Note that the layer 111R contains 9-[3'-(dibenzothiophen-4-yl)biphenyl-3-yl]naphtho[1',2':4,5]furo[2,3-b]pyrazine (abbreviation: 9mDBtBPNfpr), PCBBiF, and a phosphorescent dopant (abbreviation: OCPG-006) at 9mDBtBPNfpr:PCBBiF:OCPG-006=0.6:0.4:0.1 (weight ratio) and has a thickness of 40 nm.

[Step 9]

In Step 9, the layer 113(2) was formed over the layer 113(1). Specifically, a material was evaporated by a resistance-heating method.

Note that the layer 113(2) contains NBPhen and has a thickness of 20 nm.

<<Operation Characteristics of Light-Emitting Device 2>>

When supplied with electric power, the light-emitting device 2 emitted the light EL1 (see FIG. 23A). The operation characteristics of the light-emitting device 2 were measured at room temperature (see FIG. 29 to FIG. 33). The luminance, CIE chromaticity, and emission spectrum were measured using a spectroradiometer (SR-UL1R, manufactured by TOPCON TECHNOHOUSE CORPORATION).

Table 2 shows the results of main initial characteristics of the fabricated light-emitting device emitting light at a luminance of approximately 1000 cd/m$^2$.

The light-emitting device 2 was found to have favorable characteristics. For example, the light-emitting device 2 can be driven at a lower voltage than a comparative device 2. High luminance can be obtained by the light-emitting device 2 with lower power than the comparative device 2. The amount of materials used for the light-emitting device 2 can be smaller than that of the comparative device 2. In addition, the time required for manufacturing the light-emitting device 2 can be shortened.

In a display device including the light-emitting device 1 and the light-emitting device 2, the light-emitting device 1 has the distance DG of 112 nm between the reflective film REFG(2) and the electrode 552G. Furthermore, the light-emitting device 2 has the distance DR of 137 nm between the reflective film REFR(2) and the electrode 552R.

The distance DR of 137 nm is 25 nm longer than the distance DG of 112 nm.

The display device including the light-emitting device 1 and the light-emitting device 2 has a smaller step than a display device including the comparative device 1 and the comparative device 2.

Reference Example 2

In the fabricated comparative device 2 described in this reference example, the layer 112 has a thickness of 192.5 nm instead of a thickness of 30 nm and the layer 105 contains LiF and Yb at LiF:Yb=1:1 (weight ratio) instead of LiF and has a thickness of 1.8 nm. The comparative device 2 is different from the light-emitting device 2 in that the electrode 552R has a thickness of 15 nm instead of a thickness of 25 nm. Note that in the comparative device 2, there is the distance DR of 300.3 nm between the reflective film REFR (2) and the electrode 552R.

In the display device including the comparative device 1 and the comparative device 2, the comparative device 1 has the distance DG of 250.3 nm between the reflective film REFG(2) and the electrode 552G. Furthermore, the comparative device 2 has the distance DR of 300.3 nm between the reflective film REFR(2) and the electrode 552R.

The distance DR of 300.3 nm is 50 nm longer than the distance DG of 250.3 nm.

<Light-Emitting Device 3>

The fabricated light-emitting device 3 described in this example can be used for the display device of one embodiment of the present invention. The light-emitting device 3 has a structure similar to that of the light-emitting device 550 (see FIG. 23B).

<<Structure of Light-Emitting Device 3>>

Table 4 shows the structure of the light-emitting device 3. Structural formulae of materials used for the light-emitting device described in this example are shown below. Note that in the light-emitting device 3, there is the distance DB of 193.8 nm between the reflective film REFB(2) and the electrode 552B.

TABLE 4

| Structure | Reference numeral | Material | Composition ratio | Thickness/ nm |
|---|---|---|---|---|
| Conductive film | 552 | ITO | | 70 |
| Electrode | 552B | Ag:Mg | 1:0.1 | 15 |
| Layer | 105 | LiF:Yb | 1:1 | 1.8 |
| Layer | 113(2) | NBPhen | | 15 |
| Layer | 113(1) | 2mDBTBPDBq-II | | 20 |
| Layer | 111B | αN-βNPAnth: 3,10PCA2Nbf(IV)-02 | 1:0.015 | 25 |
| Layer | 112(2) | DBfBB1TP | | 10 |
| Layer | 112(1) | PCBBiF | | 96 |
| Layer | 104 | PCBBiF:OCHD-003 | 1:0.03 | 10 |
| Electrode | 551B | ITSO | | 10 |
| Conductive film | REFB(3) | Ti | | 6 |
| Reflective film | REFB(2) | Al | | 70 |
| Conductive film | REFB(1) | Ti | | 50 |

[Chemical formulae 5]

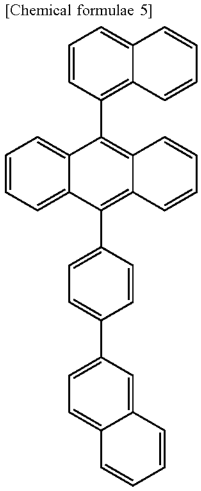

αN-βNPAnth

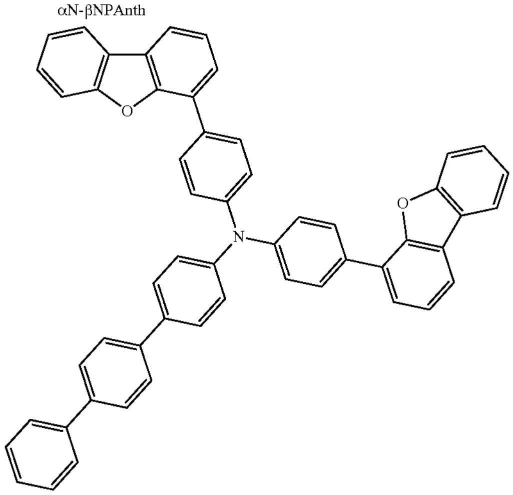

DBfBB1TP

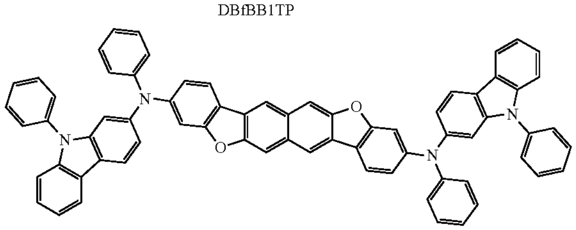

3,10PCA2Nbf(IV)-02

The structure of the light-emitting device 3 is different from that of the light-emitting device 1 in that the electrode 551B is provided instead of the electrode 551G, a layer 112(1) and a layer 112(2) are provided instead of the layer 112, a layer 111B is provided instead of the layer 111G, the layer 105 contains LiF and Yb at LiF:Yb=1:1 (weight ratio) instead of LiF and has a thickness of 1.8 nm, and the electrode 552B is provided instead of the electrode 552G. Note that a conductive film REFB(1) has a structure similar to that of the conductive film REFG(1) and a conductive film REFB(3) has a structure similar to that of the conductive film REFG(3).

<<Fabrication Method of Light-Emitting Device 3>>

The light-emitting device 3 described in this example was fabricated using a method including the following steps.

The method for fabricating the light-emitting device 3 is different from the method for fabricating the light-emitting device 1 in Step 6 for forming the layer 112(1) instead of the layer 112, Step 6-2 for forming the layer 112(2) over the layer 112(1), Step 7 for forming the layer 111B, and Step 10 for forming the layer 105. Different portions are described in detail here, and the above description is referred to for portions formed by a similar method.

[Step 6]

In Step 6, the layer 112(1) was formed over the layer 104. Specifically, a material was evaporated by a resistance-heating method.

Note that the layer 112(1) contains PCBBiF and has a thickness of 96 nm.

[Step 6-2]

In Step 6-2, the layer 112(2) was formed over the layer 112(1). Specifically, a material was evaporated by a resistance-heating method.

Note that the layer 112(2) contains N,N-bis[4-(dibenzofuran-4-yl)phenyl]-4-amino-p-terphenyl (abbreviation: DBfBB1TP) and has a thickness of 10 nm.

[Step 7]

In Step 7, the layer 111B was formed over the layer 112(2). Specifically, materials were co-evaporated by a resistance-heating method.

Note that the layer 111B contains 9-(1-naphthyl)-10-[4-(2-naphthyl)phenyl]anthracene (abbreviation: αN-βNPAnth) and 3,10-bis[N-(9-phenyl-9H-carbazol-2-yl)-N-phenylamino]naphtho[2,3-b; 6,7-b']bisbenzofuran (abbreviation: 3,10PCA2Nbf(IV)-02) at αN-βNPAnth:3,10PCA2Nbf(IV)-02=1:0.015 (weight ratio) and has a thickness of 25 nm.

[Step 10]

In Step 10, the layer 105 was formed over the layer 113(2). Specifically, materials were co-evaporated by a resistance-heating method.

Note that the layer 105 contains LiF and Yb at LiF:Yb=1:1 (weight ratio) and has a thickness of 1.8 nm.

<<Operation Characteristics of Light-Emitting Device 3>>

When supplied with electric power, the light-emitting device 3 emitted the light EL1 (see FIG. 23B). The operation characteristics of the light-emitting device 1 were measured at room temperature (see FIG. 34 to FIG. 39). The luminance, CIE chromaticity, and emission spectrum were measured using a spectroradiometer (SR-UL1R, manufactured by TOPCON TECHNOHOUSE CORPORATION).

Table 2 shows the results of main initial characteristics of the fabricated light-emitting device emitting light at a luminance of approximately 1000 cd/m$^2$.

The light-emitting device 3 was found to have favorable characteristics. For example, the light-emitting device 3 emitted light having a deep blue chromaticity. Furthermore, since the light-emitting device 3 exhibits high blue index, it can be said that the light-emitting device 3 is suitable for the display device.

In a display device including the light-emitting device 1, the light-emitting device 2, and the light-emitting device 3, the light-emitting device 1 has the distance DG of 112 nm between the reflective film REFG(2) and the electrode 552G. Furthermore, the light-emitting device 2 has the distance DR of 137 nm between the reflective film REFR(2) and the electrode 552R, and the light-emitting device 3 has the distance DB of 193.8 nm between the reflective film REFB(2) and the electrode 552B.

The distance DB of 193.8 nm is 81.8 nm longer than the distance DG of 112 nm. The distance DB of 193.8 nm is 56.8 nm longer than the distance DR of 137 nm. The distance DR of 137 nm is 25 nm longer than the distance DG of 112 nm.

The display device including the light-emitting device 1, the light-emitting device 2, and the light-emitting device 3 has a smaller step than a display device including the comparative device 1, the comparative device 2, and the light-emitting device 3.

<Light-Emitting Device 4>

The fabricated light-emitting device 3 described in this example can be used for the display device of one embodiment of the present invention. The light-emitting device 4 has a structure similar to that of the light-emitting device 550 (see FIG. 23B).

<<Structure of Light-Emitting Device 4>>

Table 5 shows the structure of the light-emitting device 4. Note that in the light-emitting device 4, there is the distance DB of 82 nm between the reflective film REFB(2) and the electrode 552B.

TABLE 5

| Structure | Reference numeral | Material | Composition ratio | Thickness/nm |
|---|---|---|---|---|
| Conductive film | 552 | ITO | | 70 |
| Electrode | 552B | Ag:Mg | 1:0.1 | 25 |
| Layer | 105 | LiF | | 1 |
| Layer | 113(2) | NBPhen | | 10 |
| Layer | 113(1) | 2mDBTBPDBq-II | | 15 |
| Layer | 111B | αN-βNPAnth: 3,10PCA2Nbf(IV)-02 | 1:0.015 | 25 |
| Layer | 112(2) | DBfBB1TP | | 5 |
| Layer | 112(1) | PCBBiF | | 5 |
| Layer | 104 | PCBBiF:OCHD-003 | 1:0.03 | 5 |
| Electrode | 551B | ITSO | | 10 |
| Conductive film | REFB(3) | Ti | | 6 |
| Reflective film | REFB(2) | Al | | 70 |
| Conductive film | REFB(1) | Ti | | 50 |

The structure of the light-emitting device 4 is different from that of the light-emitting device 1 in that the electrode 551B is provided instead of the electrode 551G, the layer 104 has a thickness of 5 nm instead of a thickness of 10 nm, the layer 112(1) and the layer 112(2) are provided instead of the layer 112, the layer 111B is provided instead of the layer 111G, the layer 113(2) has a thickness of 10 nm instead of a thickness of 15 nm, and the electrode 552B is provided instead of the electrode 552G.

<<Fabrication Method of Light-Emitting Device 4>>

The light-emitting device 4 described in this example was fabricated using a method including the following steps.

The method for fabricating the light-emitting device 4 is different from the method for fabricating the light-emitting device 1 in Step 5 for forming the layer 104, Step 6 for forming the layer 112(1) instead of the layer 112, Step 6-2 for forming the layer 112(2) over the layer 112(1), Step 7 for forming the layer 111B, Step 8 for forming the layer 113(1), and Step 9 for forming the layer 113(2). Different portions are described in detail here, and the above description is referred to for portions formed by a similar method.

[Step 5]

In Step 5, the layer 104 was formed over the electrode 551B. Specifically, materials were co-evaporated by a resistance-heating method.

Note that the layer 104 contains PCBBiF and OCHD-003 at PCBBiF:OCHD-003=1:0.03 (weight ratio) and has a thickness of 5 nm.

[Step 6]

In Step 6, the layer 112(1) was formed over the layer 104. Specifically, a material was evaporated by a resistance-heating method.

Note that the layer 112(1) contains PCBBiF and has a thickness of 5 nm.

[Step 6-2]

In Step 6-2, the layer 112(2) was formed over the layer 112(1). Specifically, a material was evaporated by a resistance-heating method.

Note that the layer 112(2) contains DBfBB1TP and has a thickness of 5 nm.

[Step 7]

In Step 7, the layer 111B was formed over the layer 112(2). Specifically, materials were co-evaporated by a resistance-heating method.

Note that the layer 111B contains αN-βNPAnth and 3,10PCA2Nbf(IV)-02 at αN-βNPAnth:3,10PCA2Nbf(IV)-02=1:0.015 (weight ratio) and has a thickness of 25 nm.

[Step 8]

In Step 8, the layer 113(1) was formed over the layer 111G. Specifically, a material was evaporated by a resistance-heating method.

Note that the layer 113(1) contains 2mDBTBPDBq-II and has a thickness of 15 nm.

[Step 9]

In Step 9, the layer 113(2) was formed over the layer 113(1). Specifically, a material was evaporated by a resistance-heating method.

Note that the layer 113(2) contains NBPhen and has a thickness of 10 nm.

<<Operation Characteristics of Light-Emitting Device 4>>

When supplied with electric power, the light-emitting device 4 emitted the light EL1 (see FIG. 23B). The operation characteristics of the light-emitting device 1 were measured at room temperature (see FIG. 34 to FIG. 39). The luminance, CIE chromaticity, and emission spectrum were measured using a spectroradiometer (SR-UL1R, manufactured by TOPCON TECHNOHOUSE CORPORATION).

Table 2 shows the results of main initial characteristics of the fabricated light-emitting device emitting light at a luminance of approximately 1000 cd/m$^2$.

The light-emitting device 4 was found to have favorable characteristics. For example, the light-emitting device 4 can be driven at a low voltage. The light-emitting device 4 exhibited high current efficiency. High luminance can be obtained by the light-emitting device 4 with low power. In addition, the amount of materials used for the light-emitting device 4 can be smaller than that of the light-emitting device 3. Furthermore, the time required for manufacturing the light-emitting device 4 can be shortened.

In a display device including the light-emitting device 1, the light-emitting device 2, and the light-emitting device 4, the light-emitting device 1 has the distance DG of 112 nm between the reflective film REFG(2) and the electrode 552G. Furthermore, the light-emitting device 2 has the distance DR of 137 nm between the reflective film REFR(2) and the electrode 552R, and the light-emitting device 4 has the distance DB of 82 nm between the reflective film REFB(2) and the electrode 552B.

The distance DR of 137 nm is 55 nm longer than the distance DB of 82 nm. The distance DR of 137 nm is 25 nm longer than the distance DG of 112 nm. The distance DG of 112 nm is 30 nm longer than the distance DB of 82 nm.

The display device including the light-emitting device 1, the light-emitting device 2, and the light-emitting device 4 has a smaller step than the display device including the comparative device 1, the comparative device 2, and the light-emitting device 3.

<Light-Emitting Device 5>

The fabricated light-emitting device 5 described in this example has a structure similar to that of the light-emitting device 550 (see FIG. 23A and FIG. 40A to FIG. 40C).

<<Structure of Light-Emitting Device 5>>

Table 6 shows the structure of the light-emitting device 5. The fabricated light-emitting device 5 described in this example is different in that the layer 111G contains 4,8-bis[3-(dibenzothiophen-4-yl)phenyl]-[1]benzofuro[3,2-d]pyrimidine (abbreviation: 4,8mDBtP2Bfpm) and 9-(2-naphthyl)-9'-phenyl-9H,9'H-3,3'-bicarbazole (abbreviation: PNCCP) instead of 8BP-4mDBtPBfpm and PCCP, and the layer 113(1) contains 2-{3-[3-(N-phenyl-9H-carbazol-3-yl)-9H-carbazol-9-yl]phenyl}dibenzo[f,h]quinoxaline (abbreviation: 2mPCCzPDBq) instead of 2mDBTBPDBq-II.

The area of the electrode 551G of light-emitting device 5 is 7.32 μm$^2$ (6.42 μm×1.14 μm), which is smaller than the area of the electrode 551G of the light-emitting device 1. A unit 103G of the light-emitting device 5 is separated from an adjacent light-emitting device (see FIG. 40C). The filler 529(1) and the filler 529(2) are provided between the light-emitting device 5 and the adjacent light-emitting device.

TABLE 6

| Structure | Reference numeral | Material | Composition ratio | Thickness/nm |
|---|---|---|---|---|
| Conductive film | 552 | ITO | | 70 |
| Electrode | 552G | Ag:Mg | 1:0.1 | 25 |
| Layer | 105 | LiF:Yb | 1:1 | 2 |
| Layer | 113(2) | NBPhen | | 15 |
| Layer | 113(1) | 2mPCCzPDBq | | 20 |
| Layer | 111G | 4,8mDBtP2Bfpm: βNCCP: Ir(ppy)2(mbfpypy-d3) | 0.6:0.4:0.1 | 40 |
| Layer | 112 | PCBBiF | | 10 |
| Layer | 104 | PCBBiF:OCHD-003 | 1:0.03 | 10 |
| Electrode | 551G | ITSO | | 10 |
| Reflective film | REFG(3) | Ti | | 6 |

TABLE 6-continued

| Structure | Reference numeral | Material | Composition ratio | Thickness/nm |
|---|---|---|---|---|
| Reflective film | REFG(2) | Al | | 70 |
| Reflective film | REFG(1) | Ti | | 50 |

[Chemical Formulae 6]

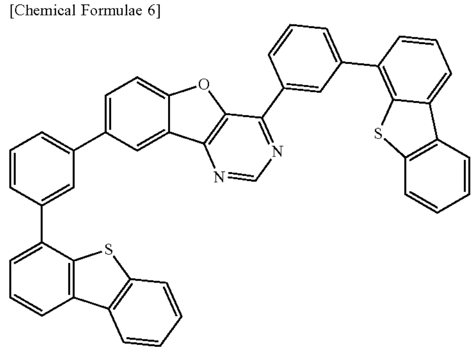

4,8mDBtP2Bfpm

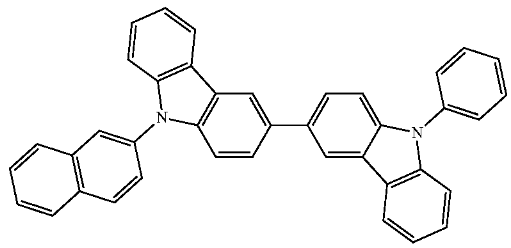

βNCCP

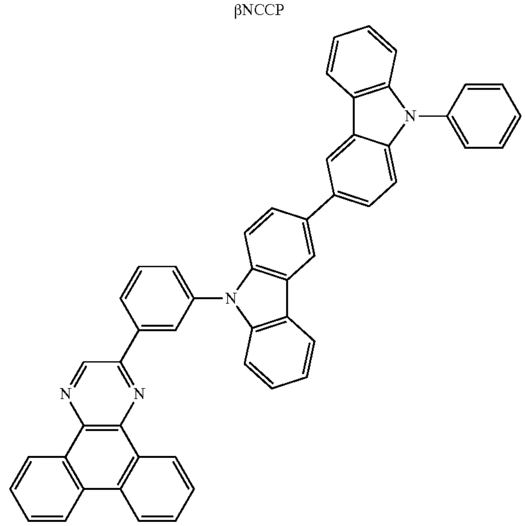

2mPCCzPDBq

<<Fabrication Method of Light-Emitting Device 5>>

The light-emitting device 5 described in this example was fabricated using a method including the following steps.

[Step 1]

In Step 1, a reflective film REFG(1) was formed. Specifically, the reflective film REFG(1) was formed by a sputtering method using titanium (Ti) as a target.

Note that the reflective film REFG(1) contains Ti and has a thickness of 50 nm.

[Step 2]

In Step 2, the reflective film REFG(2) was formed over the reflective film REFG(1). Specifically, the reflective film REFG(2) was formed by a sputtering method using aluminum (Al) as a target.

Note that the reflective film REFG(2) contains Al and has a thickness of 70 nm.

[Step 3]

In Step 3, a reflective film REFG(3) was formed over the reflective film REFG(2). Specifically, the reflective film REFG(3) was formed by a sputtering method using Ti as a target.

Note that the reflective film REFG(3) contains Ti and has a thickness of 6 nm.

Next, a substrate was heated at 300° C. in the air for an hour to oxidize Ti of the reflective film REFG(3). Accordingly, the light-transmitting property of the reflective film REFG(3) is improved, and light that has passed through the reflective film REFG(3) is reflected by the reflective film REFG(2).

[Step 4]

In Step 4, the electrode 551G was formed over the reflective film REFG(3). Specifically, the electrode 551G was formed by a sputtering method using indium oxide-tin oxide containing silicon or silicon oxide (abbreviation: ITSO) as a target.

The electrode 551G contains ITSO, has a thickness of 10 nm, and has an area of 7.32 $\mu m^2$ (6.42 $\mu m \times 1.14$ $\mu m$). Note that a plurality of electrodes 551G are arranged in a region of 4 $mm^2$ (2 mm×2 mm) (see FIGS. 40A and 40B) and the center distance (pitch) is 7.92 μm. In other words, pixels 703 with a pixel density of 3207 ppi are regularly arranged in the region of 4 $mm^2$.

Next, the substrate over which the electrode 551G was formed was washed with water, baked at 200° C. for an hour, and then subjected to UV ozone treatment for 370 seconds. After that, the substrate was transferred into a vacuum evaporation apparatus where the inside pressure was reduced to approximately $10^{-4}$ Pa, and vacuum baking was performed at 170° C. for 30 minutes in a heating chamber of the vacuum evaporation apparatus. Then, the substrate was cooled down for approximately 30 minutes.

[Step 5]

In Step 5, the layer 104 was formed over the electrode 551G. Specifically, materials were co-evaporated by a resistance-heating method.

Note that the layer 104 contains PCBBiF and OCHD-003 at PCBBiF:OCHD-003=1:0.03 (weight ratio) and has a thickness of 10 nm.

[Step 6]

In Step 6, the layer 112 was formed over the layer 104. Specifically, a material was evaporated by a resistance-heating method.

Note that the layer 112 contains PCBBiF and has a thickness of 10 nm.

[Step 7]

In Step 7, the layer 111G was formed over the layer 112. Specifically, materials were co-evaporated by a resistance-heating method.

Note that the layer 111G contains 4,8-bis[3-(dibenzothiophen-4-yl)phenyl]-[1]benzofuro[3,2-d]pyrimidine (abbreviation: 4,8mDBtP2Bfpm), 9-(2-naphthyl)-9'-phenyl-9H,9'H-3,3'-bicarbazole (abbreviation: PNCCP), and Ir(ppy)$_2$(mbfpypy-d3) at 4,8mDBtP2Bfpm: βNCCP:Ir(ppy)$_2$(mbfpypy-d3)=0.6:0.4:0.1 (weight ratio) and has a thickness of 40 nm.

[Step 8]

In Step 8, the layer 113(1) was formed over the layer 111G. Specifically, a material was evaporated by a resistance-heating method.

Note that the layer 113(1) contains 2-{3-[3-(N-phenyl-9H-carbazol-3-yl)-9H-carbazol-9-yl]phenyl}dibenzo[f,h]quinoxaline (abbreviation: 2mPCCzPDBq) and has a thickness of 20 nm.

[Step 9]

In Step 9, the layer 113(2) was formed over the layer 113(1). Specifically, a material was evaporated by a resistance-heating method.

Note that the layer 113(2) contains NBPhen and has a thickness of 15 nm.

[Step 10]

In Step 10, a sacrificial layer(1) was formed over the layer 113(2). Specifically, the substrate provided with components up to the layer 112(2) was taken out from a vacuum evaporation apparatus and then transferred into an ALD deposition apparatus, and a material was deposited by an ALD method. Note that the sacrificial layer(1) contains aluminum oxide and has a thickness of 30 nm.

[Step 10-2]

In Step 10-2, a sacrificial layer(2) was formed over the sacrificial layer(1). Specifically, the substrate provided with the sacrificial layer(1) was taken out from the ALD deposition apparatus and then transferred into a sputtering apparatus, and a material was deposited by a sputtering method. Note that the sacrificial layer(2) contains tungsten and has a thickness of 50 nm.

[Step 11]

In Step 11, the sacrificial layer(1) and the sacrificial layer(2) were processed into a predetermined shape. Specifically, after the substrate provided with the sacrificial layer(2) was taken out from a sputtering apparatus, a resist was formed over the sacrificial layer(2) so as to overlap with the electrode 551G and etching treatment was performed by a photolithography method.

[Step 11-2]

In Step 11-2, each of the unit 103G and the layer 104 was processed into a predetermined shape. Specifically, the sacrificial layer(1) and the sacrificial layer(2) were used as resists and an unnecessary portion was etched while a portion overlapping with the electrode 551G was left.

[Step 11-3]

In Step 11-2, the sacrificial layer(2) was removed. Specifically, the sacrificial layer(2) was etched by a dry etching method.

[Step 12]

In Step 12, an insulating film to be the filler 529(1) later was formed. Specifically, the insulating film was formed by an ALD method to cover the top surface of the sacrificial layer(1) and the side surfaces of the unit 103G and the layer 104. Note that the insulating film contains aluminum oxide and has a thickness of 10 nm.

[Step 13]

In Step 13, the filler 529(2) was formed into a predetermined shape. Specifically, a photosensitive resin was used. Furthermore, a portion overlapping with the electrode 551G was removed while a portion between the electrode 551G and another electrode adjacent to the electrode 551G was left, whereby an opening portion was formed.

[Step 13-2]

In Step 13-2, the insulating film formed in Step 12 was processed into a predetermined shape, whereby the filler 529(1) was formed. Specifically, the filler 529(2) was used as a resist and a portion overlapping with the electrode 551G was removed while a portion between the electrode 551G and another electrode adjacent to the electrode 551G was left, whereby an opening portion was formed in the insulating film. Furthermore, the sacrificial layer(1) overlapping with the electrode 551G was removed by a wet etching method. Accordingly, the layer 113(2) is exposed in the opening portion. After that, the substrate was transferred into a vacuum evaporation apparatus where the inside pressure was reduced to approximately $10^{-4}$ Pa, and vacuum baking was performed at 70° C. for 90 minutes in a heating chamber of the vacuum evaporation apparatus. Then, the substrate was cooled down for approximately 30 minutes.

[Step 14]

In Step 14, the layer 105 was formed over the layer 113(2). Specifically, materials were co-evaporated by a resistance-heating method.

Note that the layer 105 contains LiF and Yb at LiF: Yb=1:1 (volume ratio) and has a thickness of 2 nm.

[Step 15]

In Step 15, the electrode 552G was formed over the layer 105. Specifically, materials were co-evaporated by a resistance-heating method.

Note that the electrode 552G contains Ag and Mg at Ag:Mg=1:0.1 (volume ratio) and has a thickness of 25 nm.

[Step 16]

In Step 16, the conductive film 552 was formed over the electrode 552G. Specifically, the conductive film 552 was formed by a sputtering method using indium oxide-tin oxide (abbreviation: ITO) as a target.

Note that the conductive film 552 contains ITO and has a thickness of 70 nm.

<<Operation Characteristics of Light-Emitting Device 5>>

Figure 40A:
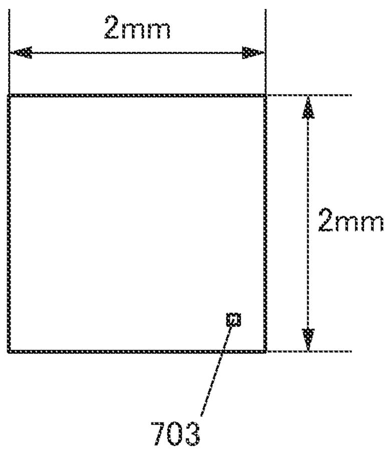
FIG. 40A to FIG. 40D are diagrams illustrating a structure of a light-emitting device 5 according to an example.
Figure 40B:
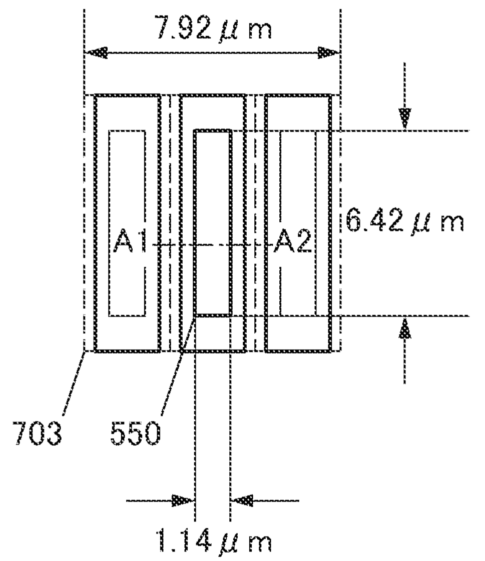
Figure 40C:
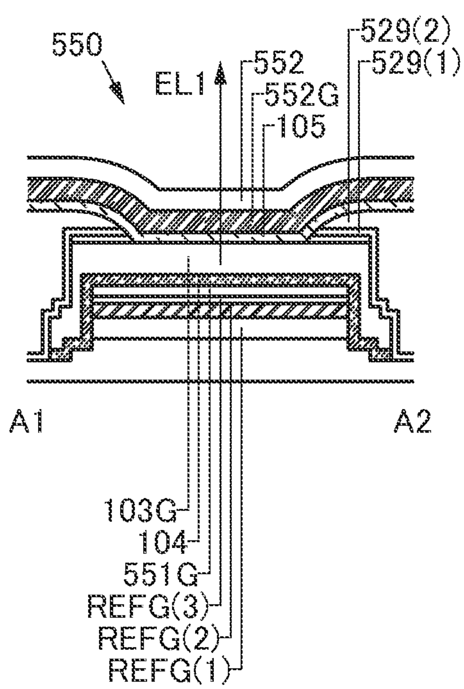

When supplied with electric power, the light-emitting device 5 emitted the light EL1 (see FIG. 40C). The operation characteristics of the light-emitting device 5 were measured at room temperature (see FIG. 41 to FIG. 45). The luminance, CIE chromaticity, and emission spectrum were measured using a spectroradiometer (SR-UL1R, manufactured by TOPCON TECHNOHOUSE CORPORATION).

Table 7 shows main initial characteristics of the fabricated light-emitting device emitting light at a luminance of approximately 1000 cd/m$^2$. Table 8 shows a time LT90 taken for the luminance to drop to 90% of its initial value, which were obtained under the condition where the light-emitting device 5 emitted light at a constant current density (50 mA/cm$^2$). Table 7 and Table 8 also show the characteristics of a comparative device 3 having a structure described later.

TABLE 7

| | Voltage (V) | Current (mA) | Current density (mA/cm2) | Chromaticity x | Chromaticity y | Current efficiency (cd/A) |
|---|---|---|---|---|---|---|
| Light-emitting device 5 | 3.8 | 0.05 | 1.3 | 0.31 | 0.67 | 75.1 |
| Comparative device 3 | 4.2 | 0.11 | 2.7 | 0.29 | 0.67 | 41.3 |

TABLE 8

| | LT90 (hr) |
|---|---|
| Light-emitting device 5 | 133.0 |
| Comparative device 3 | 116.0 |

A light-emitting device with an extremely small area was achieved. Specifically, the area of the light-emitting device 5 was 7.32 μm$^2$ (6.42 μm×1.14 μm). Furthermore, a plurality of light-emitting devices were able to be arranged with a center distance (pitch) of 7.92 μm. In other words, the plurality of light-emitting devices were able to be arranged with a pixel density of 3207 ppi. In addition, the light-emitting device 5 was found to have favorable characteristics. For example, the light-emitting device 5 exhibited higher current efficiency than the comparative device 3 which was fabricated without processing the unit 103G or the layer 103. The light-emitting device 5 showed a luminance of approximately 1000 cd/m$^2$ at a low voltage. Furthermore, the light-emitting device 5 showed along LT90 and favorable reliability. The layer 104 of the device 5 is separated from an adjacent light-emitting device and a phenomenon in which current flows to the adjacent light-emitting device through the layer 104 is inhibited. In the light-emitting device 5 of one embodiment of the present invention, steps can be reduced, so that the unit 103G and the layer 104 can be easily processed. Thus, manufacture of the display device is easy.

Reference Example 3

Figure 40D:
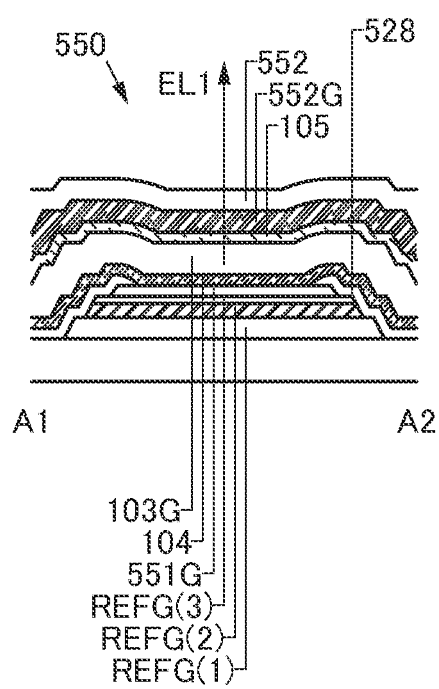

The fabricated comparative device 3 described in this reference example has a structure similar to that of the light-emitting device 550 (see FIG. 40D).

<<Structure of Comparative Device 3>>

In the comparative device 3, components from the layer 104 to the conductive film 552 were formed without the substrate being taken out from a vacuum evaporation apparatus. Thus, neither deposition of the sacrificial layer(1) and the sacrificial layer(2) nor processing of the unit 103G and the layer 104 was performed. The comparative device 3 is different from the light-emitting device 5 in that a partition 528 is provided instead of the filler 529(1) and the filler 529(2) (see FIG. 40D). The other components are the same as those of the light-emitting device 5.

<<Fabrication Method of Comparative Device 3>>

The method for fabricating the comparative device 3 is different from the method for fabricating the light-emitting device 5 in that the partition 528 is formed in the step for forming the electrode 551G and neither the filler 529(1) nor the filler 529(2) is used. In other words, a method that proceeds to Step 14 after Step 9 without performing Step 10 to Step 13-2 is employed.

REFERENCE NUMERALS

ANO: conductive film, C21: capacitor, C22: capacitor, G1: conductive film, G2: conductive film, GD: driver circuit, GL: gate line, GL1: gate line, GL2: gate line, M21: transistor, N21: node, N22: node, REFR: reflective film, REFG: reflective film, REFG(1): conductive film, REFG(3): conductive film, REFB: reflective film, S1*g*: conductive film, S2*g*: conductive film, SD: driver circuit, SW21: switch, SW22: switch, SW23: switch, V0: wiring, VCOM: conductive film, VCOM2: conductive film, 10: display device, 10A: display device, 20: layer, 30: layer, 40: driver circuit, 41: gate driver, 42: source driver, 50: functional circuit, 51: CPU, 52: accelerator, 53: CPU core, 60: display portion, 61: pixel, 61D: pixel, 61N: pixel, 62: pixel circuit, 62B: pixel circuit, 62G: pixel circuit, 62R: pixel circuit, 70: light-emitting element, 80: flip-flop, 81: scan flip-flop,

82: backup circuit, 103: unit, 103B: unit, 103G: unit, 103R: unit, 104: layer, 104B: layer, 104G: layer, 104R: layer, 104RG: gap, 105: layer, 111: layer, 111B: layer, 111G: layer, 111R: layer, 112: layer, 113: layer, 200A: transistor, 205: conductor, 205*a*: conductor, 205*b*: conductor, 205*c*: conductor, 214: insulator, 216: insulator, 222: insulator, 224: insulator, 230: metal oxide, 230*a*: metal oxide, 230*b*: metal oxide, 230*c*: metal oxide, 231: region, 240: conductor, 240*a*: conductor, 240*b*: conductor, 241: insulator, 241*a*: insulator, 241*b*: insulator, 242: conductor, 242*a*: conductor, 242*b*: conductor, 250: insulator, 254: insulator, 260: conductor, 260*a*: conductor, 260*b*: conductor, 274: insulator, 280: insulator, 281: insulator, 301*a*: conductor, 301*b*: conductor, 305: conductor, 311: conductor, 313: conductor, 317: conductor, 321: lower electrode, 323: insulator, 325: upper electrode, 331: conductor, 333: conductor, 335: conductor, 337: conductor, 341: conductor, 343: conductor, 347: conductor, 351: conductor, 353: conductor, 355: conductor, 357: conductor, 361: insulator, 363: insulator, 403: element isolation layer, 403B: element isolation layer, 405: insulator, 405B: insulator, 407: insulator, 409: insulator, 411: insulator, 421: insulator, 441: transistor, 443: conductor, 445: insulator, 447: semiconductor region, 449*a*: low-resistance region, 449*b*: low-resistance region, 451: conductor, 453: conductor, 455: conductor, 458: bump, 459: bonding layer, 461: conductor, 463: conductor, 501: insulator, 501B: insulating film, 501C: insulating film, 501D: insulating film, 504: conductive film, 506: insulating film, 507A: conductive film, 507B: conductive film, 508: semiconductor film, 508A: region, 508B: region, 508C: region, 510: functional layer, 512A: conductive film, 512B: conductive film, 516: insulating film, 516A: insulating film, 516B: insulating film, 518: insulating film, 519B: terminal, 520: functional layer, 521: insulating film, 524: conductive film, 529(1): filler, 529(2): filler, 529RG: filler, 530G: pixel circuit, 530R: pixel circuit, 550: light-emitting device, 550B: light-emitting device, 550G: light-emitting device, 550R: light-emitting device, 551: electrode, 551B: electrode, 551G: electrode, 551GB: gap, 551R: electrode, 551RG: gap, 552: conductive film, 552B: electrode, 552G: electrode, 552R: electrode, 552X: electrode, 591R: opening portion, 591G: opening portion, 601: transistor, 602: transistor, 603: transistor, 613: insulator, 614: insulator, 616: insulator, 622: insulator, 624: insulator, 654: insulator, 674: insulator, 680: insulator, 681: insulator, 700: display device, 701: substrate, 701B: substrate, 702B: pixel, 702G: pixel, 702R: pixel, 703: pixel, 705: insulating film, 712: sealant, 716: FPC, 730: insulator, 732: sealing layer, 734: insulator, 738: light-blocking layer, 750: transistor, 760: connection electrode, 770: 772: conductor, 778: component, 780: anisotropic conductor, 786: EL layer, 788: conductor, 790: capacitor, 800: transistor, 801*a*: conductor, 801*b*: conductor, 805: conductor, 811: conductor, 813: conductor, 814: insulator, 816: insulator, 817: conductor, 821: insulator, 822: insulator, 824: insulator, 853: conductor, 854: insulator, 855: conductor, 874: insulator, 880: insulator, 881: insulator, 8200: head-mounted display, 8201: wearing portion, 8202: lens, 8203: main body, 8204: display portion, 8205: cable, 8206: battery, 8300: head-mounted display, 8301: housing, 8302: display portion, 8304: fixing band, 8305: lens, 8306: battery, 9000: housing, 9001: display portion, 9003: speaker, 9005: operation key, 9006: connection terminal, 9007: sensor, 9009: battery, 9050: operation button, 9051: information, 9101: portable information terminal, 9200: portable information terminal, 9251: time, 9252: operation button, 9253: content

The invention claimed is:

1. A display device comprising:

a first light-emitting device comprising a first electrode, a second electrode, and a first unit between the first electrode and the second electrode;

a second light-emitting device comprising a third electrode, a fourth electrode, and a second unit between the third electrode and the fourth electrode;

an insulating film;

a conductive film electrically connecting the second electrode and the fourth electrode to each other;

a first reflective film between the first electrode and the insulating film; and a second reflective film between the third electrode and the insulating film, wherein the first electrode is between the first unit and the insulating film, wherein the third electrode is between the second unit and the insulating film, wherein the third electrode and the first electrode are apart from each other with a first gap therebetween, wherein the first gap is between the conductive film and the insulating film, and wherein a first distance DR between the first reflective film and the second electrode and a second distance DG between the second reflective film and the fourth electrode are in a relation satisfying Formula (1) to Formula (3) below:

[Formula 1]

$$DR > DG \tag{1}$$

$$DR - DG > 20\text{ nm} \tag{2}$$

$$DR - DG < 85\text{ nm}. \tag{3}$$

2. The display device according to claim 1, wherein the second unit is configured to emit first light, and wherein an emission spectrum of the first light has a maximum peak in a range greater than or equal to 480 nm and less than or equal to 600 nm.

3. The display device according to claim 1, further comprising a filler, wherein the filler is between the first electrode and the third electrode, wherein the filler is between the insulating film and the conductive film, and wherein the filler is between the first unit and the second unit.

4. The display device according to claim 1, further comprising:

a third light-emitting device comprising a fifth electrode, a sixth electrode, and a third unit between the fifth electrode and the sixth electrode; and a third reflective film between the fifth electrode and the insulating film, wherein the fifth electrode is between the third unit and the insulating film, wherein the fifth electrode and the third electrode are apart from each other with a second gap therebetween, wherein the conductive film electrically connects the fourth electrode and the sixth electrode to each other, wherein the second gap is between the conductive film and the insulating film, and wherein a third distance DB between the third reflective film and the sixth electrode has a relation with the first distance DR and the second distance DG satisfying Formula (1) to Formula (3) below:

[Formula 2]

$$DB > DR > DG \quad (1)$$

$$DB - DR < 60\text{ nm} \quad (2)$$

$$DR - DG < 35\text{ nm}. \quad (3)$$

5. The display device according to claim 4, wherein the third distance DB is shorter than or equal to 200 nm.

6. The display device according to claim 1, further comprising:

a third light-emitting device comprising a fifth electrode, a sixth electrode, and a third unit between the fifth electrode and the sixth electrode; and a third reflective film between the fifth electrode and the insulating film, wherein the fifth electrode is between the third unit and the insulating film, wherein the fifth electrode and the third electrode are apart from each other with a second gap therebetween, wherein the conductive film electrically connects the fourth electrode and the sixth electrode to each other, wherein the second gap is between the conductive film and the insulating film, wherein the third reflective film is between the fifth electrode and the insulating film, and wherein a third distance DB between the third reflective film and the sixth electrode has a relation with the first distance DR and the second distance DG satisfying Formula (1) to Formula (3) below:

[Formula 3]

$$DR > DG > DB \quad (1)$$

$$DR - DG < 35\text{ nm} \quad (2)$$

$$DG - DB < 35\text{ nm}. \quad (3)$$

7. The display device according to claim 6, wherein the first distance DR is shorter than or equal to 150 nm.

8. The display device according to claim 4, wherein the first unit is configured to emit second light, wherein the second light has a wavelength greater than or equal to 600 nm and less than or equal to 740 nm, wherein the third unit is configured to emit third light, and wherein the third light has a wavelength greater than or equal to 400 nm and less than or equal to 480 nm.

9. The display device according to claim 1, wherein the first light-emitting device comprises a first layer between the first unit and the first electrode, wherein the first layer has an electrical resistivity higher than or equal to $1\times10^{2}$ [Ω·cm] and lower than or equal to $1\times10^{8}$ [Ω·cm], wherein the second light-emitting device comprises a second layer between the second unit and the third electrode, wherein the second layer and the first layer are apart from each other with a third gap therebetween, and wherein the first layer and the second layer contains the contain a substance having an electron-accepting property and a material having a hole-transport property.

10. The display device according to claim 1, further comprising:

a display region comprising a pixel set comprising a first pixel and a second pixel;

a first functional layer; and a second functional layer, wherein the first pixel comprises the first light-emitting device and a first pixel circuit electrically connected to the first light-emitting device, wherein the first pixel circuit is configured to receive a first image signal, wherein the second pixel comprises the second light-emitting device and a second pixel circuit electrically connected to the second light-emitting device, wherein the second pixel circuit is configured to receive a second image signal, wherein the first functional layer comprises the second pixel circuit and the first pixel circuit, wherein the first functional layer is between the first light-emitting device and the second functional layer, wherein the first functional layer is between the second light-emitting device and the second functional layer, wherein the second functional layer comprises a driver circuit, and wherein the driver circuit is configured to generate the first image signal and the second image signal.

11. An electronic device comprising:

an arithmetic portion; and the display device according to claim 1, wherein the arithmetic portion is configured to generate image information, and wherein the display device is configured to display the image information.

12. An electronic device comprising:

an arithmetic portion; and the display device according to claim 10, wherein the second functional layer comprises the arithmetic portion, wherein the arithmetic portion is configured to generate image information, and wherein the display device is configured to display the image information.

* * * * *